United States Patent
Itaka

(10) Patent No.: US 6,996,013 B2
(45) Date of Patent: Feb. 7, 2006

(54) SEMICONDUCTOR INTEGRATED CIRCUIT

(75) Inventor: Yasuhito Itaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/014,942

(22) Filed: Dec. 20, 2004

(65) Prior Publication Data
US 2005/0099871 A1 May 12, 2005

Related U.S. Application Data

(62) Division of application No. 10/205,423, filed on Jul. 26, 2002, now Pat. No. 6,844,926.

(30) Foreign Application Priority Data

Jul. 27, 2001 (JP) .............................. 2001-228345

(51) Int. Cl.
G11C 16/04 (2006.01)
(52) U.S. Cl. .................. 365/189.05; 365/205; 365/222
(58) Field of Classification Search ........... 365/189.05, 365/205, 207, 208, 222
See application file for complete search history.

(56) References Cited

U.S. PATENT DOCUMENTS 6,130,845 A 10/2000 Ootsuki et al.
6,281,713 B1 * 8/2001 Kim .............................. 327/55
6,373,745 B2 4/2002 Saito et al.
6,418,073 B1 7/2002 Fujita
6,466,501 B2 10/2002 Kim et al.
6,473,358 B2 10/2002 Noda et al.

OTHER PUBLICATIONS

Kerry Bemstein, et al., "SOI Circuit Design Concepts", IBM Microelectronics, Chapter 6.3, pp. 124-129.

* cited by examiner

Primary Examiner—Anh Phung
Assistant Examiner—Toan Le
(74) Attorney, Agent, or Firm—Oblon, Spivak, McClelland, Maier & Neustadt, P.C.

(57) ABSTRACT

There is disclosed a semiconductor integrated circuit in which an equalize circuit is connected between input nodes N1, bN1 of a differential sense amplifier. A latch circuit is connected between nodes N2, bN2. A data change circuit is connected between the nodes N1 and bN2 and between the nodes bN1 and N2. A disconnection circuit is connected between the nodes N1 and N2 and between the nodes bN1 and bN2. In a state in which potentials of the input nodes N1, bN1 are equal to each other, the differential sense amplifier is operated, and output data of the amplifier is reversed by the data change circuit and subsequently latched by the latch circuit. The latched data is supplied to the input nodes N1, bN1 of the differential sense amplifier.

13 Claims, 30 Drawing Sheets

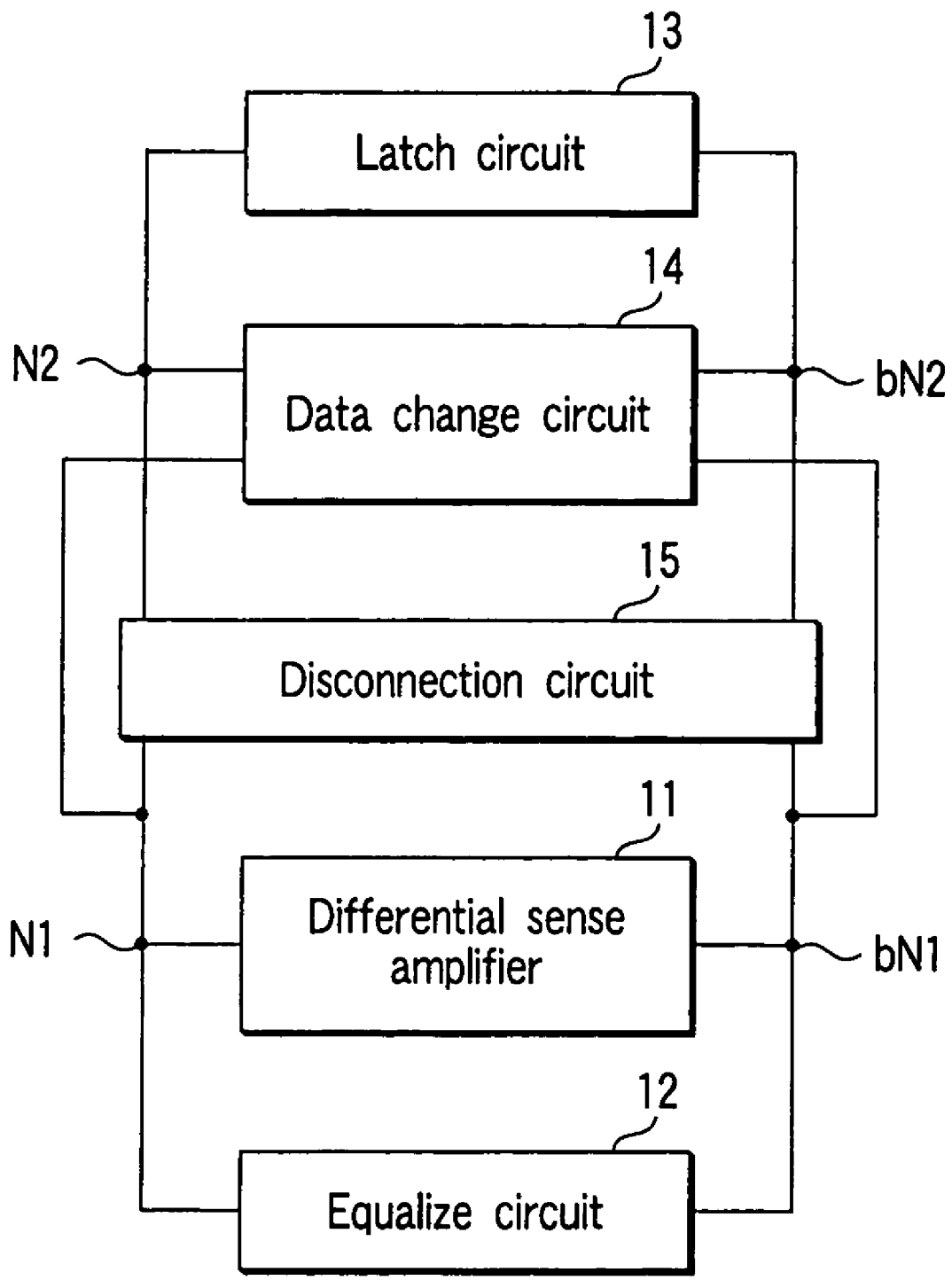
F I G. 3

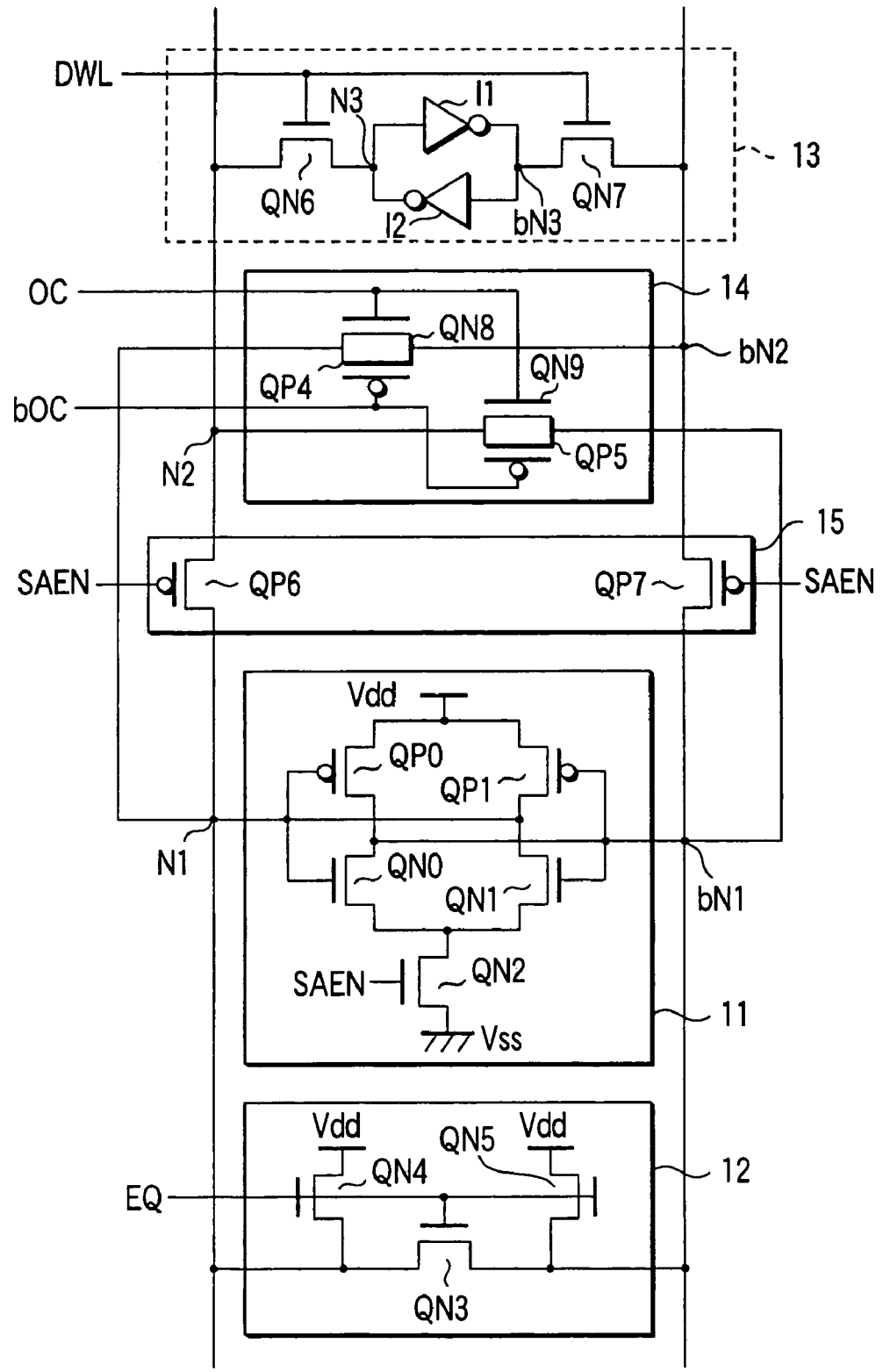
F I G. 4

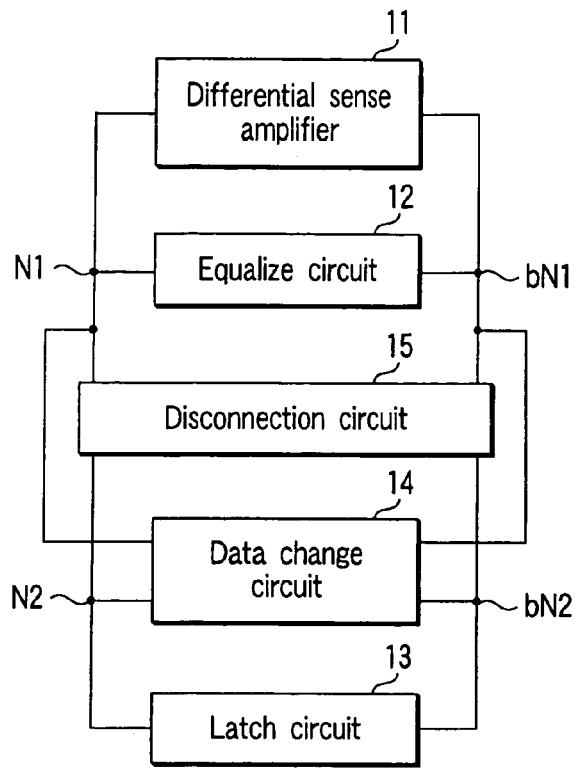
F I G. 12
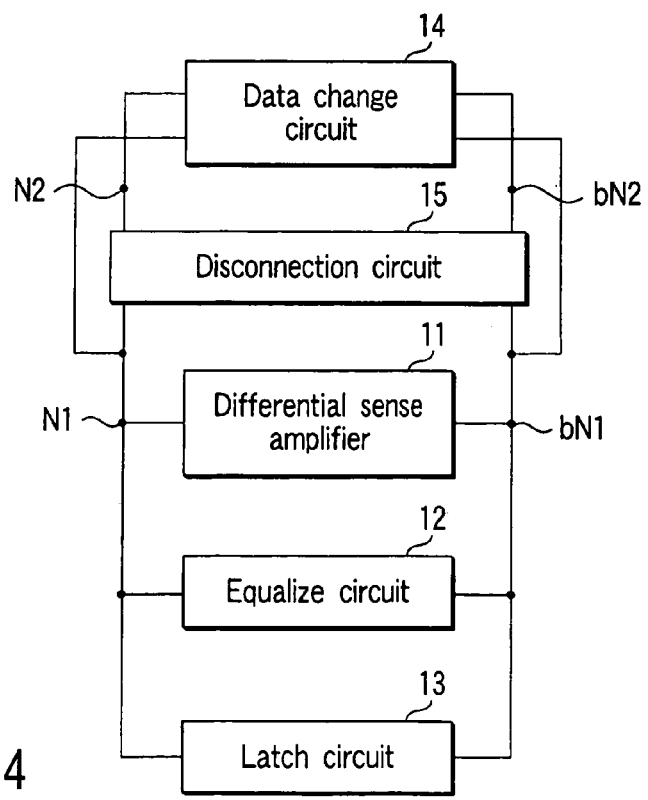
F I G. 14

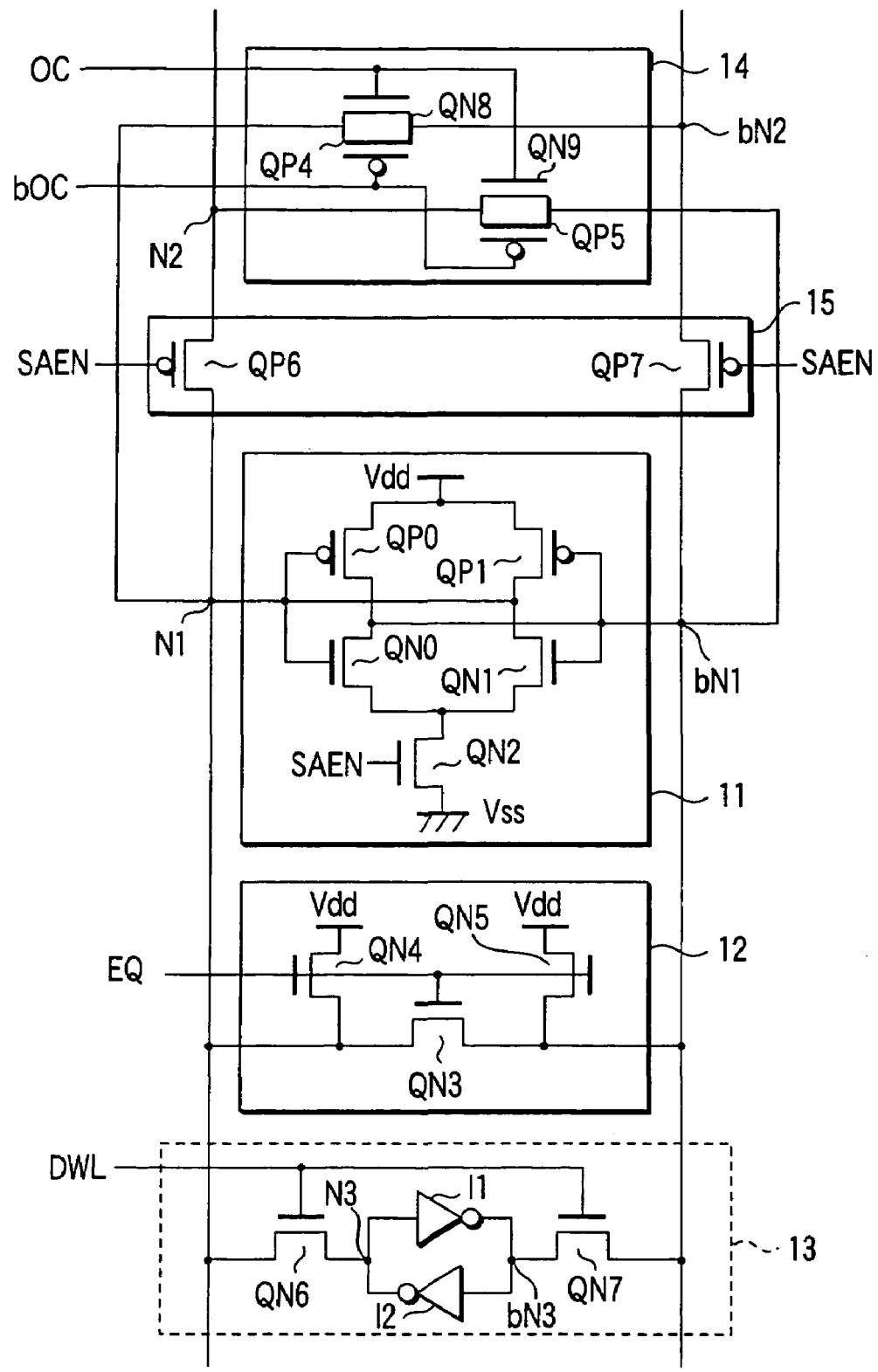
F I G. 15

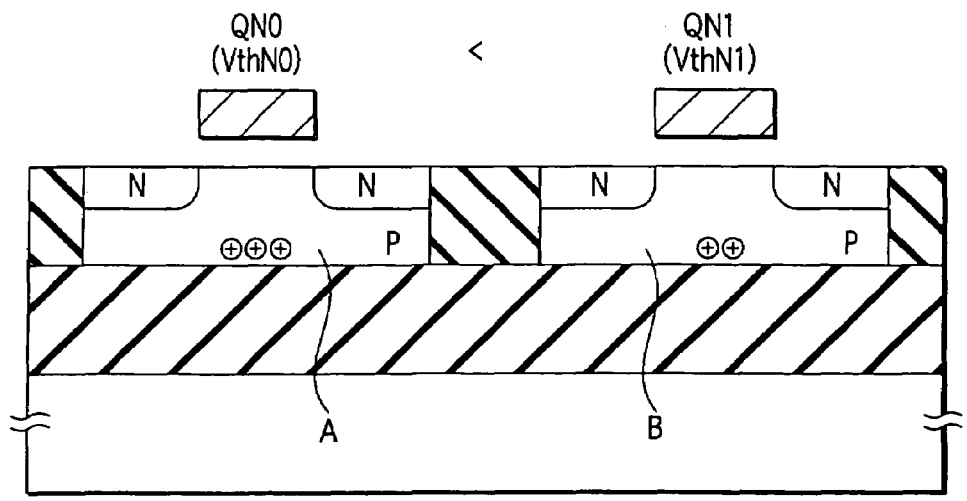
F I G. 22
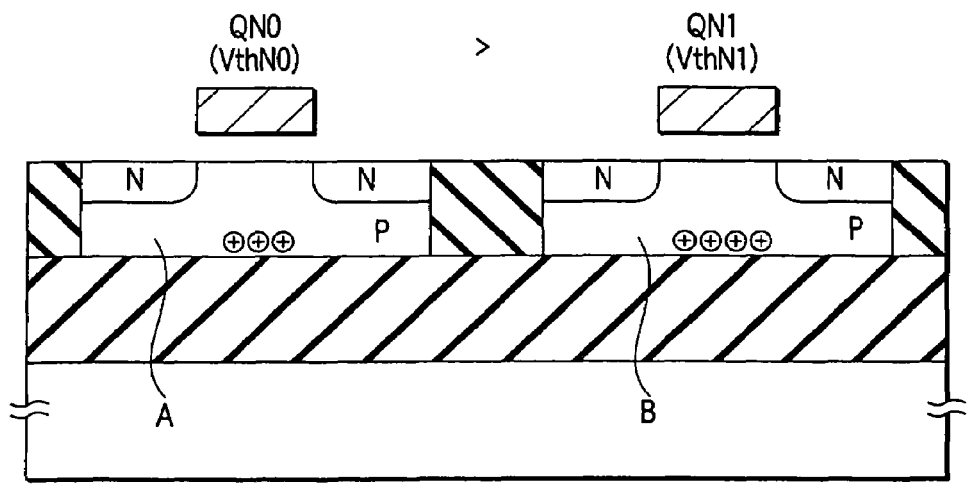
F I G. 23
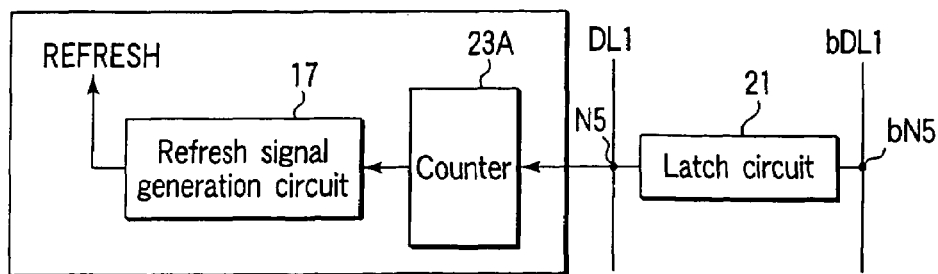
F I G. 24

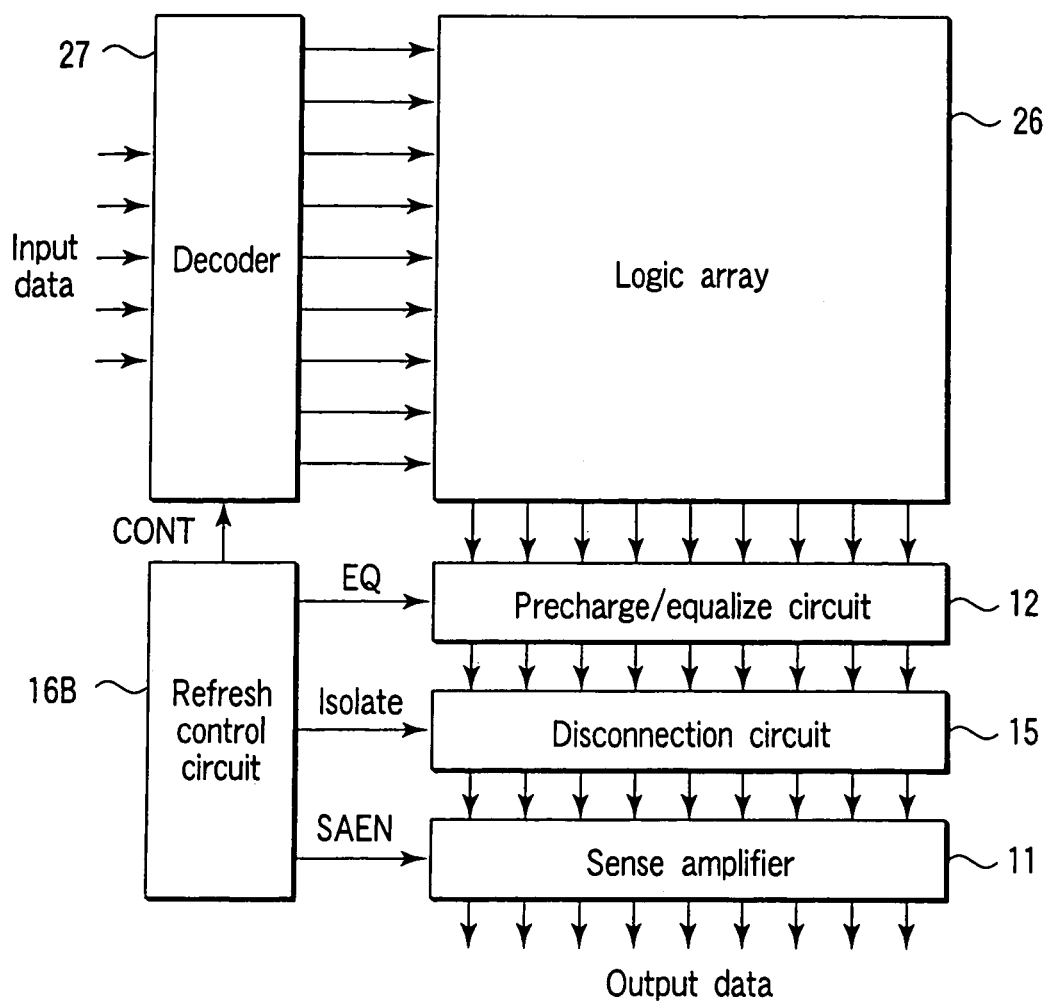
F I G. 38

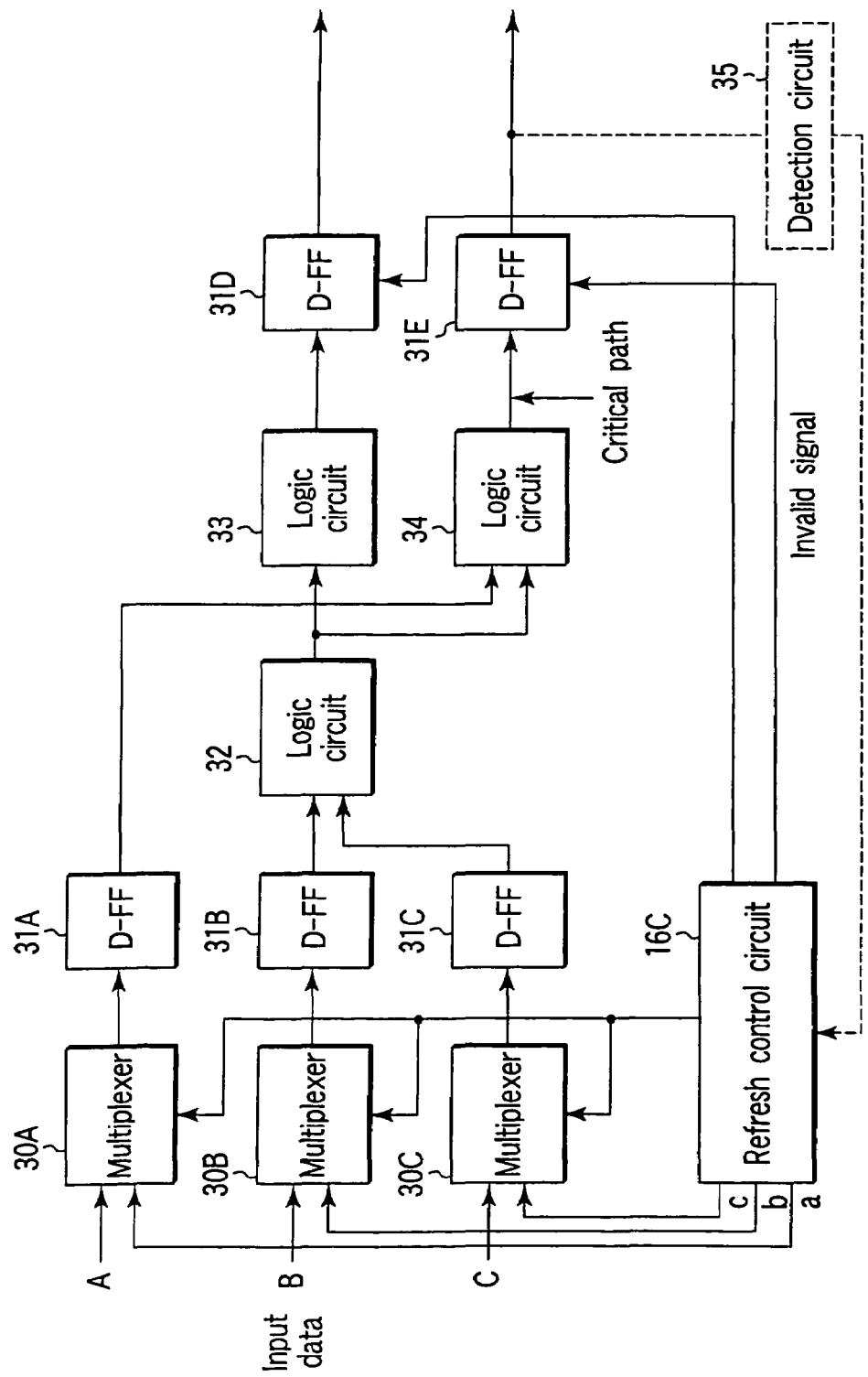
F I G. 40

SEMICONDUCTOR INTEGRATED CIRCUIT

CROSS-REFERENCE TO RELATED APPLICATIONS

This application is based upon and claims the benefit of priority from the prior Japanese Patent Application No. 2001-228345, filed Jul. 27, 2001, the entire contents of which are incorporated herein by reference.

BACKGROUND OF THE INVENTION

1. Field of the Invention

The present invention relates to a circuit which minimizes an offset generated in a semiconductor integrated circuit, that is, a dispersion of threshold voltage of a MOS transistor.

2. Description of the Related Art

In the semiconductor integrated circuit, due to a so-called process dispersion, an operation frequency (history effect) concerning a silicon on insulator (SOI) device, and the like, a dispersion (offset) of a threshold voltage is sometimes generated in a MOS transistor.

When the offset, that is, the dispersion of the threshold voltage of the MOS transistor is generated, an operation speed is slowed. In some cases, input data cannot accurately be detected, and erroneous data is outputted. Therefore, one of important problems is to remove or minimize the offset.

A concrete example will be described.

FIG. 1 shows a differential sense amplifier for use in a semiconductor memory.

In the semiconductor memory, data of a memory cell is often read out as a micro potential difference generated in a pair of bit lines BL1, bBL1. As is generally known, the micro potential difference is sensed and amplified by the differential sense amplifier.

Here, among the MOS transistors constituting the differential sense amplifier, when threshold voltages VthP0, VthP1 of P channel MOS transistors QP0, QP1 are different, or when threshold voltages VthN0, VthN1 of N channel MOS transistors QN0, QN1 are different, the offset is generated. This offset reduces a speed for sensing a micro potential difference of the pair of bit lines BL1, bBL1.

Moreover, when the offset increases, output data is determined only by the offset regardless of the micro potential difference generated in the pair of bit lines BL1, bBL1. As a result, a problem occurs that the input data (readout data of the memory cell) differs from the output data.

For the SOI device, one of reasons why the offset is generated in the differential sense amplifier is use frequency and history of the MOS transistor.

This reason will be described hereinafter.

FIG. 2 shows a device structure of N channel MOS transistors N0, N1 of the differential sense amplifier of FIG. 1.

Additionally, to simplify the description, it is supposed that the threshold voltages VthP0, VthP1 of the P channel MOS transistors QP0, QP1 of the differential sense amplifier of FIG. 1 are constantly equal to each other, and the threshold voltages VthN0, VthN1 of the N channel MOS transistors N0, N1 are initially equal to each other.

First, two input nodes N1, bN1 of the differential sense amplifier are precharged, and potentials are both, for example, Vdd. Thereafter, for example, data "1" is read out into the bit line BL1, and data "0" is read out into the bit line bBL1. Moreover, a sense amplifier enable signal SAEN becomes "High (=H)".

In this case, the potential of the bit line BL1 remains Vdd, and the potential of the bit line bBL1 drops a little from Vdd. In this case, since both the potentials of the nodes N1, bN1 are higher than the threshold voltages (VthN0=VthN1) of the MOS transistors QN0, QN1, both transistors are turn on.

However, since a gate potential of the MOS transistor QN1 is a little lower than that of the MOS transistor QN0, a current flowing through the MOS transistor QN1 is a little smaller than a current flowing through the MOS transistor QN0.

That is to say, a difference of the gate potentials of the MOS transistors QN0, QN1 is a difference of currents flowing through these MOS transistors. As a result, a drop speed of the potential of the node bN1 is higher than that of the node N1.

Therefore, when the potential of the node bN1 is lower than the threshold voltage of the MOS transistor QN1, the MOS transistor QN1 is turned off, the drop of the potential of the node N1 stops, and the P channel MOS transistor QP1 is turned on.

Thereafter, the potential of the node N1 turns to a rising direction from a falling direction, and finally returns to Vdd. However, the potential of the node bN1 continues to drop, and finally indicates Vss.

When the data "1" is read out into the bit line BL1, and the data "0" is read out into the bit line bBL1, only for the N channel MOS transistors QN0, QN1, finally the current flows through the MOS transistor QN0, and the current does not flow through the MOS transistor QN1.

Here, when the sense amplifier enable signal SAEN changes to "Low (=L)", the current does not flow through the MOS transistors QN0, QN1, but a charge remains in a substrate (body) A of the MOS transistor QN0. This charge fluctuates the substrate potential of the MOS transistor QN0, and acts in a direction in which the threshold voltage VthN0 is lowered.

Therefore, when the same data is repeatedly read out into the bit line BL1, for example, when the data "1" is repeatedly read out into the bit line BL1, only the threshold voltage VthN0 of the MOS transistor QN0 drops. Thereby, the readout speed is slowed, or an erroneous sense operation is performed.

Additionally, a frequency with which the data "1" is read out into the bit line BL1 is substantially the same as a frequency with which the data "0" is read out. In this case, a fluctuation ΔVthN0 of the threshold voltage VthN0 of the MOS transistor QN0 becomes substantially the same as a fluctuation ΔVthN1 of the threshold voltage VthN1 of the MOS transistor QN1, and there is no problem.

Moreover, the charge accumulated in a substrate A naturally disappears with an elapse of sufficient time after the differential sense amplifier is bought into an inoperative state (SAEN="L"). However, when the operation of the differential sense amplifier is repeatedly performed, the next readout operation is started before the charge accumulated in the substrate A becomes equal to the charge accumulated in a substrate B. Therefore, as described above, the readout speed is slowed, or the erroneous sense operation is performed.

Additionally, as a technique of reducing the offset by the fluctuation of the substrate potential, a technique of connecting the substrate to a source of the MOS transistor, a technique of fixing the substrate at a constant potential, and the like have heretofore been known.

However, in any one of the techniques, it is necessary to dispose a contact portion with respect to the substrate, and therefore a problem of a drop of circuit capability due to an increase of gate capacity occurs. Moreover, any one of the techniques is effective for minimizing the fluctuation of the substrate potential of the SOI device, but it is impossible to minimize the fluctuation of the threshold voltage caused by the process dispersion.

Therefore, there has been a demand for a technique of minimizing the offset (dispersion of the threshold voltage of the MOS transistor) resulting from the process dispersion or the operation frequency of the SOI device by a circuit operational method, and preventing the drop of the operation speed or the erroneous sense operation caused by the offset.

BRIEF SUMMARY OF THE INVENTION

According to a first aspect of the present invention, there is provided a semiconductor integrated circuit comprising: an inner circuit; a first circuit which supplies a first signal for obtaining output data dependent on a state of the inner circuit to the inner circuit; a latch circuit which latches the output data; and a second circuit which supplies a second signal for returning the state of the inner circuit to a normal state based on the output data to the inner circuit.

According to a second aspect of the present invention, there is provided a semiconductor integrated circuit comprising: a first circuit which supplies a first signal for obtaining output data dependent on a mismatch of a threshold voltage of a MOS transistor to the MOS transistor; a latch circuit which latches the output data; and a second circuit which supplies a second signal for eliminating the mismatch of the threshold voltage of the MOS transistor based on the output data to the MOS transistor.

According to a third aspect of the present invention, there is provided a semiconductor integrated circuit comprising: a sense amplifier connected between first and second nodes; an equalize circuit which equalizes potentials of the first and second nodes; a latch circuit connected between third and fourth nodes; a data change circuit which controls electric connection or disconnection of the first and fourth nodes and electric connection or disconnection of the second and third nodes; and a disconnection circuit which controls electric disconnection or connection of the first and third nodes and electric disconnection or connection of the second and fourth nodes.

According to a fourth aspect of the present invention, there is provided a semiconductor integrated circuit comprising: a sense amplifier connected between first and second nodes; an equalize circuit which equalizes potentials of the first and second nodes; a latch circuit connected between the first and second nodes; a disconnection circuit which controls electric disconnection or connection of the first node and a third node and electric disconnection or connection of the second node and a fourth node; and a data change circuit which controls electric connection or disconnection of the first and fourth nodes and electric connection or disconnection of the second and third nodes.

According to a fifth aspect of the present invention, there is provided a semiconductor integrated circuit comprising: a sense amplifier connected between first and second nodes; an equalize circuit which equalizes potentials of the first and second nodes; a latch circuit connected between the first and second nodes; and a data change circuit which controls electric connection or disconnection of the first node and a first inner node of the latch circuit and electric connection or disconnection of the second node and a second inner node of the latch circuit.

According to a sixth aspect of the present invention, there is provided a semiconductor integrated circuit comprising: a sense amplifier connected between first and second nodes; an equalize circuit which equalizes potentials of the first and second nodes; a latch circuit connected between third and fourth nodes; a data change circuit which controls electric connection or disconnection of the first node and a first inner node of the latch circuit and electric connection or disconnection of the second node and a second inner node of the latch circuit; and a disconnection circuit which controls electric disconnection or connection of the first and third nodes and electric disconnection or connection of the second and fourth nodes.

According to a seventh aspect of the present invention, there is provided a semiconductor integrated circuit comprising: a memory cell array; a plurality of sense amplifier arrays corresponding to the memory cell array; an auxiliary array including a first cell connected between a first bit line and a first power terminal and a second cell connected between a second bit line and a second power terminal; a disconnection circuit which is connected between the first bit line and first node and between the second bit line and second node and which controls electric disconnection or connection of the first bit line and first node and electric disconnection or connection of the second bit line and second node; a sense amplifier connected between the first and second nodes; an equalize circuit which equalizes potentials of the first and second nodes; a latch circuit connected between the first and second nodes; a data change circuit which controls electric connection or disconnection of the first node and a first inner node of the latch circuit and electric connection or disconnection of the second node and a second inner node of the latch circuit; and a refresh control circuit to monitor data of the first inner node or the second inner node and to stop operations of the sense amplifier and sense amplifier array, when the data changes.

According to an eighth aspect of the present invention, there is provided a semiconductor integrated circuit comprising: a memory cell array; a plurality of sense amplifier arrays corresponding to the memory cell array; a first auxiliary array including a first cell connected between a first bit line and first power terminal and a second cell connected between a second bit line and second power terminal; a first disconnection circuit which is connected between the first bit line and a first node and between the second bit line and a second node and which controls electric disconnection or connection of the first bit line and first node and electric disconnection or connection of the second bit line and second node; a first sense amplifier connected between the first and second nodes; a first equalize circuit which equalizes potentials of the first and second nodes; a first latch circuit connected between the first and second nodes; a first data change circuit which controls electric connection or disconnection of the first node and a first inner node of the latch circuit and electric connection or disconnection of the second node and a second inner node of the latch circuit; a second auxiliary array including a third cell connected between a third bit line and the second power terminal and a fourth cell connected between a fourth bit line and the first power terminal; a second disconnection circuit which is connected between the third bit line and a third node and between the fourth bit line and a fourth node and which controls electric disconnection or connection of the third bit line and third node and electric disconnection or connection of the fourth bit line and fourth node; a second sense amplifier connected between the third and fourth nodes; a second equalize circuit which equalizes potentials of the third and fourth nodes; a second latch circuit connected between the third and fourth nodes; a second data change circuit which controls electric connection or disconnection of the third node and a third inner node of the latch circuit and electric connection or disconnection of the fourth node and a fourth inner node of the latch circuit; and a refresh control circuit to monitor data of the first or second inner node and data of the third or fourth inner node and to stop operations of the first and second sense amplifiers and sense amplifier array, when these data both change.

According to a ninth aspect of the present invention, there is provided a semiconductor integrated circuit comprising: an array including a plurality of program elements; a decoder to select a first row of the array including a first program element to output first data, when input data having a specific value is inputted; a refresh control circuit which allows the decoder to select a second row of the array including a second program element to output second data different from the first data periodically or at random; and a sense amplifier which amplifies the first and second data.

According to a tenth aspect of the present invention, there is provided a semiconductor integrated circuit comprising: a logic circuit to output specific data, when first input data having a specific value is inputted; and a refresh control circuit which inputs second input data having the specific value into the logic circuit instead of the first input data periodically or at random, wherein a probability with which the first input data indicates the specific value is lower than a probability with which the first input data indicates a value other than the specific value.

According to an eleventh aspect of the present invention, there is provided a method of minimizing an offset of a differential sense amplifier, comprising: a first step of operating the differential sense amplifier in a state in which two input potentials of the differential sense amplifier are equalized, and obtaining output data of the differential sense amplifier; a second step of allowing a latch circuit to latch the output data of the differential sense amplifier; and a third step of inputting data having a value reverse to a value of the output data of the differential sense amplifier into the differential sense amplifier.

According to a twelfth aspect of the present invention, there is provided a method of minimizing an offset of a differential sense amplifier, comprising: a first step of counting the number of inputs of first data into the differential sense amplifier and the number of inputs of second data reverse to the first data into the differential sense amplifier; and a second step of executing an operation of minimizing a dispersion of a threshold voltage of a MOS transistor constituting the differential sense amplifier, when a difference between the number of inputs of the first data and the number of inputs of the second data indicates a constant or more value.

BRIEF DESCRIPTION OF THE SEVERAL
VIEWS OF THE DRAWING

FIG. 3 is a diagram showing an outline of a semiconductor integrated circuit according to a first embodiment of the present invention;

FIG. 4 is a diagram showing a concrete example of the semiconductor integrated circuit of FIG. 3;

FIG. 12 is a diagram showing an outline of the semiconductor integrated circuit according to a second embodiment of the present invention;

FIG. 14 is a diagram showing an outline of the semiconductor integrated circuit according to a third embodiment of the present invention;

FIG. 15 is a diagram showing a concrete example of the semiconductor integrated circuit of FIG. 14;

FIG. 22 is a diagram showing the state of the MOS transistor in the differential sense amplifier;

FIG. 23 is a diagram showing the state of the MOS transistor in the differential sense amplifier;

FIG. 24 is a diagram showing the outline of the semiconductor integrated circuit according to a fifth embodiment of the present invention;

FIG. 38 is a diagram showing the outline of the semiconductor integrated circuit according to a ninth embodiment of the present invention;

FIG. 40 is a diagram showing the outline of the semiconductor integrated circuit according to a tenth embodiment of the present invention;

DETAILED DESCRIPTION OF THE INVENTION

A semiconductor integrated circuit according to one example of the present invention will be described hereinafter in detail with reference to the drawings.

[First Embodiment]

1. Outline

FIG. 3 shows a semiconductor integrated circuit according to a first embodiment of the present invention.

Figure 1:
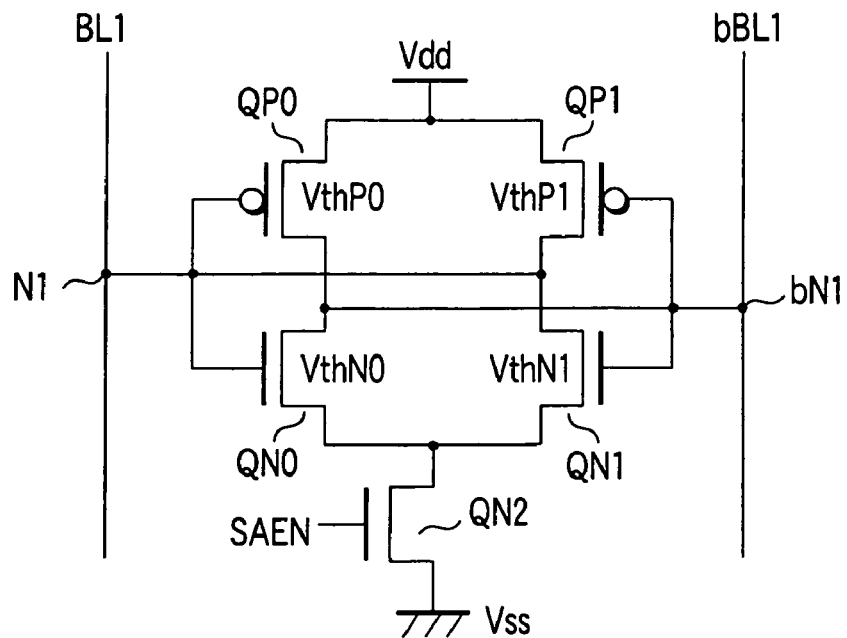
FIG. 1 is a diagram showing an example of a differential sense amplifier.
Figure 2:
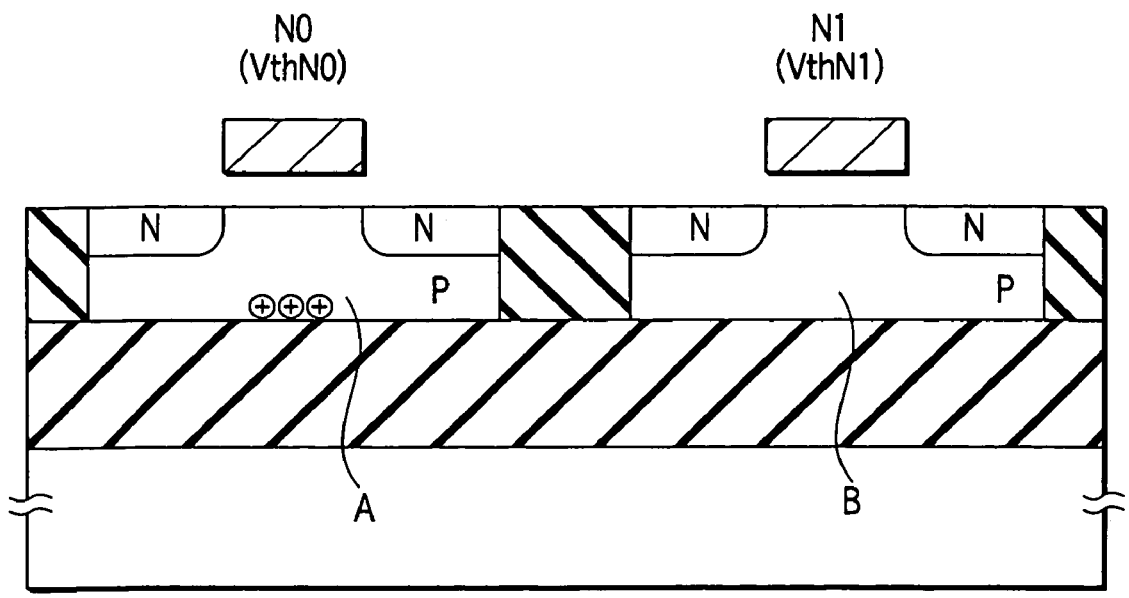
FIG. 2 is a diagram showing a state of a MOS transistor in the differential sense amplifier.

A differential sense amplifier 11 is connected between nodes N1, bN1. The differential sense amplifier includes a constitution, for example, shown in FIG. 1. Moreover, an equalize circuit 12 for equalizing potentials of the nodes N1, bN1 is connected between the nodes N1, bN1.

On the other hand, a latch circuit 13 is connected between nodes N2, bN2. A data change circuit 14 is connected between the nodes N1 and bN2, and also connected between the nodes bN1 and N2. The data change circuit 14 has a function of electrically connecting or disconnecting the nodes N1 and bN2 and electrically connecting or disconnecting the nodes bN1 and N2.

A disconnection circuit 15 is connected between the nodes N1 and N2 and between the nodes bN1 and bN2. The disconnection circuit 15 has a function of electrically disconnecting or connecting the nodes N1 and N2 and electrically disconnecting or connecting the nodes bN1 and bN2.

An operation principle of the semiconductor integrated circuit of FIG. 3 will briefly be described.

It is assumed that the differential sense amplifier 11 has an offset.

First, the equalize circuit 12 equalizes potentials of the nodes N1, bN2. Thereafter, the differential sense amplifier 11 is operated. At this time, since the potential difference is not generated in two input nodes N1, bN1 of the differential sense amplifier 11, the output data is determined depending only on the offset of the differential sense amplifier 11.

The output data (offset information) is latched by the latch circuit 13. At this time, the data change circuit 14 electrically connects the nodes N1 and bN2 and electrically connects the nodes bN1 and N2.

Moreover, the disconnection circuit 15 electrically disconnects the nodes N1 and N2 and electrically disconnects the nodes bN1 and bN2.

Therefore, the output data of the node N1 is transferred to the node bN2, and the output data of the node bN1 is transferred to the node N2. That is, the data having a value reverse to the value of the output data of the differential sense amplifier 11 is latched by the latch circuit 13. Thereafter, the data change circuit 14 electrically disconnects the nodes N1 and bN2 and electrically disconnects the nodes bN1 and N2. Moreover, the disconnection circuit 15 electrically connects the nodes N1 and N2 and electrically connects the nodes bN1 and bN2.

Therefore, the output data of the node N2 is transferred to the node N1, and the output data of the node bN2 is transferred to the node bN1. That is, the data having a value reverse to the value of the output data of the differential sense amplifier 11, that is, data for reducing the offset is inputted into the differential sense amplifier 11.

In this manner, according to the present invention, the data acting in a direction in which the offset of the differential sense amplifier 11 is reduced is inputted into the differential sense amplifier 11, and the offset of the differential sense amplifier 11 is minimized.

2. Concrete Example

FIG. 4 shows a concrete example of the semiconductor integrated circuit of FIG. 3.

The differential sense amplifier 11 is constituted of P channel MOS transistors QP0, QP1 and N channel MOS transistors QN0, QN1, QN2.

Gates of the MOS transistors QP0, QN0 are connected to the node N1 and drains of the MOS transistors QP1, QN1. The gates of the MOS transistors QP1, QN1 are connected to the node bN1 and the drains of the MOS transistors QP0, QN0.

Sources of the MOS transistors QP0, QP1 are connected to an inner power node Vdd, and the MOS transistor QN2 is connected between the sources of the MOS transistors QN0, QN1 and a ground point. A sense amplifier enable signal SAEN is inputted into the gate of the MOS transistor QN2.

The equalize circuit 12 is constituted of N channel MOS transistors QN3, QN4, QN5. The MOS transistor QN3 is connected between the nodes N1 and bN1, the MOS transistor QN4 is connected between the inner power node Vdd and node N1, and the MOS transistor QN5 is connected between the inner power node Vdd and node bN1.

An equalize signal EQ is inputted into the gates of the MOS transistors QN3, QN4, QN5. When the equalize signal EQ reaches "H", both the nodes N1, bN1 are set to an inner power potential Vdd.

Figure 5:
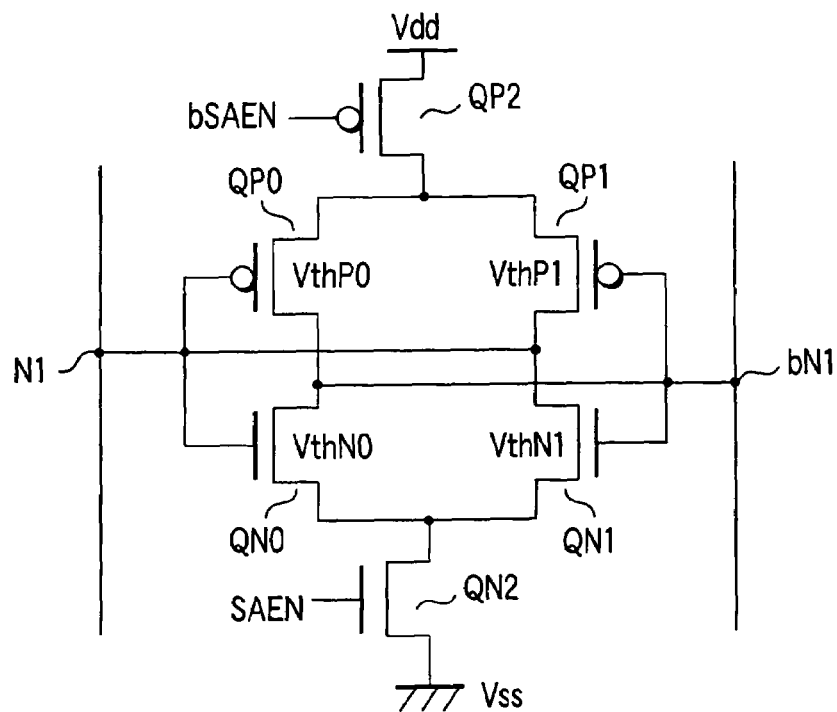
FIG. 5 is a diagram showing an example of the differential sense amplifier.

Additionally, in the present example, the equalize circuit 12 sets both the nodes N1, bN1 to the inner power potential Vdd. Instead of this, for example, the equalize circuit 12 may be modified so as to set the nodes N1, bN1 to Vdd/2. In this case, the differential sense amplifier 11 is also modified, for example, as shown in FIG. 5.

The latch circuit 13 is constituted of two flip-flop connected inverters I1, I2 connected between nodes N3, bN3, an N channel MOS transistor (transfer gate) QN6 connected between nodes N2 and N3, and an N channel MOS transistor (transfer gate) QN7 connected between nodes bN2 and bN3.

When a control signal DWL indicates "H", the nodes N2 and N3 are short-circuited, and the nodes bN2 and bN3 are short-circuited.

Additionally, the latch circuit 13 can be constituted, for example, in the same manner as the memory cell. When the memory cell is a static memory cell, as in the present example, the latch circuit 13 can have the same constitution (dummy cell) as the static memory cell. In this case, the control signal DWL is supplied to the gates of the MOS transistors QN6, QN7 from a dummy word line.

The data change circuit 14 is constituted of MOS transistors QP4, QN8 connected between the nodes N1 and bN2, and MOS transistors QP5, QN9 connected between the nodes bN1 and N2. When an offset check signal OC indicates "H", the MOS transistors QP4, QP5, QN8, QN9 are turned on, and the nodes N1 and bN2, and the nodes N1 and bN2 are electrically connected.

The disconnection circuit 15 is constituted of a P channel MOS transistor QP6 connected between the nodes N1, N2, and a P channel MOS transistor QP7 connected between the nodes bN1, bN2. When the sense amplifier enable signal SAEN indicates "H", the nodes N1 and N2, and the nodes bN1 and bN2 are electrically disconnected.

Figure 6:
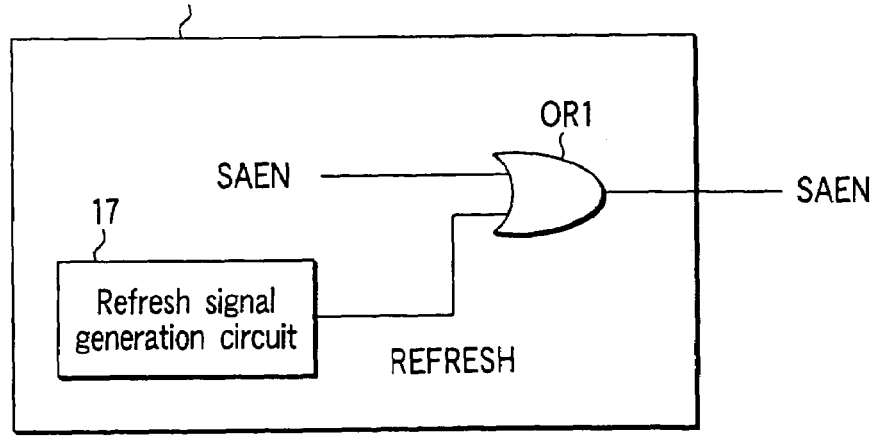
FIG. 6 is a diagram showing one example of a refresh control circuit.

FIG. 6 shows a main part of a refresh control circuit which outputs the sense amplifier enable signal SAEN.

A refresh control circuit 16 includes a refresh signal generation circuit 17 and OR circuit OR1. The refresh signal generation circuit 17 outputs a refresh signal REFRESH which indicates "H" in a mode to minimize the offset of the differential sense amplifier.

In a normal readout mode, when the sense amplifier enable signal SAEN inputted into the OR circuit OR1 reaches "H", an output signal SEAN of the OR circuit OR1 also reaches "H".

Moreover, in a mode other than the normal readout mode, the sense amplifier enable signal SAEN inputted into the OR circuit OR1 indicates "L".

At this time, when the mode to minimize the offset of the differential sense amplifier is executed, the refresh signal REFRESH reaches "H", and therefore the output signal SEAN of the OR circuit OR1 also reaches "H". On the other hand, when the mode to minimize the offset of the differential sense amplifier is not executed, the refresh signal REFRESH indicates "L", and therefore the output signal SEAN of the OR circuit OR1 also indicates "L".

3. Appication Example 1

Figure 7:
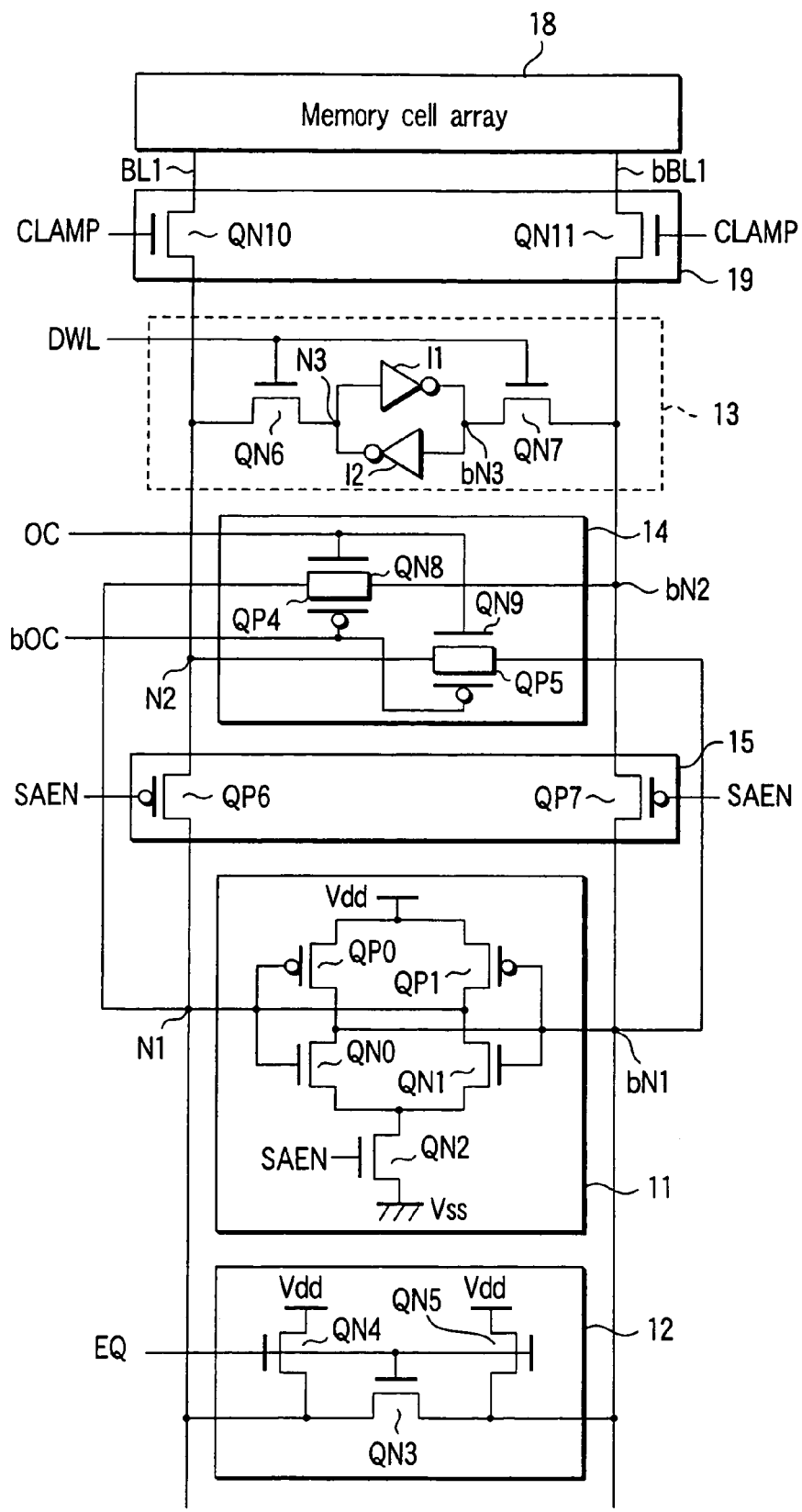
FIG. 7 is a diagram showing that the semiconductor integrated circuit of FIG. 4 is applied to a semiconductor memory.

FIG. 7 shows a first example in which the semiconductor integrated circuit of FIG. 4 is applied to a semiconductor memory.

A memory cell array 18 is constituted of an array of static memory cells or dynamic memory cells. A bit line BL1 is connected to the node N2 via an N channel MOS transistor QN10 as a clamp circuit 19. Moreover, a bit line bBL1 is connected to the node bN2 via an N channel MOS transistor QN11 as the clamp circuit 19.

4. Operation

An operation of the semiconductor integrated circuit of FIG. 7 will be described.

In the normal readout mode, the data of the memory cell is read out as the potential difference of the pair of bit lines BL1, bBL1, and the potential difference is sensed and amplified by the differential sense amplifier 11.

Here, with the SOI device, unless the number of readouts of "1" data is equal to the number of readouts of "0" data with respect to the same differential sense amplifier 11 (e.g., when only the same data is continuously read out), the substrate potential of the MOS transistor having a large number of operations fluctuates, and the offset (dispersion of the threshold value of the MOS transistor) is generated in the differential sense amplifier 11.

To minimize the offset, according to the present invention, in the mode other than the normal readout mode, the following operation is continuously or intermittently performed until the offset is eliminated or sufficiently reduced.

Figure 8:
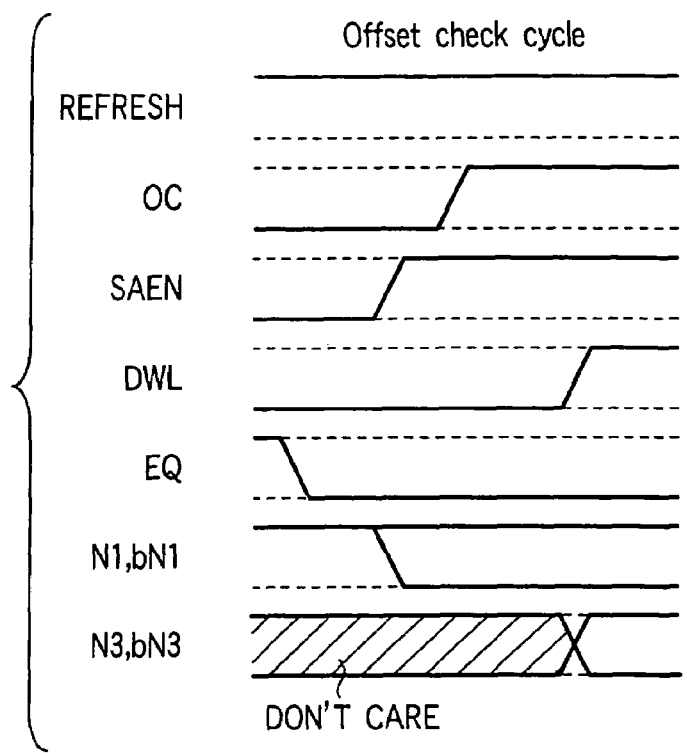
FIG. 8 is a diagram showing an operation of the semiconductor integrated circuit of FIG. 7.

(1) Offset Check Cycle (see FIG. 8)

The offset of the differential sense amplifier 11 is checked in this cycle.

First, it is checked whether the differential sense amplifier 11 is used in a normal operation mode. It is confirmed that the differential sense amplifier 11 is not used, and the refresh signal REFRESH is then set to "H".

After the equalize signal EQ is set to "H", and the nodes N1, bN1 are set to the inner power potential Vdd, the equalize signal EQ is set to "L".

Thereafter, the sense amplifier enable signal SAEN is set to "H", and simultaneously or a little later the offset check signal OC is set to "H".

When the offset check signal OC reaches "H", the nodes N1 and bN2 are electrically connected, and the nodes bN1 and N2 are electrically connected. Moreover, when the sense amplifier enable signal SAEN reaches "H", the nodes N1 and N2 are electrically disconnected, and the nodes bN1 and bN2 are electrically disconnected.

Furthermore, since the sense amplifier enable signal SAEN reaches "H", the differential sense amplifier 11 is brought into an operative state. Since the potential difference is not generated in the nodes N1, bN1 of the differential sense amplifier 11, the output data of the differential sense amplifier 11 is determined only by the offset of the differential sense amplifier 11.

That is, in response to the offset of the differential sense amplifier 11, one of the nodes N1, bN1 turns into "1" state (=Vdd), and the other turns into "0" state (=Vss). Additionally, the data outputted to the node N1 is transferred to the node bN2, and the data outputted to the node bN1 is transferred to N2.

Moreover, when the control signal DWL reaches "H", the MOS transistors QN6, QN7 are turned on, and therefore the data of the nodes N2, bN2 is latched by the latch circuit 13.

For example, it is supposed that "1" is read out into the node N1 and "0" is read out into the node bN1 with a high frequency in the normal readout mode.

In this case, the threshold voltage of the MOS transistor QN0 in the differential sense amplifier 11 is lower than usual, and the threshold voltage of the MOS transistor QP1 in the differential sense amplifier 11 is higher than usual. Therefore, when the inner power potential Vdd is given to the nodes N1, bN1 in an offset check cycle, the potential of the node bN1 drops, "1" is outputted to the node N1, and "0" is outputted to the node bN1.

Moreover, the "1" data of the node N1 is transferred to the node bN2 via the data change circuit 14, and the "0" data of the node bN1 is transferred to the node N2 via the data change circuit 14. Therefore, the node N3 of the latch circuit 13 turns into the "0" state, and the node bN3 turns into the "1" state.

Figure 9:
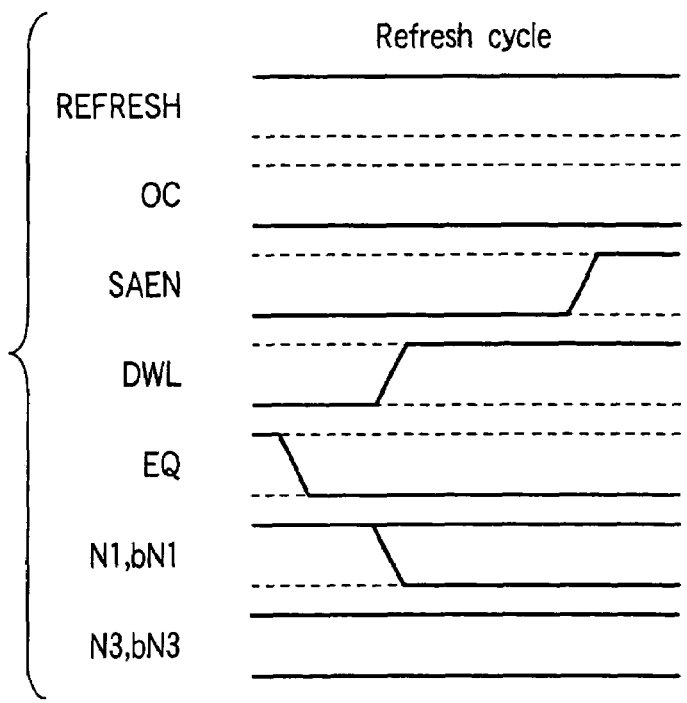
FIG. 9 is a diagram showing the operation of the semiconductor integrated circuit of FIG. 7.

(2) Refresh Cycle (see FIG. 9)

The offset of the differential sense amplifier 11 is minimized in this cycle.

First, it is checked whether the differential sense amplifier 11 is used in the normal operation mode, it is confirmed that the differential sense amplifier 11 is not used, and the refresh signal REFRESH is then set to "H".

After the equalize signal EQ is set to "H", and the nodes N1, bN1 are set to the inner power potential Vdd, the equalize signal EQ is set to "L".

Thereafter, when the control signal DWL is set to "H", the data latched by the latch circuit 13 is outputted to the nodes N2, bN2.

For example, when the node N3 of the latch circuit 13 is in the "0" state, and the node bN3 is in the "1" state, the "0" data is outputted to the node N2, and the "1" data is outputted to the node bN2. Moreover, at this time, since the sense amplifier enable signal SAEN indicates "L", the P channel MOS transistors QP6, QP7 are in the on state. Therefore, the "0" data of the node N2 is transferred to the node N1, and the "1" data of the node bN2 is transferred to the node bN1.

Thereafter, the sense amplifier enable signal SAEN is set to "H". When the sense amplifier enable signal SAEN reaches "H", the differential sense amplifier 11 is brought into the operative state. Since the data of the latch circuit 13 is outputted to the nodes N1, bN1 of the differential sense amplifier 11, the output data of the differential sense amplifier 11 is determined by the data of the latch circuit 13.

Here, the data latched by the latch circuit 13 is reverse to the data outputted from the differential sense amplifier 11 in the offset check cycle. In other words, in the refresh cycle, the data reverse to the data inputted into the differential sense amplifier 11 with a high frequency in the normal readout mode is inputted into the differential sense amplifier 11.

Therefore, in the refresh cycle, the MOS transistor different from the MOS transistor turned on by the data inputted in the normal readout mode with the high frequency is turned on, and the threshold voltage of the MOS transistor fluctuates in a direction in which the offset of the differential sense amplifier 11 is reduced.

For example, in the normal readout mode, when the "1" data is read out into the node N1 and the "0" data is read out into the node bN1 with the high frequency, the node N3 of the latch circuit 13 turns into the "0" state and the node bN3 turns into the "1" state in the offset check cycle. Therefore, in the refresh cycle, the "0" data is inputted into the node N1 of the differential sense amplifier 11, and the "1" data is inputted into the node bN1.

In this case, since the MOS transistors QP0, QN1 in the differential sense amplifier 11 are brought into the on state, the threshold voltage of the N channel MOS transistor QN1 drops, and the threshold voltage of the P channel MOS transistor QP1 rises. That is, the threshold voltage of the MOS transistor QN1 fluctuates in a direction in which the threshold voltage becomes equal to the threshold voltage of the MOS transistor QN0 in a state lower than usual. The threshold voltage of the MOS transistor QP0 fluctuates in a direction in which the threshold voltage becomes equal to the threshold voltage of the MOS transistor QP1 in a state higher than usual.

In this manner, since the data reverse to the data inputted into the differential sense amplifier 11 in the normal readout mode with the high frequency is inputted into the differential sense amplifier 11 in the refresh cycle, the offset of the differential sense amplifier 11 is minimized.

Additionally, in the above-described operation (offset check cycle and refresh cycle), a control signal CLAMP is set to "L", MOS transistors QN10, QN11 are turned off, and the nodes N2, bN2 may electrically be disconnected from the pair of bit lines BL1, bBL1. In this case, in an input/output operation with respect to the latch circuit 13, it is unnecessary to charge a large capacity (bit line pair), and a high-speed operation can be realized.

5. Application Example 2

Figure 10:
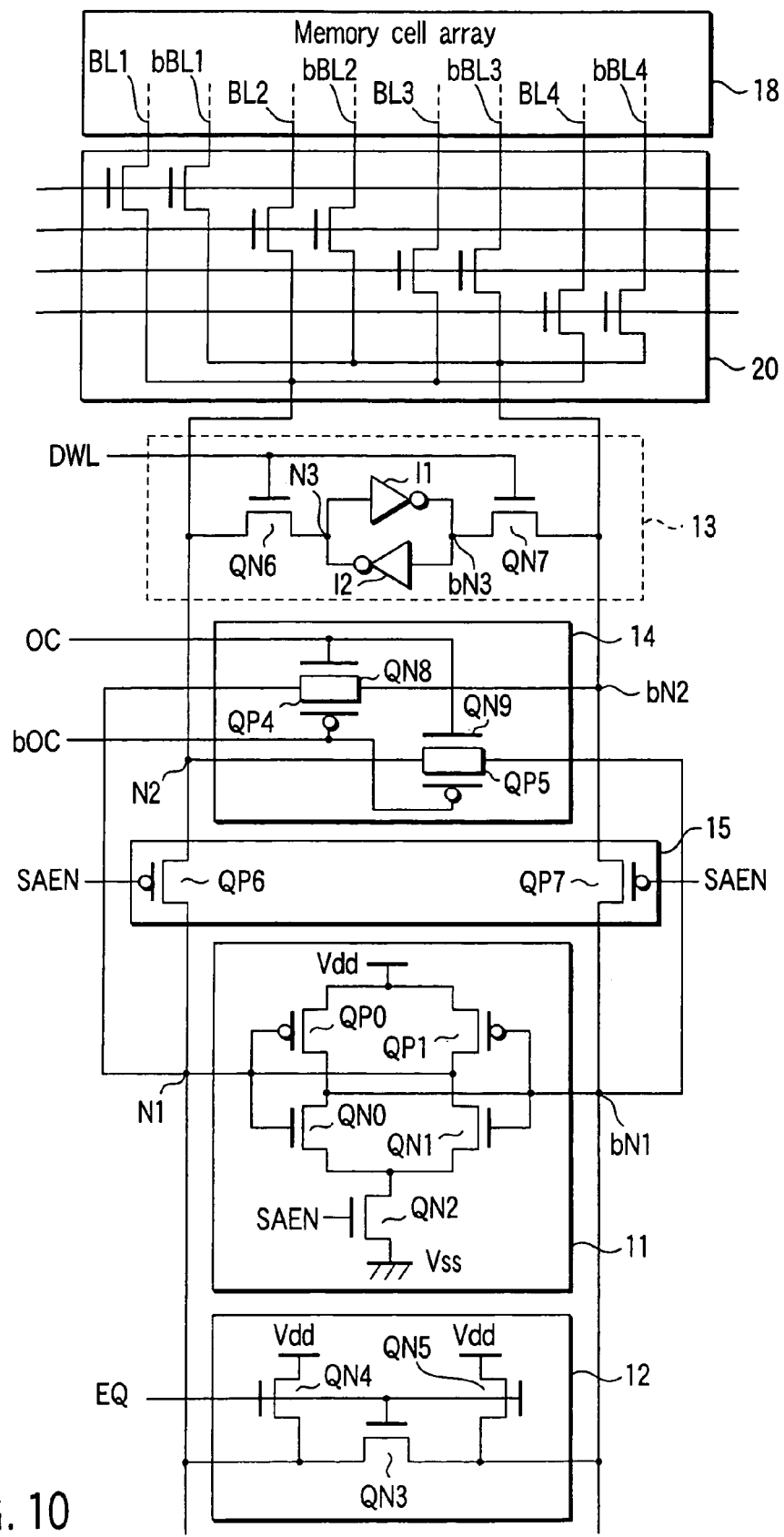
FIG. 10 is a diagram showing a modification example of the semiconductor integrated circuit of FIG. 7.

FIG. 10 shows a second example in which the semiconductor integrated circuit of FIG. 4 is applied to the semiconductor memory.

The memory cell array 18 is constituted of the array of static memory cells or dynamic memory cells.

As characteristics of a memory circuit of the present example, a plurality of bit lines (four bit lines in the present example) BL1, BL2, BL3, BL4 are connected to the node N2 via a column selection circuit 20. Similarly, a plurality of bit lines bBL1, bBL2, bBL3, bBL4 are connected to the node bN2 via the column selection circuit 20.

When the present invention is applied to the semiconductor memory including a plurality of differential sense amplifiers, a circuit to minimize the offset (or an operation method) is applied to each differential sense amplifier 11. Therefore, the present invention can be applied to the semiconductor memory irrespective of the number of bit line pairs connected to the differential sense amplifier 11.

6. Application Example 3

Figure 11:
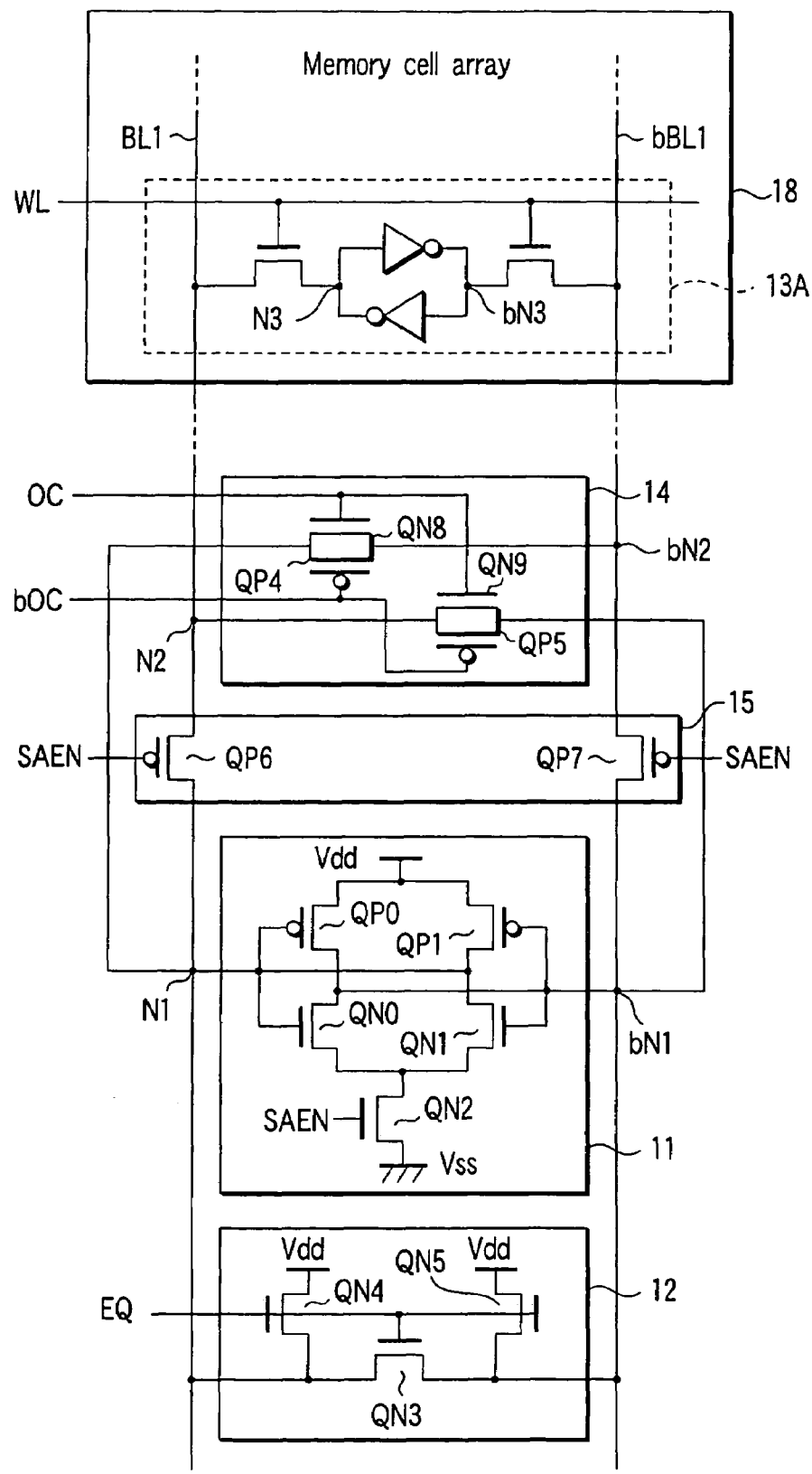
FIG. 11 is a diagram showing a modification example of the semiconductor integrated circuit of FIG. 7.

FIG. 11 shows a third example in which the semiconductor integrated circuit of FIG. 4 is applied to the semiconductor memory.

The present example relates to a static random access memory (SRAM).

A memory cell 13A of the SRAM is constituted of two flip-flop connected inverters and two transfer gates. For example, the constitution of the memory cell 13A is the same as that of the latch circuit 13 of FIG. 7.

Therefore, in the present example, the memory cell 13A in the memory cell array 18 is used as the latch circuit which latches the offset information.

When the offset information is latched in the memory cell 13A in the memory cell array 18 in this manner, it is unnecessary to newly dispose the latch circuit in a conventional semiconductor memory, and an increase of chip size can be suppressed.

7. Conclusion

According to the semiconductor integrated circuit according to the first embodiment of the present invention, the offset resulting from the process dispersion or the operation frequency of the SOI device (dispersion of the threshold voltage of the MOS transistor) is minimized by a circuit operational technique, and the drop of the operation speed and the erroneous sense operation can be prevented from being caused by the offset.

[Second Embodiment]

1. Outline

FIG. 12 shows the semiconductor integrated circuit according to a second embodiment of the present invention.

As compared with the semiconductor integrated circuit of FIG. 3, the semiconductor integrated circuit of the present example is characterized in that the positions (or layout) of the latch circuit 13, data change circuit 14, and disconnection circuit 15 are different.

For example, a case in which the present invention is applied to the semiconductor memory is considered. Then, in the example of FIG. 3, the latch circuit 13, data change circuit 14, and disconnection circuit 15 are disposed between the differential sense amplifier 11 and memory cell array. On the other hand, in the present example, the latch circuit 13, data change circuit 14, and disconnection circuit 15 are disposed between the differential sense amplifier 11 and data input/output circuit.

In the present example, the latch circuit 13 is disposed on a data input/output circuit side of the differential sense amplifier 11. For example, with the SRAM, the latch circuit for temporarily holding the data is usually disposed on the data input/output circuit side of the differential sense amplifier 11.

Therefore, the offset information of the differential sense amplifier 11 can also be latched in the latch circuit.

A connection relation of the semiconductor integrated circuit of the present invention will be described hereinafter.

The differential sense amplifier 11 is connected between the nodes N1, bN1. The differential sense amplifier includes the constitution, for example, shown in FIG. 1. Moreover, the equalize circuit 12 for equalizing the potentials of the nodes N1, bN1 is connected between the nodes N1, bN1.

On the other hand, the latch circuit 13 is connected between the nodes N2, bN2. The data change circuit 14 is connected between the nodes N1 and bN2, and also connected between the nodes bN1 and N2. The data change circuit 14 has a function of electrically connecting or disconnecting the nodes N1 and bN2 and electrically connecting or disconnecting the nodes bN1 and N2.

The disconnection circuit 15 is connected between the nodes N1 and N2 and between the nodes bN1 and bN2. The disconnection circuit 15 has a function of electrically disconnecting or connecting the nodes N1 and N2 and electrically disconnecting or connecting the nodes bN1 and bN2.

The operation principle of the semiconductor integrated circuit of FIG. 12 will briefly be described.

It is assumed that the differential sense amplifier 11 has the offset.

First, the equalize circuit 12 equalizes the potentials of the nodes N1, N2. Thereafter, the differential sense amplifier 11 is operated. At this time, since the potential difference is not generated in two input nodes N1, N2 of the differential sense amplifier 11, the output data is determined depending only on the offset of the differential sense amplifier 11.

The output data (offset information) is latched by the latch circuit 13. At this time, the data change circuit 14 electrically connects the nodes N1 and bN2 and electrically connects the nodes bN1 and N2. Moreover, the disconnection circuit 15 electrically disconnects the nodes N1 and N2 and electrically disconnects the nodes bN1 and bN2.

Therefore, the output data of the node N1 is transferred to the node bN2, and the output data of the node bN1 is transferred to the node N2. That is, the data having the value reverse to the value of the output data of the differential sense amplifier 11 is latched by the latch circuit 13.

Thereafter, the data change circuit 14 electrically disconnects the nodes N1 and bN2 and electrically disconnects the nodes bN1 and N2. Moreover, the disconnection circuit 15 electrically connects the nodes N1 and N2 and electrically connects the nodes bN1 and bN2.

Therefore, the output data of the node N2 is transferred to the node N1, and the output data of the node bN2 is transferred to the node bN1. That is, the data having the value reverse to the value of the output data of the differential sense amplifier 11, that is, the data for reducing the offset is inputted into the differential sense amplifier 11.

In this manner, according to the present invention, the data acting in the direction in which the offset of the differential sense amplifier 11 is reduced is inputted into the differential sense amplifier 11, and the offset of the differential sense amplifier 11 is minimized.

2. Concrete Example

Figure 13:
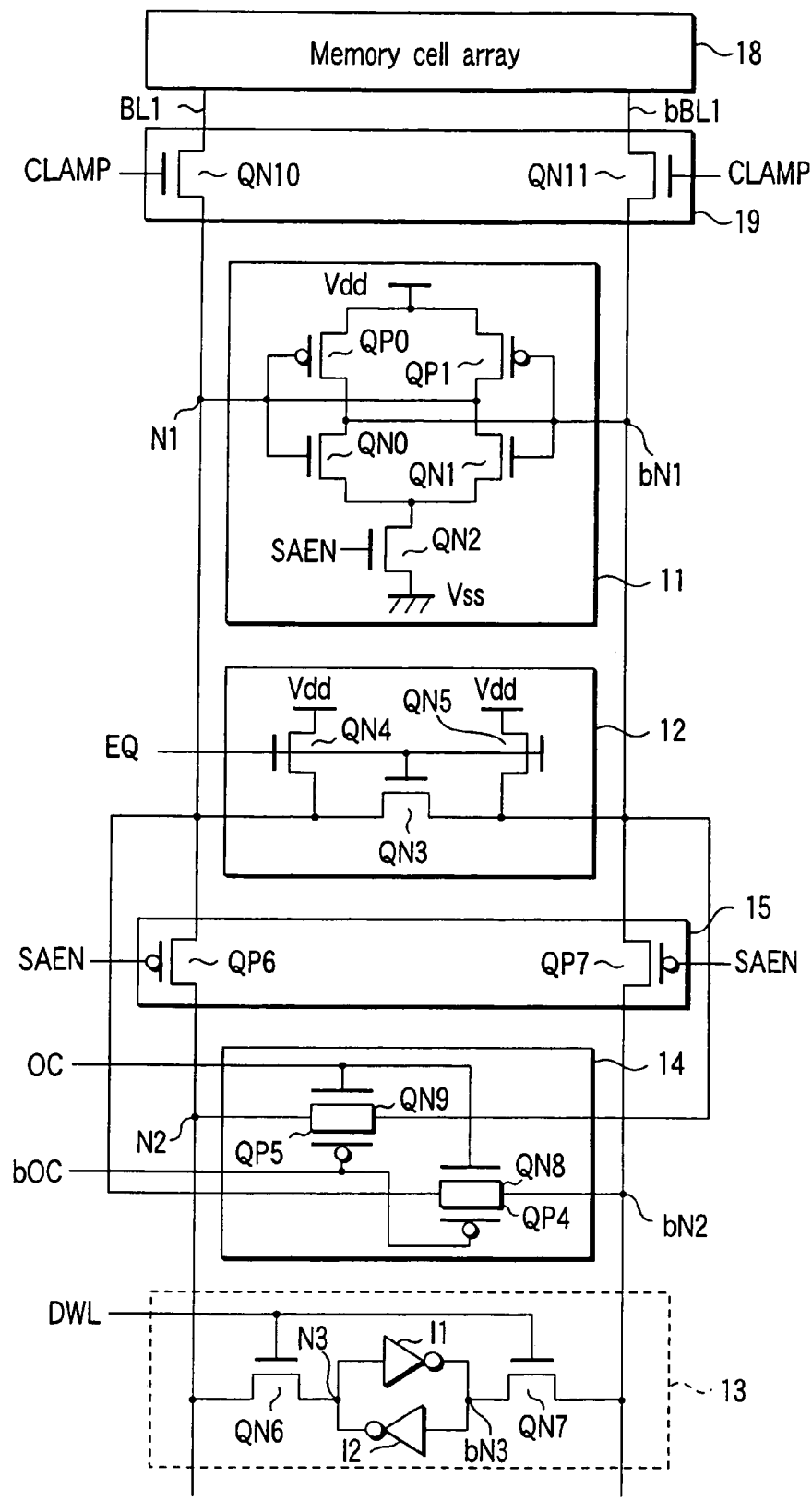
FIG. 13 is a diagram showing a concrete example of the semiconductor integrated circuit of FIG. 12.

FIG. 13 shows a concrete example of the semiconductor integrated circuit of FIG. 12.

The differential sense amplifier 11 is constituted of P channel MOS transistors QP0, QP1 and N channel MOS transistors QN0, QN1, QN2.

The gates of the MOS transistors QP0, QN0 are connected to the node N1 and the drains of the MOS transistors QP1, QN1. The gates of the MOS transistors QP1, QN1 are connected to the node bN1 and the drains of the MOS transistors QP0, QN0.

The sources of the MOS transistors QP0, QP1 are connected to the inner power node Vdd, and the MOS transistor QN2 is connected between the sources of the MOS transistors QN0, QN1 and the ground point. The sense amplifier enable signal SAEN is inputted into the gate of the MOS transistor QN2.

The equalize circuit 12 is constituted of N channel MOS transistors QN3, QN4, QN5. The MOS transistor QN3 is connected between the nodes N1 and bN1, the MOS transistor QN4 is connected between the inner power node Vdd and node N1, and the MOS transistor QN5 is connected between the inner power node Vdd and node bN1.

The equalize signal EQ is inputted into the gates of the MOS transistors QN3, QN4, QN5. When the equalize signal EQ reaches "H", both the nodes N1 and bN1 are set to the inner power potential Vdd.

Additionally, in the present example, the equalize circuit 12 sets both the nodes N1, bN1 to the inner power potential Vdd. However, instead of this, for example, the equalize circuit 12 may be modified so as to set the nodes N1, bN1 to Vdd/2. In this case, the differential sense amplifier 11 is also modified, for example, as shown in FIG. 5.

The latch circuit 13 is constituted of two flip-flop connected inverters I1, I2 connected between the nodes N3, bN3, the N channel MOS transistor (transfer gate) QN6 connected between nodes N2 and N3, and the N channel MOS transistor (transfer gate) QN7 connected between nodes bN2 and bN3.

When the control signal DWL indicates "H", the nodes N2 and N3 are short-circuited, and the nodes bN2 and bN3 are short-circuited.

Additionally, the latch circuit 13 can be constituted, for example, in the same manner as the memory cell. When the memory cell is the static memory cell, as in the present example, the latch circuit 13 can have the same constitution (dummy cell) as the static memory cell. In this case, the control signal DWL is supplied to the gates of the MOS transistors QN6, QN7 from the dummy word line.

The data change circuit 14 is constituted of MOS transistors QP4, QN8 connected between the nodes N1 and bN2, and MOS transistors QP5, QN9 connected between the nodes bN1 and N2. When the offset check signal OC indicates "H", the MOS transistors QP4, QP5, QN8, QN9 are turned on, and the nodes N1 and bN2 and the nodes N2 and bN1 are electrically connected.

The disconnection circuit 15 is constituted of the P channel MOS transistor QP6 connected between the nodes N1, N2, and the P channel MOS transistor QP7 connected between the nodes bN1, bN2. When the sense amplifier enable signal SAEN indicates "H", the nodes N1 and N2 and the nodes bN1 and bN2 are electrically disconnected.

Additionally, since the operation of the semiconductor integrated circuit of the present example is the same as that of the semiconductor integrated circuit of FIG. 7, description thereof is omitted.

3. Conclusion

According to the semiconductor integrated circuit according to the second embodiment of the present invention, the offset resulting from the process dispersion or the operation frequency of the SOI device (dispersion of the threshold voltage of the MOS transistor) is minimized by the circuit operational technique, and the drop of the operation speed and the erroneous sense operation can be prevented from being caused by the offset.

[Third Embodiment]

1. Outline

FIG. 14 shows the semiconductor integrated circuit according to a third embodiment of the present invention.

As compared with the semiconductor integrated circuit of FIG. 3, the semiconductor integrated circuit of the present example is characterized in that the position of the latch circuit 13 is different.

For example, the case in which the present invention is applied to the semiconductor memory is considered. Then, in the example of FIG. 3, the latch circuit 13, data change circuit 14, and disconnection circuit 15 are disposed between the differential sense amplifier 11 and memory cell array. On the other hand, in the present example, the data change circuit 14 and disconnection circuit 15 are disposed between the differential sense amplifier 11 and memory cell array, and the latch circuit 13 is disposed between the differential sense amplifier 11 and data input/output circuit.

In the present example, the latch circuit 13 is disposed on the data input/output circuit side of the differential sense amplifier 11. For example, with the SRAM, the latch circuit for temporarily holding the data is usually disposed on the data input/output circuit side of the differential sense amplifier 11. Therefore, the offset information of the differential sense amplifier 11 can also be latched in the latch circuit.

The connection relation of the semiconductor integrated circuit of the present invention will be described hereinafter.

The differential sense amplifier 11 is connected between the nodes N1, bN1. The differential sense amplifier includes the constitution, for example, shown in FIG. 1. Moreover, the equalize circuit 12 for equalizing the potentials of the nodes N1, bN1 is connected between the nodes N1, bN1. Furthermore, the latch circuit 13 is connected between the nodes N1, bN1.

On the other hand, the data change circuit 14 is connected between the nodes N1 and bN2, and also connected between the nodes bN1 and N2. The data change circuit 14 has a function of electrically connecting or disconnecting the nodes N1 and bN2 and electrically connecting or disconnecting the nodes bN1 and N2.

The disconnection circuit 15 is connected between the nodes N1 and N2 and between the nodes bN1 and bN2. The disconnection circuit 15 has a function of electrically disconnecting or connecting the nodes N1 and N2 and electrically disconnecting or connecting the nodes bN1 and bN2.

The operation principle of the semiconductor integrated circuit of FIG. 14 will briefly be described.

It is assumed that the differential sense amplifier 11 has the offset.

First, the equalize circuit 12 equalizes the potentials of the nodes N1, bN1. Thereafter, the differential sense amplifier 11 is operated. At this time, since the potential difference is not generated in two input nodes N1, bN1 of the differential sense amplifier 11, the output data is determined depending only on the offset of the differential sense amplifier 11. The output data (offset information) is latched by the latch circuit 13.

Thereafter, the data change circuit 14 electrically connects the nodes N1 and bN2 and electrically connects the nodes bN1 and N2. Moreover, the disconnection circuit 15 electrically disconnects the nodes N1 and N2 and electrically disconnects the nodes bN1 and bN2.

Therefore, the output data of the node N1 is transferred to the node bN2, and the output data of the node bN1 is transferred to the node N2.

Thereafter, the data change circuit 14 electrically disconnects the nodes N1 and bN2 and electrically disconnects the nodes bN1 and N2. Moreover, the disconnection circuit 15 electrically connects the nodes N1 and N2 and electrically connects the nodes bN1 and bN2.

Therefore, the output data of the node N2 is transferred to the node N1, and the output data of the node bN2 is transferred to the node bN1. That is, the data having the value reverse to the value of the output data of the differential sense amplifier 11, that is, the data for reducing the offset is inputted into the differential sense amplifier 11.

In this manner, according to the present invention, the data acting in the direction in which the offset of the differential sense amplifier 11 is reduced is inputted into the differential sense amplifier 11, and the offset of the differential sense amplifier 11 is minimized.

2. Concrete Example

FIG. 15 shows a concrete example of the semiconductor integrated circuit of FIG. 14.

The differential sense amplifier 11 is constituted of P channel MOS transistors QP0, QP1 and N channel MOS transistors QN0, QN1, QN2.

The gates of the MOS transistors QP0, QN0 are connected to the node N1 and drains of the MOS transistors QP1, QN1. The gates of the MOS transistors QP1, QN1 are connected to the node bN1 and drains of the MOS transistors QP0, QN0.

The sources of the MOS transistors QP0, QP1 are connected to the inner power node Vdd, and the MOS transistor QN2 is connected between the sources of the MOS transistors QN0, QN1 and the ground point. The sense amplifier enable signal SAEN is inputted into the gate of the MOS transistor QN2.

The equalize circuit 12 is constituted of N channel MOS transistors QN3, QN4, QN5. The MOS transistor QN3 is connected between the nodes N1 and bN1, the MOS transistor QN4 is connected between the inner power node Vdd and node N1, and the MOS transistor QN5 is connected between the inner power node Vdd and node bN1.

The equalize signal EQ is inputted into the gates of the MOS transistors QN3, QN4, QN5. When the equalize signal EQ reaches "H", both the nodes N1, bN1 are set to the inner power potential Vdd.

Additionally, in the present example, the equalize circuit 12 sets both the nodes N1, bN1 to the inner power potential Vdd. However, instead of this, for example, the equalize circuit 12 may be modified so as to set the nodes N1, bN1 to Vdd/2. In this case, the differential sense amplifier 11 is also modified, for example, as shown in FIG. 5.

The latch circuit 13 is constituted of two flip-flop connected inverters 11, 12 connected between the nodes N3, bN3, the N channel MOS transistor (transfer gate) QN6 connected between the nodes N1 and N3, and the N channel MOS transistor (transfer gate) QN7 connected between the nodes bN1 and bN3.

When the control signal DWL indicates "H", the nodes N1 and N3 are short-circuited, and the nodes bN1 and bN3 are short-circuited.

Additionally, when the present invention is applied to the SRPA, the latch circuit 13 is already disposed in the conventional SRAM, and it is therefore unnecessary to newly dispose the circuit 13 in the conventional SRAM.

The data change circuit 14 is constituted of MOS transistors QP4, QN8 connected between the nodes N1 and bN2, and MOS transistors QP5, QN9 connected between the nodes bN1 and N2. When then offset check signal OC indicates "H", the MOS transistors QP4, QP5, QN8, QN9 are turned on, and the nodes N1 and bN2 and the nodes N1 and bN2 are electrically connected.

The disconnection circuit 15 is constituted of the P channel MOS transistor QP6 connected between the nodes N1, N2, and the P channel MOS transistor QP7 connected between the nodes bN1, bN2. When the sense amplifier enable signal SAEN indicates "H", the nodes N1 and N2 and the nodes bN1 and bN2 are electrically disconnected.

3. Operation

An operation of the semiconductor integrated circuit of FIG. 15 applied to the semiconductor memory will be described.

In the normal readout mode, the data of the memory cell is read out as the potential difference of the pair of bit lines BL1, bBL1, and the potential difference is sensed and amplified by the differential sense amplifier 11.

Here, with the SOI device, unless the number of readouts of "1" data is equal to the number of readouts of "0" data with respect to the same differential sense amplifier 11 (e.g., when only the same data is continuously read out), the substrate potential of the MOS transistor having a large number of operations fluctuates, and the offset (dispersion of the threshold value of the MOS transistor) is generated in the differential sense amplifier 11.

To minimize the offset, according to the present invention, in the mode other than the normal readout mode, the following operation is continuously or intermittently performed until the offset is eliminated or sufficiently reduced.

Figure 16:
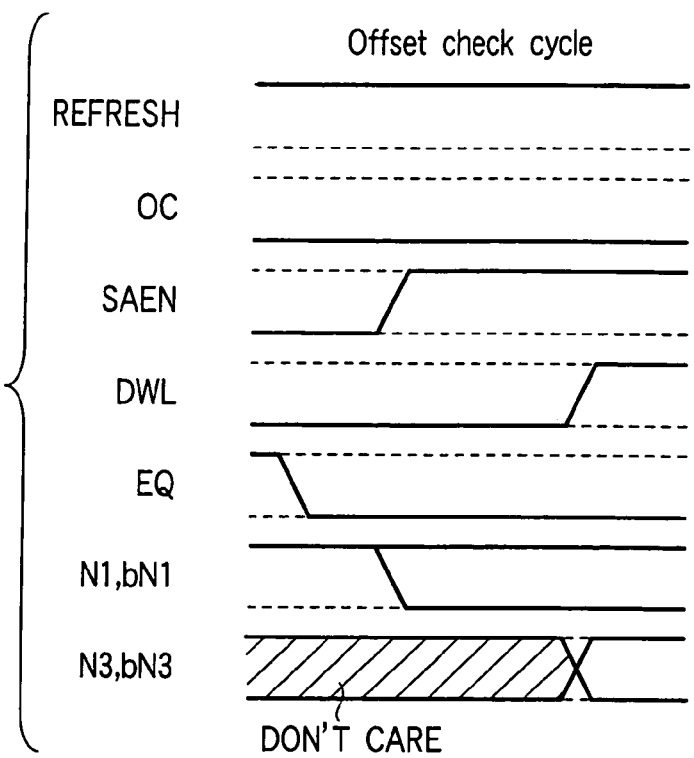
FIG. 16 is a diagram showing an operation of the semiconductor integrated circuit of FIG. 15.

(1) Offset Check Cycle (see FIG. 16)

The offset of the differential sense amplifier 11 is checked in this cycle.

First, it is checked whether the differential sense amplifier 11 is used in the normal operation mode, it is confirmed that the differential sense amplifier 11 is not used, and the refresh signal REFRESH is then set to "H".

After the equalize signal EQ is set to "H", and the nodes N1, bN1 are set to the inner power potential Vdd, the equalize signal EQ is set to "L".

Thereafter, when the sense amplifier enable signal SAEN reaches "H", the differential sense amplifier 11 is brought into the operative state. Since the potential difference is not generated in the input nodes N1, bN1 of the differential sense amplifier 11, the output data of the differential sense amplifier 11 is determined only by the offset of the differential sense amplifier 11.

Thereafter, when the control signal DWL reaches "H", the MOS transistors QN6, QN7 are turned on, and therefore the data of the nodes N1, bN1 is latched by the latch circuit 13.

Figure 17:
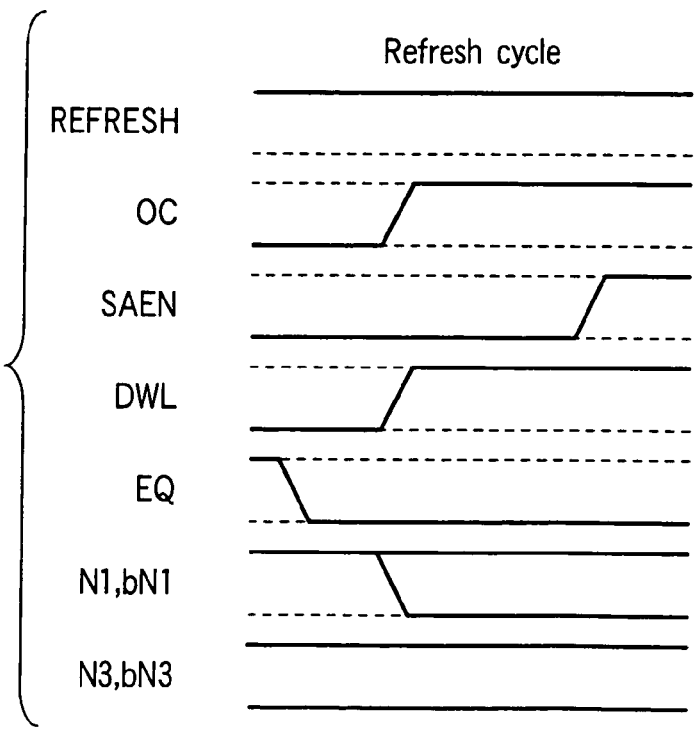
FIG. 17 is a diagram showing the operation of the semiconductor integrated circuit of FIG. 15.

(2) Refresh Cycle (see FIG. 17)

The offset of the differential sense amplifier 11 is minimized in this cycle.

First, it is checked whether the differential sense amplifier 11 is used in the normal operation mode, it is confirmed that the differential sense amplifier 11 is not used, and the refresh signal REFRESH is then set to "H".

After the equalize signal EQ is set to "H", and the nodes N1, bN1 are set to the inner power potential Vdd, the equalize signal EQ is set to "L".

Thereafter, when the control signal DWL is set to "H", the data latched by the latch circuit 13 is outputted to the nodes N1, bN1.

Moreover, the offset check signal OC is set to "H". When the offset check signal OC reaches "H", the nodes N1 and bN2 are electrically connected, and the nodes bN1 and N2 are electrically connected.

Furthermore, since the sense amplifier enable signal SAEN maintains "L", the nodes N1 and N2 and the nodes bN1 and bN2 are electrically disconnected.

Therefore, the output data of the node N1 is transferred to the node bN2, and the output data of the node bN1 is transferred to the node N2.

Thereafter, the sense amplifier enable signal SAEN is set to "H". When the sense amplifier enable signal SAEN reaches "H", the differential sense amplifier 11 is brought into the operative state. Moreover, when the sense amplifier enable signal SAEN reaches "H", the MOS transistors QP6, QP7 are turned on. Therefore, is the data of the node N2 is transferred to the node N1, and the data of the node bN2 is transferred to the node bN1.

In this manner, the data reverse to the data inputted into the differential sense amplifier 11 in the normal readout mode with the high frequency is inputted into the differential sense amplifier 11 in the refresh cycle.

Therefore, in the refresh cycle, the MOS transistor different from the MOS transistor turned on by the data inputted in the normal readout mode with the high frequency is turned on, and the threshold voltage of the MOS transistor fluctuates in the direction in which the offset of the differential sense amplifier 11 is reduced.

4. Conclusion

Even in the semiconductor integrated circuit according to the third embodiment of the present invention, the offset resulting from the process dispersion or the operation frequency of the SOI device (dispersion of the threshold voltage of the MOS transistor) is minimized by the circuit operational technique, and the drop of the operation speed and the erroneous sense operation can be prevented from being caused by the offset.

[Fourth Embodiment]

1. Assumption

Figure 18:
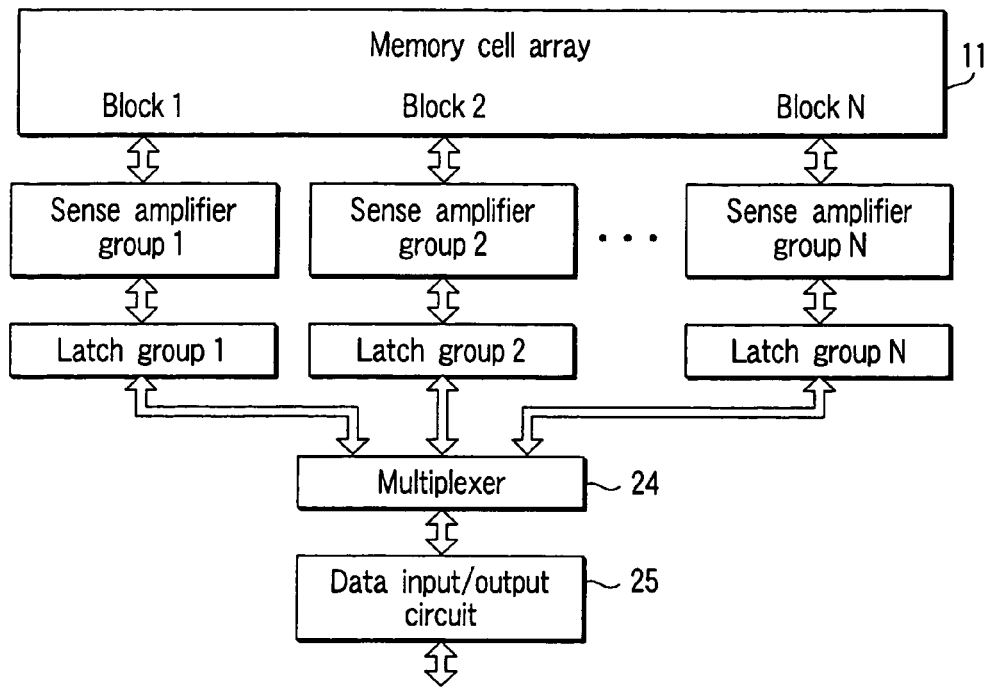
FIG. 18 is a diagram showing a constitution of a general SRAM.

FIG. 18 shows a general constitution of the semiconductor memory.

In the semiconductor memory (e.g., SRAM), the sense amplifier is divided into a plurality of groups, and the sense amplifiers are frequently activated by a group unit.

For example, the sense amplifiers in a sense amplifier group 1 are activated (operative state) among sense amplifier groups 1 to N (N is a natural number), and the sense amplifiers in the other sense amplifier groups 2 to N are inactivated (inoperative state). In this case, for example, the data of the memory cells in a block 1 in the memory cell array 11 is outputted to the outside of the memory chip via the sense amplifier group 1, a latch group 1, a multiplexer 24, and a data input/output circuit 25.

Additionally, in this time, the sense amplifiers in the sense amplifier groups 2 to N do nothing. Therefore, with respect to the sense amplifiers in the sense amplifier groups 2 to N, in this time, a refresh operation according to the present invention (operation of checking and minimizing the offset) can be performed.

However, the sense amplifiers in the sense amplifier group are all simultaneously brought into the operative state or the inoperative state. That is, the sense amplifiers in the sense amplifier group are not selectively brought into the operative/inoperative state.

On the other hand, assuming the offset of each sense amplifier in the sense amplifier group, naturally the sense amplifiers having no offset and having the offset are mixed/disposed in the sense amplifier group. Moreover, also with respect to the sense amplifier having the offset, degrees of the offset (the dispersion of the threshold voltage of the MOS transistor) are all different.

Therefore, in this case, to minimize the offsets of all the sense amplifiers in the sense amplifier group, it is necessary to operate all the sense amplifiers until the offsets of all the sense amplifiers are minimized. As a result, very much power consumption is required in the refresh operation according to the present invention.

That is, even with respect to the sense amplifier which does not have the offset and the sense amplifier whose offset is eliminated by several refresh operations, all the refresh operations have to be performed like the sense amplifier whose offset is eliminated by a largest number of refresh operations.

To solve the problem, in the present embodiment, there is proposed a semiconductor integrated circuit in which the refresh operation can selectively be performed with respect to the respective sense amplifiers in the sense amplifier group. In this case, for the sense amplifiers whose offsets are minimized, the refresh operations are individually stopped. Only for the sense amplifiers whose offsets are not minimized, the refresh operations can individually be continued. Therefore, the present embodiment is very effective in reducing the power consumption.

2. Outline

Figure 19:
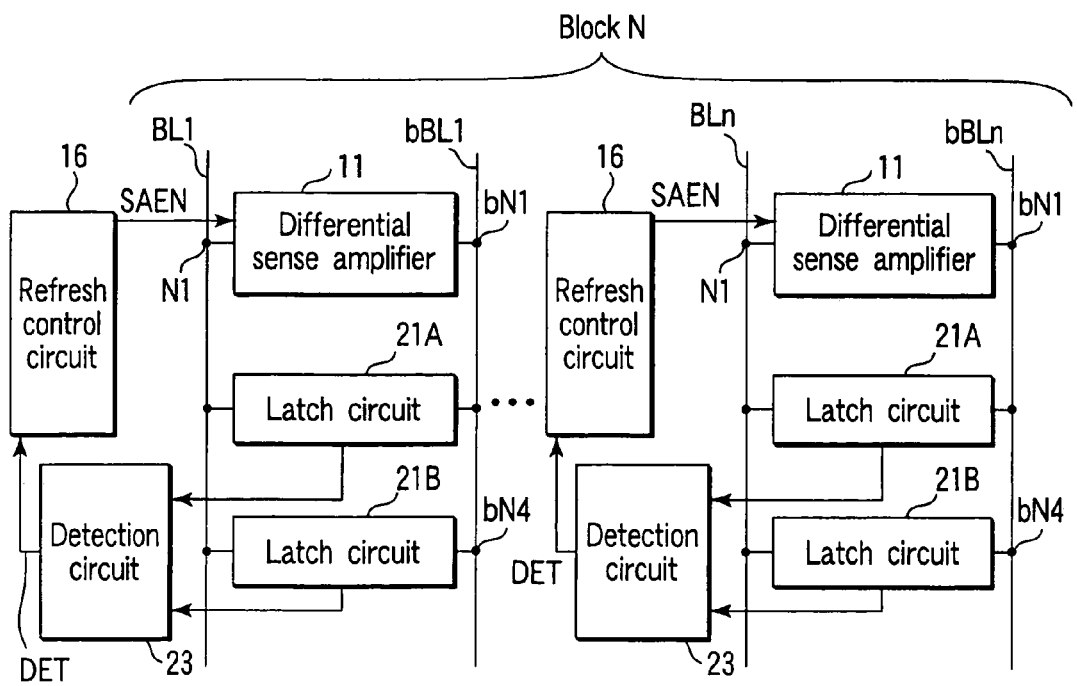
FIG. 19 is a diagram showing the outline of the semiconductor integrated circuit according to a fourth embodiment of the present invention.

FIG. 19 shows the semiconductor integrated circuit according to a fourth embodiment of the present invention.

The differential sense amplifier 11 is connected between the nodes N1, bN1. Moreover, in the present example, two latch circuits 21A, 21B are connected between the nodes N1, bN1.

Additionally, in one of the latch circuits 21A, 21B, the latch circuit (denoted with the reference numeral "13" in FIGS. 3, 12, and 14) described in the first to third embodiments may be used as such. Moreover, the latch circuit disposed in the conventional semiconductor memory may also be used in one of the latch circuits 21A, 21B.

Furthermore, both the latch circuits 21A, 21B may newly be disposed separately from the latch circuit described in the first to third embodiments.

The data latched in the latch circuits 21A and 21B are inputted into a detection circuit 23. The detection circuit 23 outputs a detection signal DET based on the data of the latch circuits 21A, 21B. The detection signal DET determines whether the refresh operation (operation of minimizing the offset) according to the present invention is to be continued or stopped.

The detection signal DET is inputted into the refresh control circuit 16. The refresh control circuit 16 determines the state ("H" or "L") of the sense amplifier enable signal SAEN based on the detection signal DET.

The operation principle of the semiconductor integrated circuit of FIG. 19 will briefly be described.

First, the data (offset information) read out of the differential sense amplifier 11 in an offset check mode during a first refresh operation is latched in the latch circuit 21A. Thereafter, the operation of minimizing the offset of the differential sense amplifier 11 is performed in the refresh cycle during the first refresh operation. When the operation of minimizing the offset ends, the data of the latch circuit 21A is transferred to the latch circuit 21B.

A second refresh operation is executed after the first refresh operation.

First, the data (offset information) is read out of the differential sense amplifier 11 in the offset check mode during the second refresh operation. The data is latched in the latch circuit 21A. Thereafter, the detection circuit 23 compares the value of the data latched by the latch circuit 21A with the value of the data latched by the latch circuit 21B.

Subsequently, it is judged based on the comparison result (detection signal DET) whether or not the refresh cycle during the second refresh operation is to be executed.

When the refresh cycle during the second refresh operation is judged to be executed, the refresh control circuit 16 sets the sense amplifier enable signal SAEN to "H". When the refresh cycle during the second refresh operation is judged not to be executed, the sense amplifier enable signal SAEN is set to "L".

For example, it is supposed that the data (value of the node N1) latched by the latch circuit 21A in the offset check cycle during the first refresh operation is "1". In this case, the data (value of the node N1) read out of the differential sense amplifier 11 in the offset check cycle during the second refresh operation is "1", it is then judged that the offset is not minimized in the first refresh operation, and the refresh cycle during the second refresh operation is executed.

Moreover, when the data (value of the node N1) read out of the differential sense amplifier 11 in the offset check cycle during the second refresh operation is "0", the offset is judged to be minimized in the first refresh operation. The sense amplifier enable signal SAEN outputted from the refresh control circuit 16 turns to "L", and the refresh cycle during the second refresh operation is not executed.

When the refresh cycle is not executed, the data latched by the latch circuit 21A is not transferred to the latch circuit 21B. Therefore, in this case, the data "0" read out of the differential sense amplifier 11 is not latched by the latch circuit 21B. That is, in and after the second refresh operation, the value of the data read out of the differential sense amplifier 11 in the offset check cycle (value of the data latched by the latch circuit 21A) is constantly different from the value of the data latched by the latch circuit 21B.

When a plurality of refresh operations are repeatedly performed in this manner in the present embodiment, and while the same data (the same offset information) continues to be outputted from the differential sense amplifier 11 in the offset check cycle, the refresh cycle (operation of minimizing the offset) continues to be executed. On the other hand, when and after the different data (different offset information) is outputted from the differential sense amplifier 11 in the offset check cycle, the refresh cycle (operation of minimizing the offset) is not executed.

Therefore, when and after the different data is outputted from the differential sense amplifier 11, the refresh cycle during the refresh operation is not performed, and this can contribute to the reduction of power consumption.

Additionally, even when and after the different data is outputted from the differential sense amplifier 11, the offset check mode during the refresh operation is constantly performed. The data outputted from the differential sense amplifier 11 (data latched by the latch circuit 21A) is compared with the data latched by the latch circuit 21B.

3. Concrete Example

Figure 20:
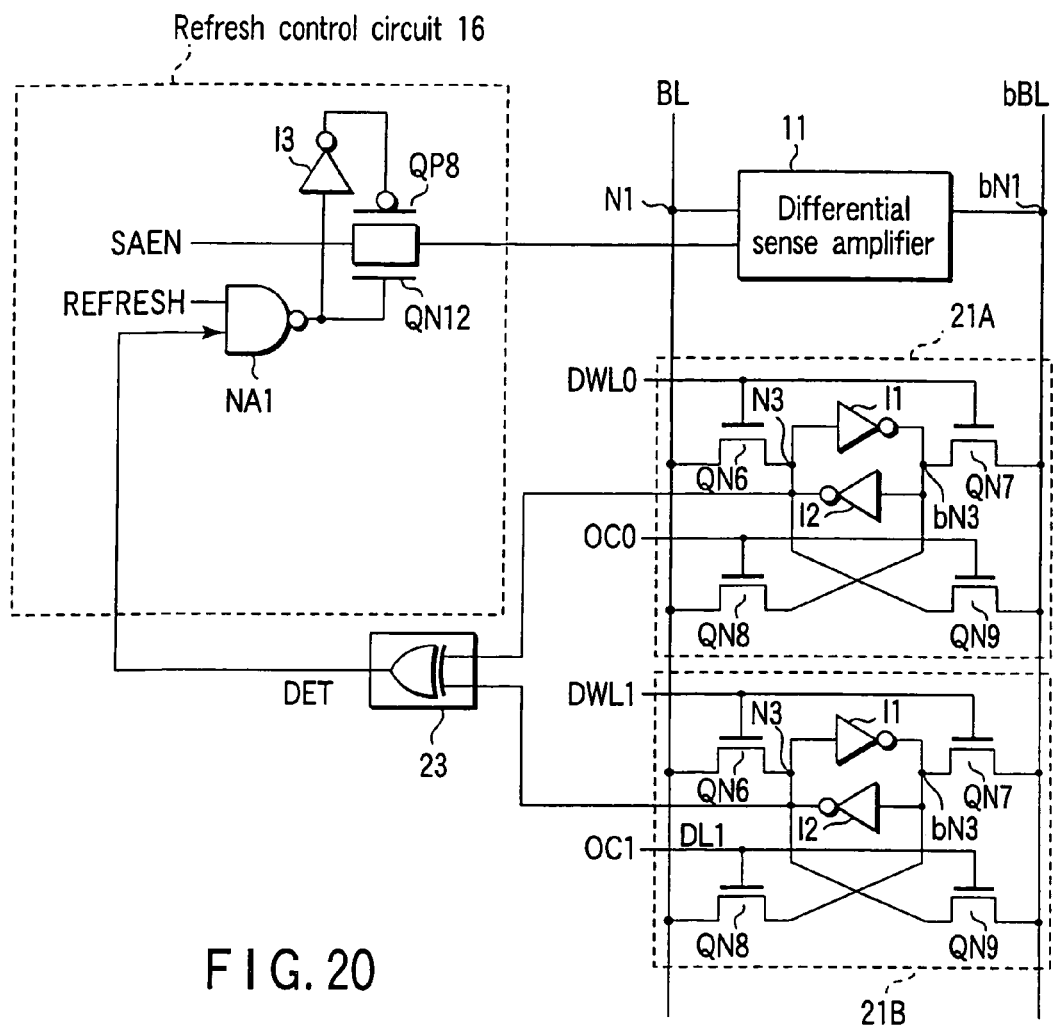
FIG. 20 is a diagram showing a concrete example of the semiconductor integrated circuit of FIG. 19.

FIG. 20 shows a concrete example of the semiconductor integrated circuit of FIG. 19.

The detection circuit 23 is constituted of an exclusive OR circuit. An output signal of the detection circuit 23 (detection signal DET) is inputted into a NAND circuit NA1 in the refresh control circuit 16. The NAND circuit NA1 negates a logical product (executes NAND) of the refresh signal REFRESH and detection signal DET.

The output signal of the NAND circuit NA1 controls the transfer gate constituted of the MOS transistors QP8, QN12 and inverter 13. When the transfer gate opens, the sense amplifier enable signal SAEN is supplied to the differential sense amplifier 11.

4. Operation

The operation of the semiconductor integrated circuit of FIG. 20 will be described.

First, it is confirmed that the sense amplifier in the sense amplifier group is not used in the normal operation, and thereafter the refresh signal REFRESH turns to "1". At first, since both the data (value of the node N3) latched by the latch circuits 21A, 21B are set to "0", the output signal of the detection circuit (exclusive OR circuit) 23 is "0". Therefore, the output signal of the NAND circuit NA1 is "1", and the sense amplifier enable signal SAEN is supplied to the differential sense amplifier 11.

Figure 21:
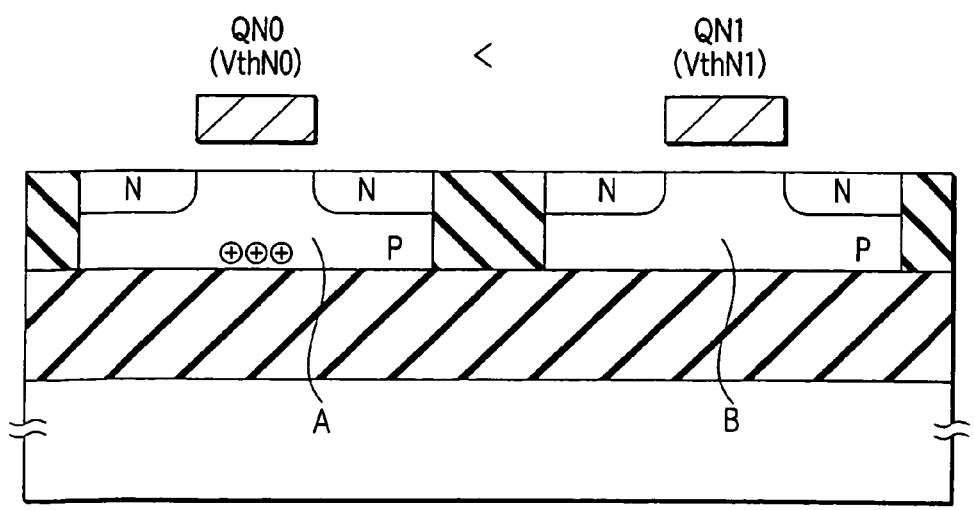
FIG. 21 is a diagram showing a state of the MOS transistor in the differential sense amplifier.

Subsequently, the offset check mode is executed, and the data (offset information) is read out of the differential sense amplifier 11. Here, the MOS transistors QN0, QN1 in the differential sense amplifier 11 have states, for example, shown in FIG. 21, and the "1" data is outputted to the node N1.

An offset check signal OC0 reaches "H", and the offset information (node N3="0", node bN3="1") is latched by the latch circuit 21A. Since both the data (values of the node N3) latched by the latch circuits 21A, 21B remain "0", the output signal of the detection circuit (exclusive OR circuit) 23 remains "0". Therefore, the output signal of the NAND circuit NA1 remains "1", and the sense amplifier enable signal SAEN is supplied to the differential sense amplifier 11.

Thereafter, the refresh cycle is executed. That is, when a control signal DWL0 reaches "H", the "0" data is transferred to the node N1 from the node N3 of the latch circuit 21A, and the "1" data is transferred to the node bN1 from the node bN3 of the latch circuit 21A. Thereby, the state of the differential sense amplifier 11 changes in a direction in which the offset is minimized.

At this time, a control signal DWL1 is also set to "H". Therefore, the data of the node N3 of the latch circuit 21A is transferred to the node N3 of the latch circuit 21B, and the data of the node bN3 of the latch circuit 21A is transferred to the node bN3 of the latch circuit 21B. That is, the node N3 of the latch circuit 21B turns into "0", and the node bN3 of the latch circuit 21B turns into "1".

Subsequently, the offset check mode is executed again, and the data (offset information) is read out of the differential sense amplifier 11. At this time, as shown in FIG. 22, unless the offset is minimized, the data (offset information) read out into the node N1 from the differential sense amplifier 11 remains "1".

In this case, when the offset check signal OC0 turns into "H", the offset information (node N3="0", node bN3="1") is latched by the latch circuit 21A. Since both the data (values of the node N3) latched by the latch circuits 21A, 21B remain "0", the output signal of the detection circuit (exclusive OR circuit) 23 remains "0". Therefore, the output signal of the NAND circuit NA1 is "1", and the sense amplifier enable signal SAEN is supplied to the differential sense amplifier 11.

Thereafter, the refresh cycle is executed. That is, when the control signal DWL0 turns into "H", the "0" data is transferred to the node N1 from the node N3 of the latch circuit 21A, and the "1" data is transferred to the node bN1 from the node bN3 of the latch circuit 21A. Thereby, the state of the differential sense amplifier 11 changes in the direction in which the offset is minimized.

At this time, the control signal DWL1 is also set to "H". Therefore, the data of the node N3 of the latch circuit 21A is transferred to the node N3 of the latch circuit 21B, and the data of the node bN3 of the latch circuit 21A is transferred to the node bN3 of the latch circuit 21B. That is, the node N3 of the latch circuit 21B turns into "0", and the node bN3 of the latch circuit 21B turns into "1".

Subsequently, the offset check mode is executed again, and the data (offset information) is read out of the differential sense amplifier 11. At this time, as shown in FIG. 23, if the offset is minimized, the data (offset information) read out into the node N1 from the differential sense amplifier 11 turns into "0".

In this case, when the offset check signal OC0 turns into "H", the offset information (node N3="1", node bN3="0") is latched by the latch circuit 21A. The data (value of the node N3) latched by the latch circuit 21A turns into "1", and this is different from the data (value of the node N3) latched by the latch circuit 21B, that is, "0". Therefore, the output signal of the detection circuit (exclusive OR circuit) 23 changes to "1". Therefore, the output signal of the NAND circuit NA1 turns into "0", and the sense amplifier enable signal SAEN is not supplied to the differential sense amplifier 11.

As a result, the sense amplifier enable signal SAEN is not supplied to the differential sense amplifier 11, and the refresh cycle is not performed.

When the refresh cycle is not executed, the control signal DWL0 does not turn into "H", and the control signal DWL1 does not turn into "H".

Therefore, the data of the node N3 of the latch circuit 21A is latched as such by the latch circuit 21A, and is not transferred to the latch circuit 21B. That is, the node N3 of the latch circuit 21A continues to hold "1", and the node bN3 of the latch circuit 21A continues to hold "0". Moreover, the node N3 of the latch circuit 21B continues to hold "0", and the node bN3 of the latch circuit 21B continues to hold "1".

Therefore, even in the next offset check mode, the value of the data ("1" data) read out into the node N3 of the latch circuit 21A from the differential sense amplifier 11 is different from that of the data ("0" data) latched by the node N3 of the latch circuit 21B. Thereafter, the refresh cycle is not performed.

5. Conclusion

In the semiconductor integrated circuit according to the fourth embodiment of the present invention, in the refresh operation of the differential sense amplifier (operation of checking and minimizing the offset), when the different data is outputted from the differential sense amplifier in the offset check cycle, the refresh cycle is not subsequently performed with respect to the differential sense amplifier.

That is, the offsets of all the differential sense amplifiers are checked in the offset check cycle, and thereafter the refresh cycle is individually executed only with respect to the differential sense amplifier whose offset is not minimized. This can contribute to the reduction of power consumption.

[Fifth Embodiment]

1. Outline

In the present embodiment, for example, there is proposed a circuit for predicting the offset of the differential sense amplifier beforehand and performing the refresh operation based on the predicted result in the first to fourth embodiments.

2. Concrete Example

FIG. 24 shows the semiconductor integrated circuit according to a fifth embodiment of the present invention.

A latch circuit 21 is disposed for the differential sense amplifier. The latch circuit 21 latches the readout data amplified by the differential sense amplifier in the normal readout mode.

Additionally, as shown in FIG. 18, with the SRAM, one latch circuit is usually disposed for one differential sense amplifier. Therefore, when the latch circuit is used, it is unnecessary to newly dispose the latch circuit in the conventional semiconductor memory.

The readout data is constantly monitored by a counter 23A. The counter 23A increases a count value by 1, for example, when the readout data (value of a node N5) is "1". When the readout data (value of the node N5) is "0", the count value is decreased by 1.

That is, when the number of readouts of the "1" data is equal to the number of readouts of the "0" data in the normal readout mode, the count value of the counter 23A is 0. Moreover, when the number of readouts of the "1" data is larger than the number of readouts of the "0" data, the count value of the counter 23A is a plus value. When the number of readouts of the "0" data is larger than the number of readouts of the "1" data, the count value of the counter 23A is a minus value.

Moreover, an absolute value of the count value of the counter 23A is not less than a predetermined value (natural number of 1 or more), and then the offset of the differential sense amplifier is predicted to be large to such an extent that the value cannot be ignored. The refresh signal generation circuit 17 sets the value of the refresh signal to "H", and executes the refresh operation.

Additionally, for the refresh operation, the refresh operation according to the first to third embodiments may also be used, or the following refresh operation may also be performed instead.

That is, when the absolute value of the count value of the counter 23A is not less than the predetermined value, the above-described offset check cycle is not performed, and the refresh cycle is executed based on the count value of the counter 23A.

For example, when the count value of the counter is the plus value, the number of readouts of the "1" data is larger than the number of readouts of the "0" data. Therefore, the refresh cycle is executed such that the readout data (value of the node N5) is "0". Here, the counter 23A monitors the readout data (value of the node N5) even in the refresh cycle. Therefore, the refresh cycle is repeatedly performed, until the count value of the counter 23A turns into 0.

Moreover, when the count value of the counter is the minus value, the number of readouts of the "0" data is larger than the number of readouts of the "1" data. Therefore, the refresh cycle is executed such that the readout data (value of the node N5) is "1". Here, the counter 23A monitors the readout data (value of the node N5) even in the refresh cycle. Therefore, the refresh cycle is repeatedly performed, until the count value of the counter 23A turns into 0.

3. Conclusion

In the semiconductor integrated circuit according to the fifth embodiment of the present invention, the data inputted in the differential sense amplifier in the normal readout operation is constantly monitored by the counter, the number of inputs of the "1" data is compared with the number of inputs of the "0" data, and thereby the offset of the differential sense amplifier is predicted. Moreover, the refresh operation for minimizing the offset is performed based on the predicted result.

In this case, since the above-described offset check cycle to check the offset of the differential sense amplifier is unnecessary, time of the refresh operation can be reduced. For the semiconductor integrated circuit of the present embodiment, even with a short time in which the differential sense amplifier is not used in the normal operation, the refresh operation can sufficiently be performed. Therefore, the drop of the operation speed or the erroneous sense operation can sufficiently be prevented from being caused by the offset.

[Sixth Embodiment]

Figure 25:
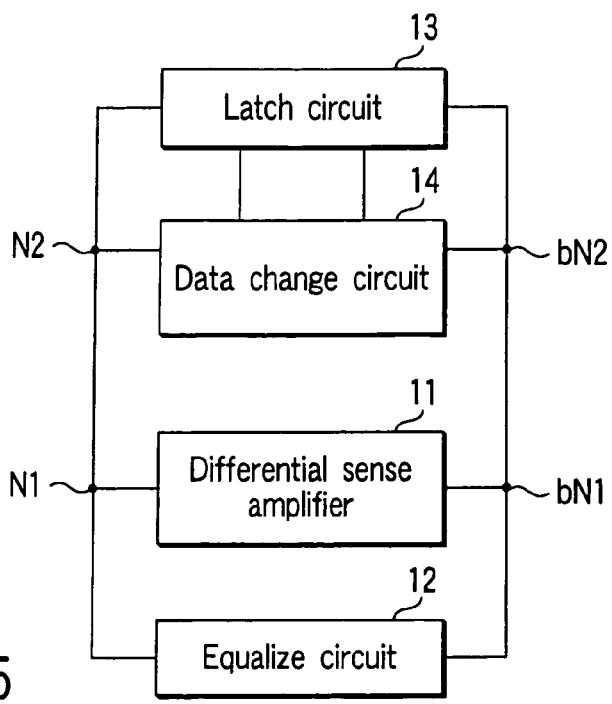
FIG. 25 is a diagram showing the outline of the semiconductor integrated circuit according to a sixth embodiment of the present invention.

FIG. 25 shows the semiconductor integrated circuit according to a sixth embodiment of the present invention.

The differential sense amplifier 11 is connected between the nodes N1, bN1. The differential sense amplifier includes a constitution, for example, shown in FIG. 1. Moreover, the equalize circuit 12 for equalizing the potentials of the nodes N1, bN1 is connected between the nodes N1, bN1.

On the other hand, the latch circuit 13 is connected between the nodes N2, bN2. The data change circuit 14 is connected between the node N2 and an inner node of the latch circuit 13, and also connected between the node bN2 and the inner node of the latch circuit 13.

Additionally, in the present example, the nodes N1 and N2 are short-circuited, and the nodes bN1 and bN2 are short-circuited.

That is, as compared with the semiconductor integrated circuit (FIG. 3) according to the first embodiment, the semiconductor integrated circuit of the present example is characterized in that the disconnection circuit for disconnecting or connecting the nodes N1 and N2, and the nodes bN1 and bN2 is not disposed.

The operation principle of the semiconductor integrated circuit of FIG. 25 will briefly be described.

It is assumed that the differential sense amplifier 11 has the offset.

First, the equalize circuit 12 equalizes the potentials of the nodes N1, N2. Thereafter, the differential sense amplifier 11 is operated. At this time, since the potential difference is not generated in two input nodes N1, N2 of the differential sense amplifier 11, the output data is determined depending only on the offset of the differential sense amplifier 11.

The output data (offset information) is latched by the latch circuit 13 via the data change circuit 14. Here, the data change circuit 14 has a function of allowing the latch circuit 13 to latch the data having the value reverse to the value of the output data.

Thereafter, the data latched by the latch circuit 13, that is, the data having the value reverse to the value of the output data outputted from the differential sense amplifier during the offset check is inputted into the differential sense amplifier.

As described above, in the present invention, the data acting in the direction in which the offset of the differential sense amplifier 11 is reduced is inputted into the differential sense amplifier 11, and the offset of the differential sense amplifier 11 is minimized.

2. Concrete Example

Figure 26:
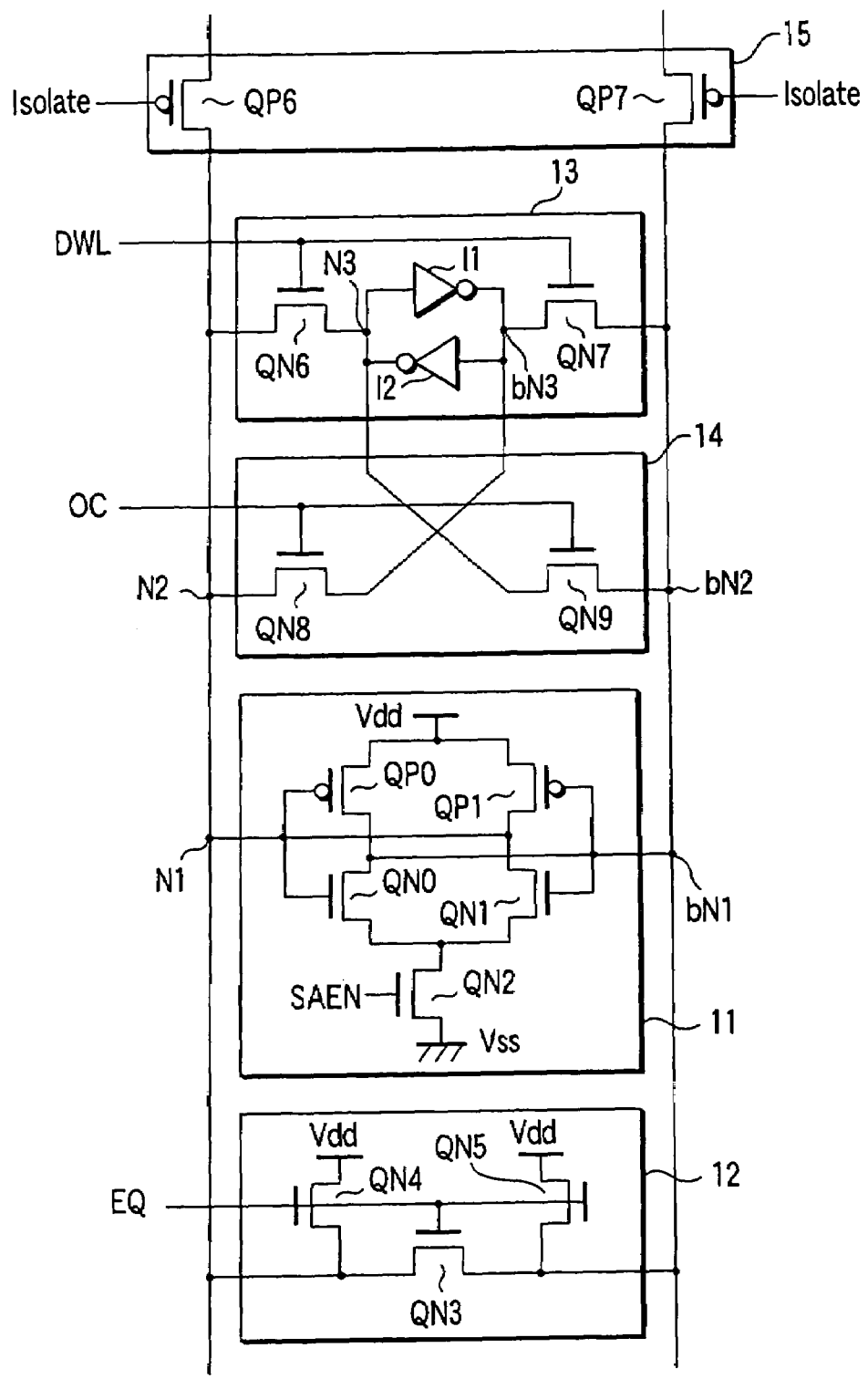
FIG. 26 is a diagram showing a concrete example of the semiconductor integrated circuit of FIG. 25.

FIG. 26 shows a concrete example of the semiconductor integrated circuit of FIG. 25.

The differential sense amplifier 11 is constituted of the P channel MOS transistors QP0, QP1 and N channel MOS transistors QN0, QN1, QN2.

The gates of the MOS transistors QP0, QN0 are connected to the node N1 and the drains of the MOS transistors QP1, QN1. The gates of the MOS transistors QP1, QN1 are connected to the node bN1 and the drains of the MOS transistors QP0, QN0.

The sources of the MOS transistors QP0, QP1 are connected to the inner power node Vdd, and the MOS transistor QN2 is connected between the sources of the MOS transistors QN0, QN1 and the ground point. The sense amplifier enable signal SAEN is inputted into the gate of the MOS transistor QN2.

The equalize circuit 12 is constituted of the N channel MOS transistors QN3, QN4, QN5. The MOS transistor QN3 is connected between the nodes N1 and bN1, the MOS transistor QN4 is connected between the inner power node Vdd and node N1, and the MOS transistor QN5 is connected between the inner power node Vdd and node bN1.

The equalize signal EQ is inputted into the gates of the MOS transistors QN3, QN4, QN5. When the equalize signal EQ turns into "H", both the nodes N1, bN1 are set to the inner power potential Vdd.

Additionally, in the present example, the equalize circuit 12 sets both the nodes N1, bN1 to the inner power potential Vdd. However, instead of this, for example, the equalize circuit 12 may be modified so as to set the nodes N1, bN1 to Vdd/2. In this case, the differential sense amplifier 11 is also modified, for example, as shown in FIG. 5.

Figure 28:
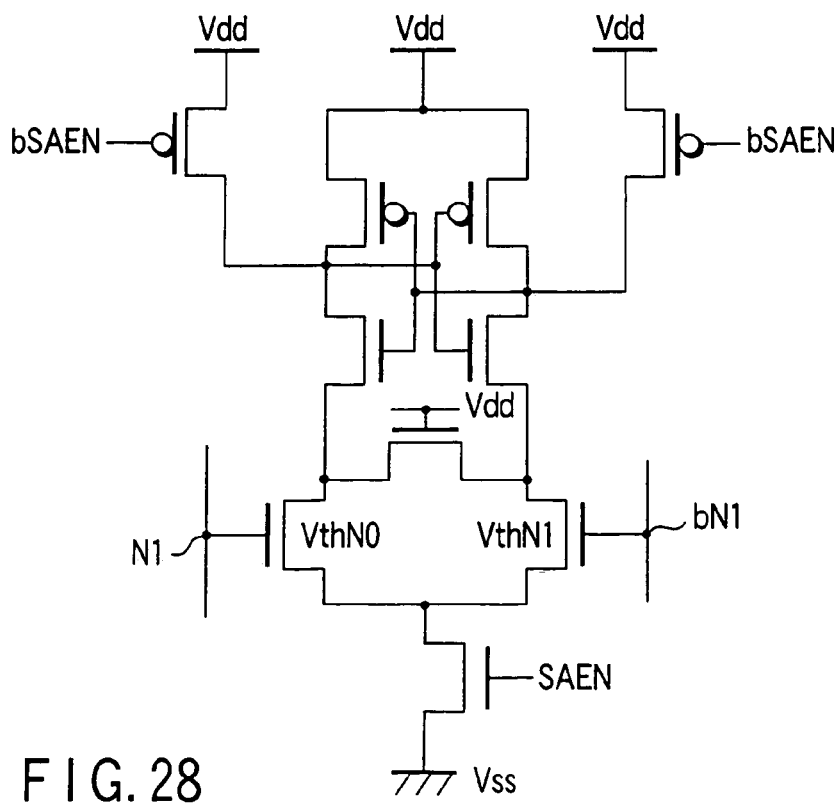
FIG. 28 is a diagram showing an example of the differential sense amplifier.

Moreover, the present invention is not limited to the present embodiment, and the sense amplifier may have a constitution, for example, shown in FIG. 28 in all the above-described embodiments and all embodiments described later.

The latch circuit 13 is constituted of two flip-flop connected inverters I1, I2 connected between the nodes N3, bN3, the N channel MOS transistor (transfer gate) QN6 connected between nodes N2 and N3, and the N channel MOS transistor (transfer gate) QN7 connected between the nodes bN2 and bN3.

When the control signal DWL indicates "H", the nodes N2 and N3 are short-circuited, and the nodes bN2 and bN3 are short-circuited.

Additionally, the latch circuit 13 can be constituted, for example, in the same manner as the memory cell. When the memory cell is the static memory cell, as in the present example, the latch circuit 13 can have the same constitution (dummy cell) as the static memory cell. In this case, the control signal DWL is supplied to the gates of the MOS transistors QN6, QN7 from the dummy word line.

The data change circuit 14 is constituted of the MOS transistor QN8 connected between the node N2 and the inner node bN3 of the latch circuit 13, and the MOS transistor QN9 connected between the node bN2 and the inner node N3 of the latch circuit 13.

When the offset check signal OC indicates "H", the MOS transistors QN8, QN9 are turned on, the node N2 and the inner node bN3 of the latch circuit 13 are electrically connected, and the nodes bN2 and the inner node N3 of the latch circuit 13 are electrically connected.

The disconnection circuit 15 is disposed, for example, between the latch circuit 13 and the memory cell array, and is disposed to electrically disconnect the nodes N2, bN2 and bit line pair, and to reduce a parasitic capacity generated in the nodes N2, bN2.

3. Operation

The operation of the semiconductor integrated circuit of FIG. 26 will be described.

In the normal readout mode, the data of the memory cell is read out as the potential difference of the pair of bit lines BL1, bBL1, and the potential difference is sensed and amplified by the differential sense amplifier 11.

Here, with the SOI device, unless the number of readouts of the "1" data is equal to the number of readouts of the "0" data with respect to the same differential sense amplifier 11 (e.g., when only the same data is continuously read out), the substrate potential of the MOS transistor having a large number of operations fluctuates, and the offset (dispersion of the threshold value of the MOS transistor) is generated in the differential sense amplifier 11.

To minimize the offset, according to the present invention, in the mode other than the normal readout mode, the following operation is continuously or intermittently performed until the offset is eliminated or sufficiently reduced.

Figure 29:
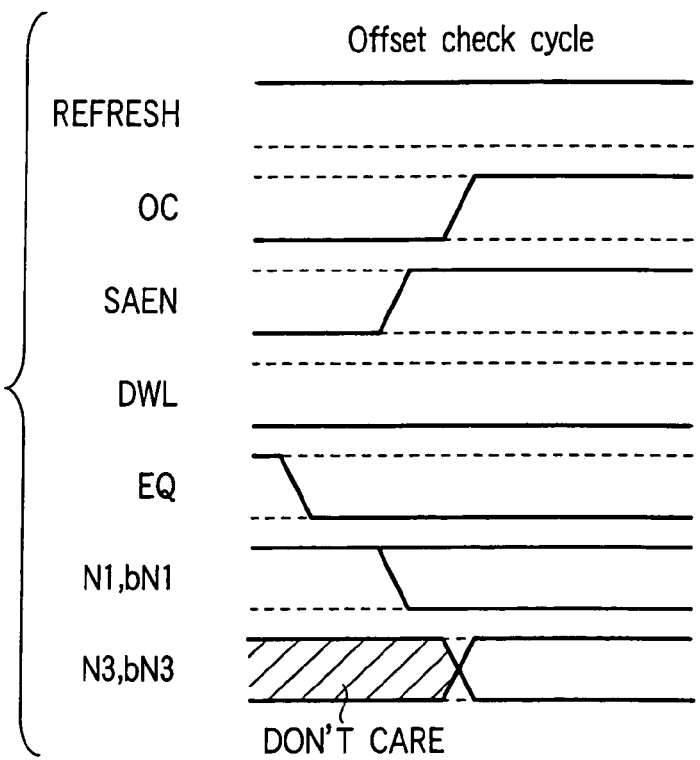
FIG. 29 is a diagram showing the operation of the semiconductor integrated circuit of FIG. 26.

(1) Offset Check Cycle (see FIG. 29)

The offset of the differential sense amplifier 11 is checked in this cycle.

First, it is checked whether the differential sense amplifier 11 is used in the normal operation mode. Subsequently, it is confirmed that the differential sense amplifier 11 is not used, and the refresh signal REFRESH is then set to "H". A control signal Isolate constantly indicates "H", and the MOS transistors QP6, QP7 are always in the off state.

After the equalize signal EQ is set to "H", and the nodes N1, bN1 are set to the inner power potential Vdd, the equalize signal EQ is set to "L".

Thereafter, the sense amplifier enable signal SAEN is set to "H", and simultaneously or a little later the offset check signal OC is set to "H".

When the sense amplifier enable signal SAEN reaches "H", the differential sense amplifier 11 is brought into the operative state. Since the potential difference is not generated in the input nodes N1, bN1 of the differential sense amplifier 11, the output data of the differential sense amplifier 11 is determined only by the offset of the differential sense amplifier 11.

That is, one of the nodes N1, bN1 is brought into the "1" state (=Vdd), and the other node is into the "0" state (=Vss) in accordance with the offset of the differential sense amplifier 11.

Moreover, when the offset check signal OC reaches "H", the node N2 and the inner node bN3 of the latch circuit 13 are electrically connected, and the nodes bN2 and the inner node bN3 of the latch circuit 13 are electrically connected.

Therefore, the data outputted to the node N1 is transferred to the inner node bN3 of the latch circuit. 13 via the node N2, and the data outputted to the node bN1 is transferred to the inner node N3 of the latch circuit 13 via the node bN2.

For example, it is supposed that "1" is read out into the node N1 and "0" is read out into the node bN1 with the high frequency in the normal readout mode.

In this case, the threshold voltage of the MOS transistor QN0 in the differential sense amplifier 11 is lower than usual, and the threshold voltage of the MOS transistor QP1 in the differential sense amplifier 11 is higher than usual. Therefore, when the inner power potential Vdd is given to the nodes N1, bN1 in the offset check cycle, the potential of the node bN1 drops, "1" is outputted to the node N1, and "0" is outputted to the node bN1.

Moreover, the "1" data of the node N1 is transferred to the inner node bN3 of the latch circuit 13 via the data change circuit 14, and the "0" data of the node bN1 is transferred to the inner node N3 of the latch circuit 13 via the data change circuit 14. Therefore, the node N3 of the latch circuit 13 turns into the "0" state, and the node bN3 turns into the "1" state.

Figure 30:
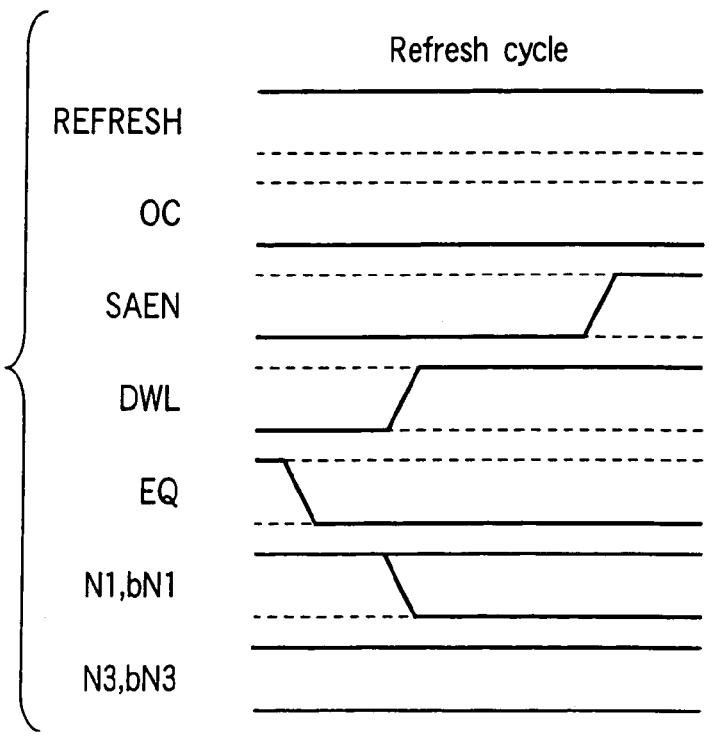
FIG. 30 is a diagram showing the operation of the semiconductor integrated circuit of FIG. 26.

(2) Refresh Cycle (see FIG. 30)

The offset of the differential sense amplifier 11 is minimized in this cycle.

First, it is checked whether the differential sense amplifier 11 is used in the normal operation mode, it is confirmed that the differential sense amplifier 11 is not used, and the refresh signal REFRESH is set to "H". The control signal Isolate always indicates "H", and the MOS transistors QP6, QP7 are always in the off state.

After the equalize signal EQ is set to "H", and the nodes N1, bN1 are set to the inner power potential Vdd, the equalize signal EQ is set to "L".

Thereafter, when the control signal DWL is set to "H", the data latched by the latch circuit 13 is transferred to the input node of the differential sense amplifier 11.

For example, when the node N3 of the latch circuit 13 is in the "0" state, and the node bN3 is in the "1" state, the "0" data is outputted to the node N1, and the "1" data is outputted to the node bN1.

Thereafter, the sense amplifier enable signal SAEN is set to "H". When the sense amplifier enable signal SAEN reaches "H", the differential sense amplifier 11 is brought into the operative state. Since the data of the latch circuit 13 is outputted to the input nodes N1, bN1 of the differential sense amplifier 11, the output data of the differential sense amplifier 11 is determined by the data of the latch circuit 13.

Here, the data latched by the latch circuit 13 is reverse to the data outputted from the differential sense amplifier 11 in the offset check cycle. In other words, in the refresh cycle, the data reverse to the data inputted into the differential sense amplifier 11 with the high frequency in the normal readout mode is inputted into the differential sense amplifier 11.

Therefore, in the refresh cycle, the MOS transistor different from the MOS transistor turned on by the data inputted in the normal readout mode with the high frequency is turned on, and the threshold voltage of the MOS transistor fluctuates in the direction in which the offset of the differential sense amplifier 11 is reduced.

For example, in the normal readout mode, when the "1" data is read out into the node N1 and the "0" data is read out into the node bN1 with the high frequency, the node N3 of the latch circuit 13 turns into the "0" state and the node bN3 turns into the "1" state in the offset check cycle. Therefore, in the refresh cycle, the "0" data is inputted into the input node N1 of the differential sense amplifier 11, and the "1" data is inputted into the input node bN1.

In this case, since the MOS transistors QP0, QN1 in the differential sense amplifier 11 are brought into the on state, the threshold voltage of the N channel MOS transistor QN1 drops, and the threshold voltage of the P channel MOS transistor QP1 rises. That is, the threshold voltage of the MOS transistor QN1 fluctuates in the direction in which the threshold voltage becomes equal to the threshold voltage of the MOS transistor QN0 in the state lower than usual. The threshold voltage of the MOS transistor QP0 fluctuates in the direction in which the threshold voltage becomes equal to the threshold voltage of the MOS transistor QP1 in a state higher than usual.

In this manner, since the data reverse to the data inputted into the differential sense amplifier 11 in the normal readout node with the high frequency is inputted into the differential sense amplifier 11 in the refresh cycle, the offset of the differential sense amplifier 11 is minimized.

4. Modification Example

Figure 27:
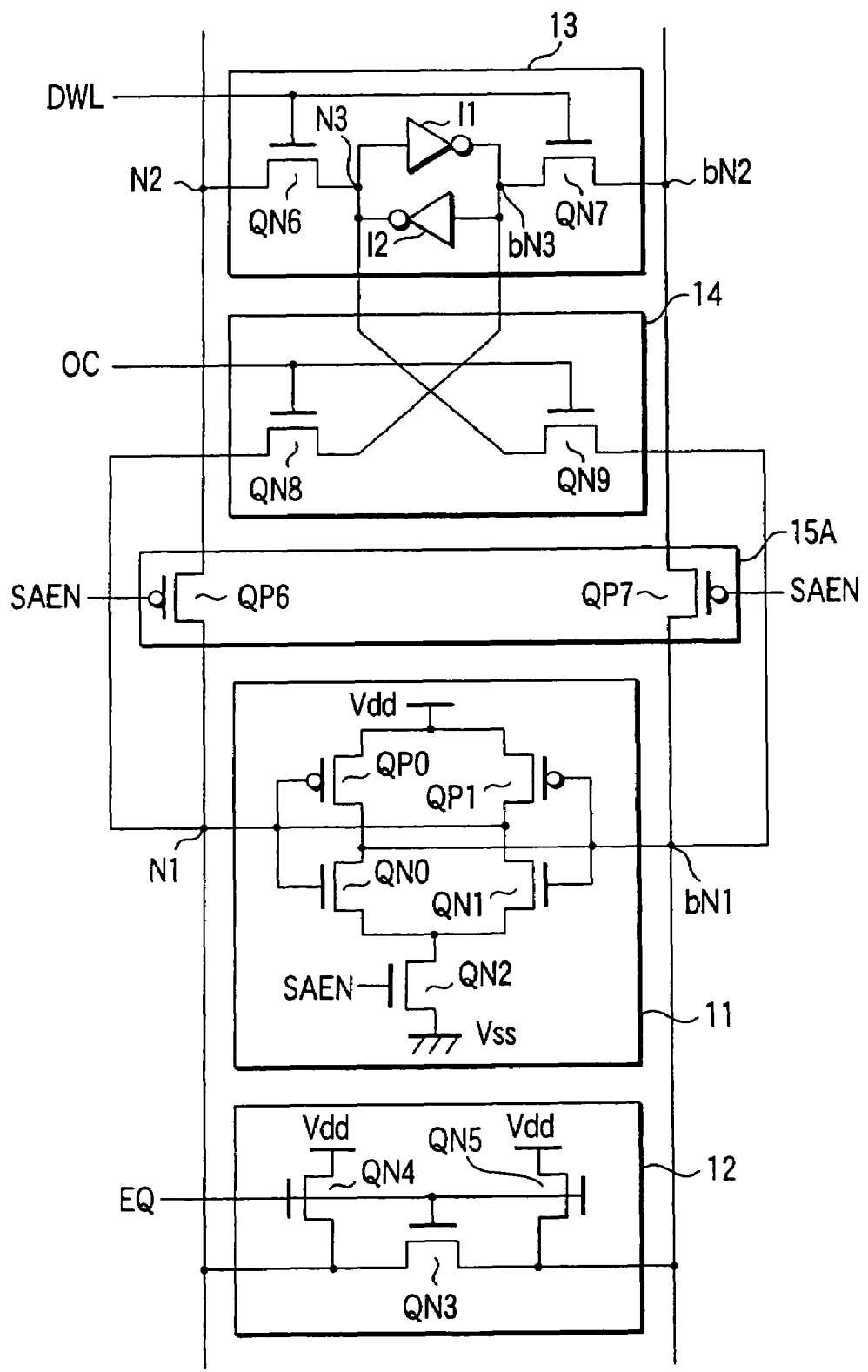
FIG. 27 is a diagram showing a modification example of the semiconductor integrated circuit of FIG. 26.

FIG. 27 shows a modification example of the semiconductor integrated circuit of FIG. 26.

As compared with the semiconductor integrated circuit of FIG. 26, the semiconductor integrated circuit of the present example is characterized in that a disconnection circuit 15A is connected between the nodes N1 and N2, and between the nodes bN1 and bN2.

In this case, the MOS transistor QN8 in the data change circuit 14 is connected between the node N1 and the inner node bN3 of the latch circuit 13, and the MOS transistor QN9 in the data change circuit 14 is connected between the node bN1 and the inner node N3 of the latch circuit 13.

Additionally, since the operation is the same as the operation of the semiconductor integrated circuit of FIG. 26 (see FIGS. 29 and 30), the description thereof is omitted.

5. Conclusion

In the semiconductor integrated circuit according to the sixth embodiment of the present invention, the offset resulting from the process dispersion or the operation frequency of the SOI device (dispersion of the threshold voltage of the MOS transistor) is minimized by the circuit operational technique, and the drop of the operation speed and the erroneous sense operation can be prevented from being caused by the offset.

[Seventh Embodiment]

1. Outline

Figure 31:
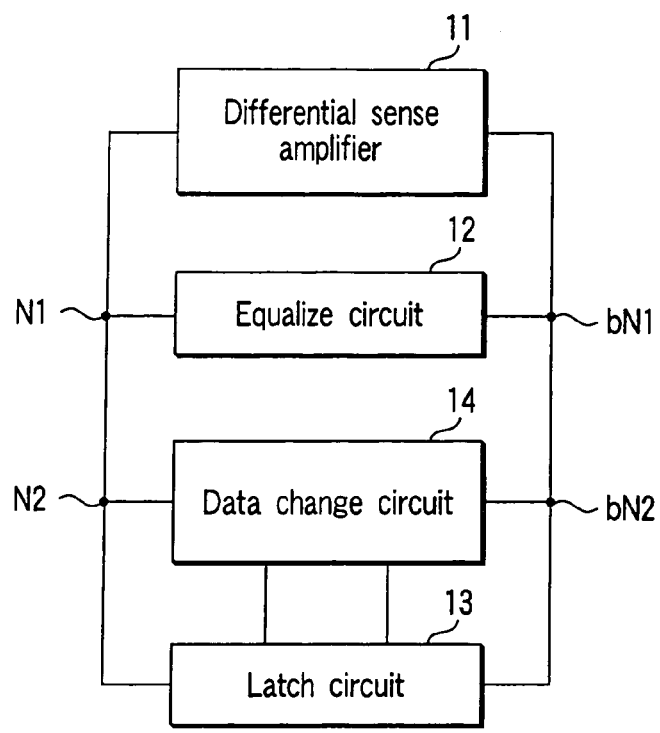
FIG. 31 is a diagram showing the outline of the semiconductor integrated circuit according to a seventh embodiment of the present invention.

FIG. 31 shows the semiconductor integrated circuit according to a seventh embodiment of the present invention.

The differential sense amplifier 11 is connected between the nodes N1, bN1. The differential sense amplifier includes the constitution, for example, shown in FIG. 1. Moreover, the equalize circuit 12 for equalizing the potentials of the nodes N1, bN1 is connected between the nodes N1, bN1.

On the other hand, the latch circuit 13 is connected between the nodes N2, bN2. The data change circuit 14 is connected between the node N2 and the inner node of the latch circuit 13, and also connected between the node bN2 and the inner node of the latch circuit 13.

Additionally, in the present example, the nodes N1 and N2 are short-circuited, and the nodes bN1 and bN2 are short-circuited.

That is, as compared with the semiconductor integrated circuit (FIG. 12) according to the second embodiment, the semiconductor integrated circuit of the present example is characterized in that the disconnection circuit for disconnecting or connecting the nodes N1 and N2, and the nodes bN1 and bN2 is not disposed.

The operation principle of the semiconductor integrated circuit of FIG. 31 will briefly be described.

It is assumed that the differential sense amplifier 11 has the offset.

First, the equalize circuit 12 equalizes the potentials of the nodes N1, N2. Thereafter, the differential sense amplifier 11 is operated. At this time, since the potential difference is not generated in two input nodes N1, N2 of the differential sense amplifier 11, the output data is determined depending only on the offset of the differential sense amplifier 11.

The output data (offset information) is latched by the latch circuit 13 via the data change circuit 14. Here, the data change circuit 14 has a function of allowing the latch circuit 13 to latch the data having the value reverse to the value of the output data.

Thereafter, the data latched by the latch circuit 13, that is, the data having the value reverse to the value of the output data outputted from the differential sense amplifier during the offset check is inputted into the differential sense amplifier.

As described above, in the present invention, the data acting in the direction in which the offset of the differential sense amplifier 11 is reduced is inputted into the differential sense amplifier 11, and the offset of the differential sense amplifier 11 is minimized.

2. Concrete Example

Figure 32:
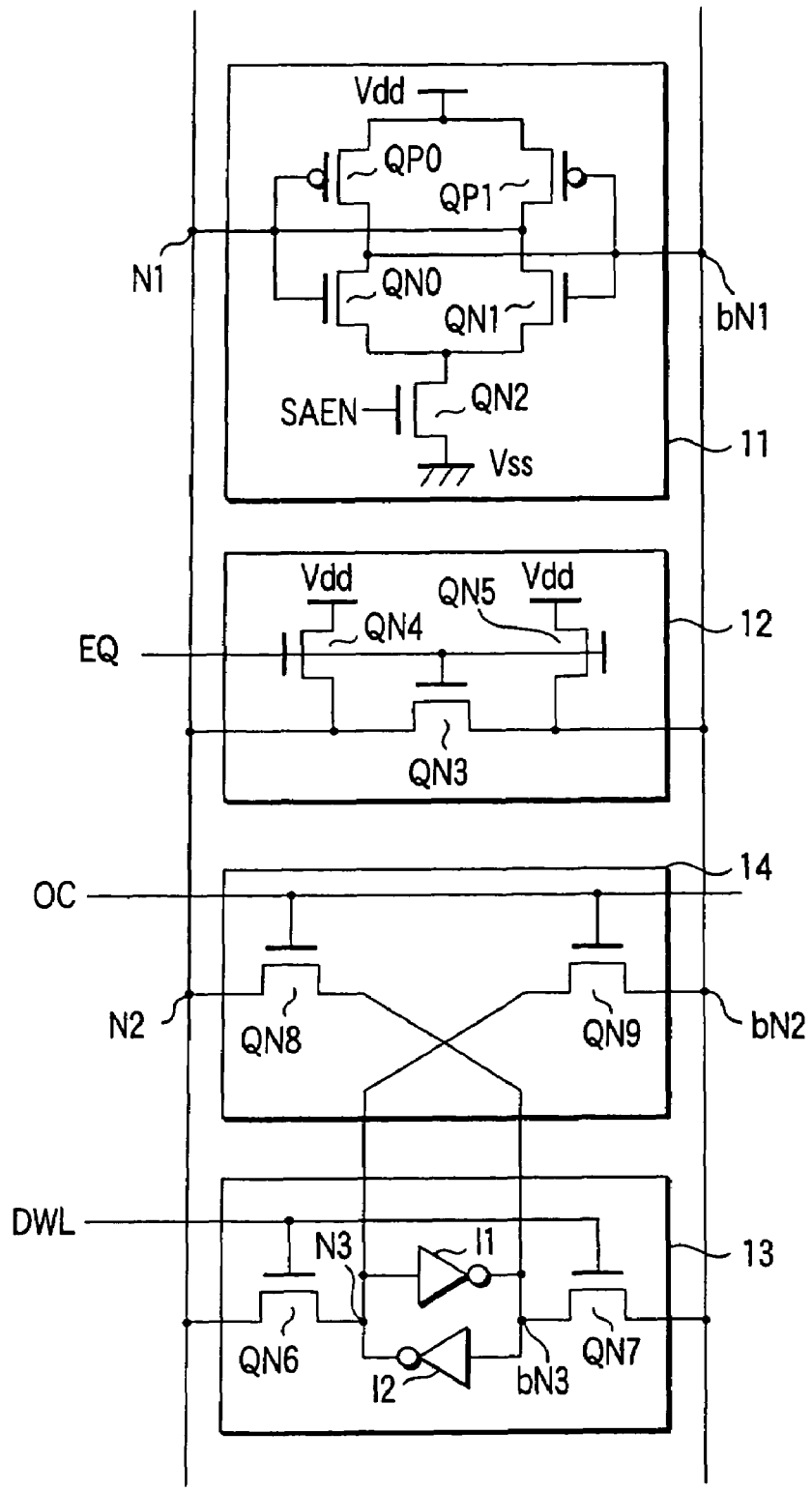
FIG. 32 is a diagram showing a concrete example of the semiconductor integrated circuit of FIG. 31.

FIG. 32 shows a concrete example of the semiconductor integrated circuit of FIG. 31.

The differential sense amplifier 11 is constituted of the P channel MOS transistors QP0, QP1 and N channel MOS transistors QN0, QN1, QN2.

The gates of the MOS transistors QP0, QN0 are connected to the node N1 and the drains of the MOS transistors QP1, QN1. The gates of the MOS transistors QP1, QN1 are connected to the node bN1 and the drains of the MOS transistors QP0, QN0.

The sources of the MOS transistors QP0, QP1 are connected to the inner power node Vdd, and the MOS transistor QN2 is connected between the sources of the MOS transistors QN0, QN1 and the ground point. The sense amplifier enable signal SAEN is inputted into the gate of the MOS transistor QN2.

The equalize circuit 12 is constituted of the N channel MOS transistors QN3, QN4, QN5. The MOS transistor QN3 is connected between the nodes N1 and bN1, the MOS transistor QN4 is connected between the inner power node Vdd and node N1, and the MOS transistor QN5 is connected between the inner power node Vdd and node bN1.

The equalize signal EQ is inputted into the gates of the MOS transistors QN3, QN4, QN5. When the equalize signal EQ turns into "H", both the nodes N1, bN1 are set to the inner power potential Vdd.

Additionally, in the present example, the equalize circuit 12 sets both the nodes N1, bN1 to the inner power potential Vdd. However, instead of this, for example, the equalize circuit 12 may be modified so as to set the nodes N1, bN1 to Vdd/2. In this case, the differential sense amplifier 11 is also modified, for example, as shown in FIG. 5.

Moreover, the present invention is not limited to the present embodiment, and the sense amplifier may have the constitution, for example, shown in FIG. 28 in all the above-described embodiments and all the embodiments described later.

The latch circuit 13 is constituted of two flip-flop connected inverters I1, I2 connected between the nodes N3, bN3, the N channel MOS transistor (transfer gate) QN6 connected between nodes N2 and N3, and the N channel MOS transistor (transfer gate) QN7 connected between the nodes bN2 and bN3.

When the control signal DWL indicates "H", the nodes N2 and N3 are short-circuited, and the nodes bN2 and bN3 are short-circuited.

Additionally, the latch circuit 13 can be constituted, for example, in the same manner as the memory cell. When the memory cell is the static memory cell, as in the present example, the latch circuit 13 can have the same constitution (dummy cell) as the static memory cell. In this case, the control signal DWL is supplied to the gates of the MOS transistors QN6, QN7 from the dummy word line.

The data change circuit 14 is constituted of the MOS transistor QN8 connected between the node N2 and the inner node bN3 of the latch circuit 13, and the MOS transistor QN9 connected between the node bN2 and the inner node N3 of the latch circuit 13.

When the offset check signal OC indicates "H", the MOS transistors QN8, QN9 are turned on, the node N2 and the inner node bN3 of the latch circuit 13 are electrically connected, and the nodes bN2 and the inner node N3 of the latch circuit 13 are electrically connected.

The disconnection circuit 15 is disposed, for example, between the latch circuit 13 and the memory cell array, and is disposed to electrically disconnect the nodes N2, bN2 and bit line pair, and to reduce the parasitic capacity generated in the nodes N2, bN2.

Additionally, since the operation of the semiconductor integrated circuit according to the present embodiment is the same as that of the semiconductor integrated circuit according to the sixth embodiment, the description thereof is omitted.

4. Conclusion

In the semiconductor integrated circuit according to the seventh embodiment of the present invention, the offset resulting from the process dispersion or the operation frequency of the SOI device (dispersion of the threshold voltage of the MOS transistor) is minimized by the circuit operational technique, and the drop of the operation speed and the erroneous sense operation can be prevented from being caused by the offset.

[Eighth Embodiment]

1. Outline

In the semiconductor integrated circuits according to the first, second, third, sixth, and seventh embodiments, the operation of minimizing the offset of the sense amplifier is performed for each sense amplifier. That is, the offset check is performed for each sense amplifier, and the refresh is performed to minimize the offset based on the offset check result. Moreover, the offset check and refresh are always performed for each sense amplifier during the refresh operation (when the refresh signal REFRESH indicates "H").

Moreover, in the semiconductor integrated circuit according to the fourth embodiment, it is detected for each sense amplifier whether or not the offset is minimized. For the sense amplifier whose offset is minimized, the refresh is not subsequently performed, and the power consumption is reduced. Furthermore, in the semiconductor integrated circuit according to the fifth embodiment, the offset check is not performed, the readout data inputted into the sense amplifier is always monitored by the counter during the normal operation, the state of the sense amplifier (offset information) is predicted based on the monitor result, and the refresh is performed.

On the other hand, in the present embodiment, the offset check and refresh are performed for each sense amplifier in the same manner as in the semiconductor integrated circuits according to the first, second, third, sixth, and seventh embodiments.

Additionally, when a predetermined condition is satisfied in the present embodiment, the offset check and refresh are forcibly ended with respect to all the sense amplifiers, For the predetermined condition, the offset of the sense amplifier whose offset resulting from a history effect (dispersion of the threshold voltage) is maximized is minimized. Here, a case in which the offset resulting from the history effect is maximized is a case in which the same data is inputted into the sense amplifier.

To solve the problem, according to the present embodiment, there are proposed: a circuit which maximizes the offset of the sense amplifier resulting from the history effect (circuit which produces a worst condition); a circuit to detect whether or not the offset of the sense amplifier is minimized; and a circuit to forcibly end the offset check and refresh with respect to all the sense amplifiers, when the offset of the sense amplifier is minimized.

2. Concrete Example

Figure 33:
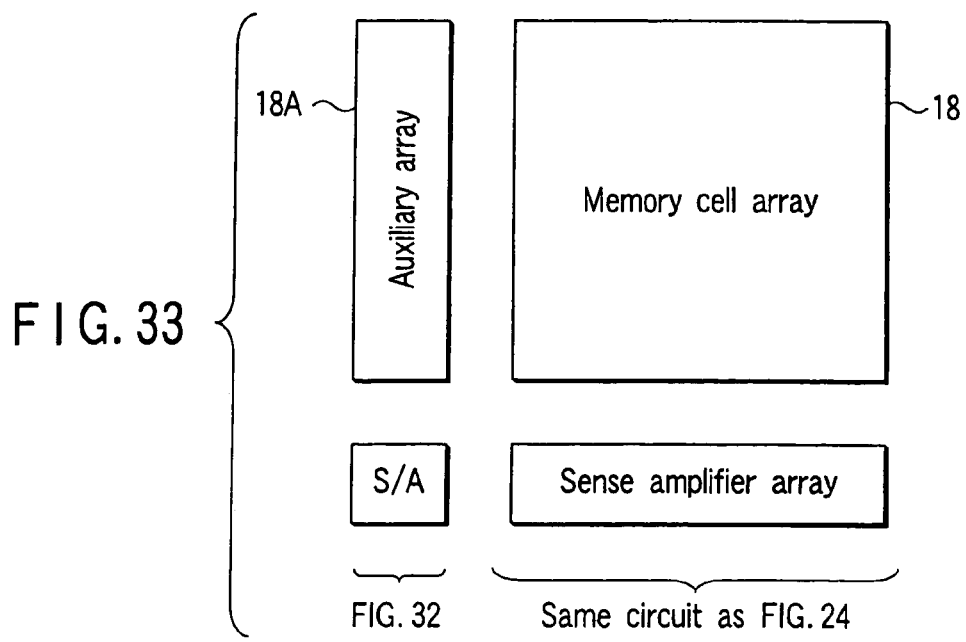
FIG. 33 is a diagram showing the outline of the semiconductor integrated circuit according to an eighth embodiment of the present invention.
Figure 34:
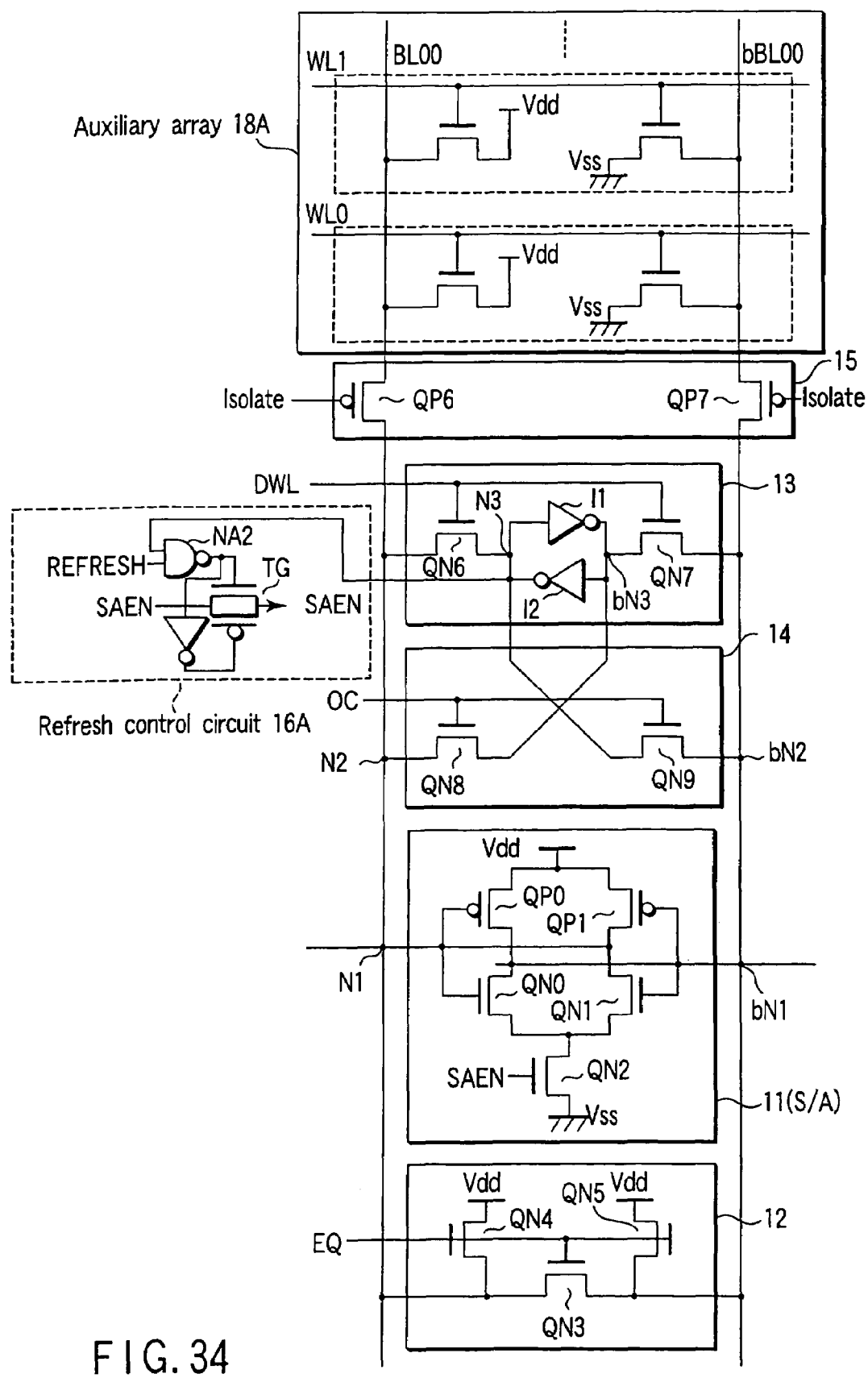
FIG. 34 is a diagram showing a concrete example of the semiconductor integrated circuit of FIG. 33.

FIG. 33 shows a first example of the semiconductor integrated circuit according to an eighth embodiment of the present invention. FIG. 34 shows a circuit constitution of an auxiliary array and corresponding sense amplifier of FIG. 33 in detail.

An auxiliary array 18A is disposed adjacent to the memory cell array 18. The auxiliary array is constituted of a plurality of cells (N channel MOS transistors) connected to one pair of bit lines BL00, bBL00.

The other end of the MOS transistor whose one end is connected to the bit line BL00 is connected to a power terminal Vdd. The other end of the MOS transistor whose one end is connected to the bit line bBL00 is connected to a ground point Vss. The gates of the respective MOS transistors are connected to word lines WL0, WL1, . . . similarly as the memory cells in the memory cell array 18. This realizes the circuit which maximizes the offset of the sense amplifier resulting from the history effect (circuit which produces the worst condition).

Additionally, the auxiliary array 18A may be disposed in the memory cell array 18.

The differential sense amplifier 11 is constituted of the P channel MOS transistors QP0, QP1 and N channel MOS transistors QN0, QN1, QN2.

The gates of the MOS transistors QP0, QN0 are connected to the node N1 and drains of the MOS transistors QP1, QN1. The gates of the MOS transistors QP1, QN1 are connected to the node bN1 and drains of the MOS transistors QP0, QN0.

The sources of the MOS transistors QP0, QP1 are connected to the inner power node Vdd, and the MOS transistor QN2 is connected between the sources of the MOS transistors QN0, QN1 and the ground point. The sense amplifier enable signal SAEN is inputted into the gate of the MOS transistor QN2.

The equalize circuit 12 is constituted of the N channel MOS transistors QN3, QN4, QN5. The MOS transistor QN3 is connected between the nodes N1 and bN1, the MOS transistor QN4 is connected between the inner power node Vdd and node N1, and the MOS transistor QN5 is connected between the inner power node Vdd and node bN1.

The equalize signal EQ is inputted into the gates of the MOS transistors QN3, QN4, QN5. When the equalize signal EQ reaches "H", both the nodes N1 and bN1 are set to the inner power potential Vdd.

The latch circuit 13 is constituted of two flip-flop connected inverters 11, 12 connected between the nodes N3, bN3, the N channel MOS transistor (transfer gate) QN6 connected between the nodes N2 and N3, and the N channel MOS transistor (transfer gate) QN7 connected between the nodes bN2 and bN3.

When the control signal DWL indicates "H", the nodes N2 and N3 are short-circuited, and the nodes bN2 and bN3 are short-circuited.

The data change circuit 14 is constituted of the MOS transistor QN8 connected between the node N2 and the inner node bN3 of the latch circuit 13, and the MOS transistor QN9 connected between the node bN2 and the inner node N3 of the latch circuit 13.

When the offset check signal OC indicates "H", the MOS transistors QN8, QN9 are turned on, the node N2 and the inner node bN3 of the latch circuit 13 are electrically connected, and the nodes bN2 and the inner node N3 of the latch circuit 13 are electrically connected.

The disconnection circuit 15 is disposed, for example, between the latch circuit 13 and the auxiliary array 18A, and is disposed to electrically disconnect the nodes N2, bN2 and bit line pair BL00, bBL00, and to reduce the parasitic capacity generated in the nodes N2, bN2.

In the differential sense amplifier 11 corresponding to the auxiliary array 18A, during the normal readout operation, the data "1" is always transferred to the node N1, and the data "0" is transferred to the node bN1.

Therefore, for example, the threshold voltage of the N channel MOS transistor QN0 in the differential sense amplifier 11 is considered to be lower than the threshold voltage of the N channel MOS transistor QN1 (have the offset).

That is, in the offset check, the "1" data is outputted to the node N1, and the "0" data is outputted to the node bN1. Moreover, the "0" data is latched in the inner node N3 of the latch circuit 13, and the "1" data is latched in the inner node bN3 of the latch circuit 13.

To detect whether or not the offset is minimized with respect to the sense amplifier whose offset is maximized, the state (level) of at least one of the inner nodes N3, bN3 of the latch circuit 13 may be monitored.

In the present embodiment, the data of the inner node N3 of the latch circuit 13 is monitored. When the offset is not minimized, the data of the inner node N3 of the latch circuit 13 remains "0". On the other hand, when the offset is minimized, the data of the inner node N3 of the latch circuit 13 changes to "1".

A potential change of the inner node N3 of the latch circuit 13 is detected by a refresh control circuit 16A.

For example, the data of the inner node N3 of the latch circuit 13 and the refresh signal REFRESH are inputted into a NAND circuit NA2. During the refresh operation, the data of the inner node N3 is usually "0", and the refresh signal REFRESH is "1". Therefore, the output signal of the NAND circuit NA2 is "1", and the sense amplifier enable signal SAEN is supplied to all the differential sense amplifiers 11.

When the offset is minimized, and the data of the inner node N3 of the latch circuit 13 changes to "1", two input data of the NAND circuit NA2 are both "1", and therefore the output data of the NAND circuit NA2 is "0". Therefore, a transfer gate TG closes, and the sense amplifier enable signal SAEN is not supplied to all the differential sense amplifiers 11.

As a result, the offset check and refresh are forced to end with respect to all the sense amplifiers.

Figure 35:
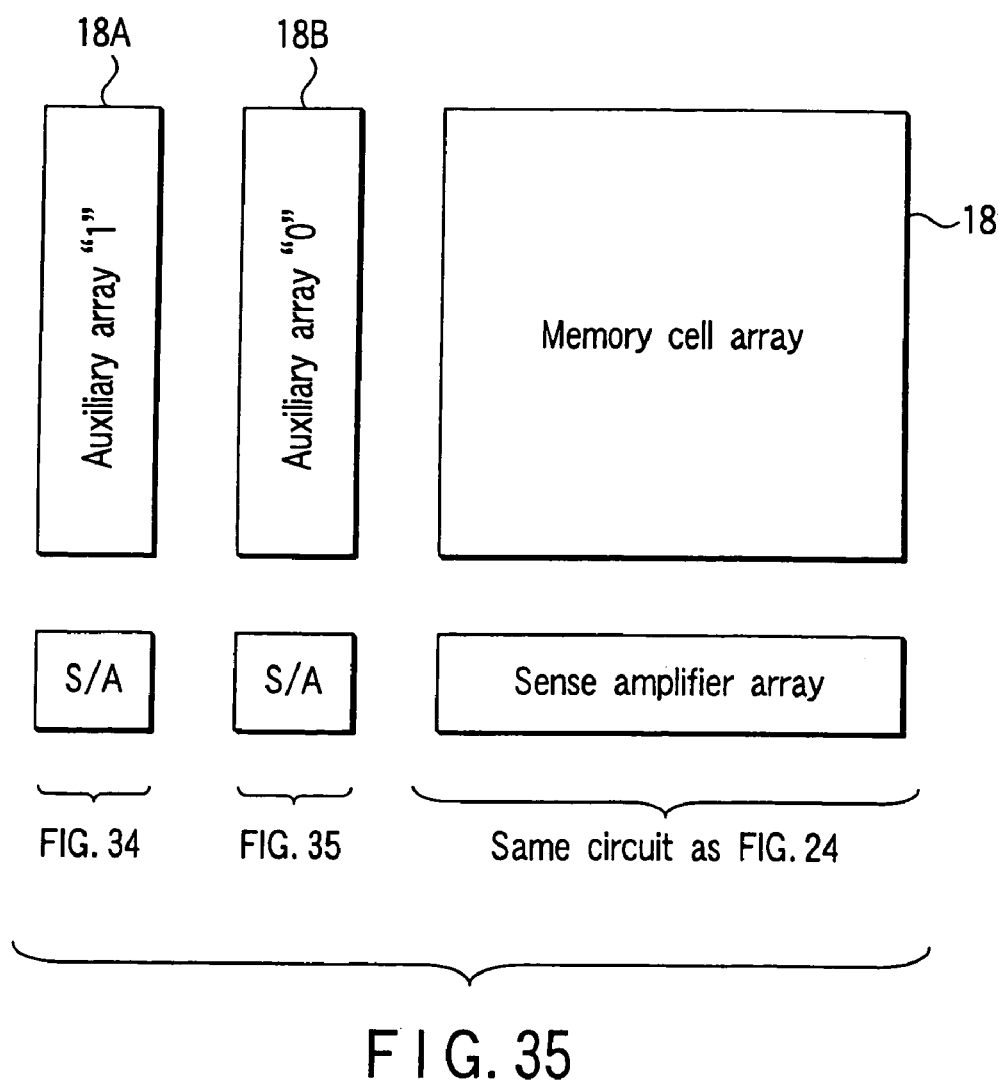
FIG. 35 is a diagram showing the outline of the semiconductor integrated circuit according to the eighth embodiment of the present invention.
Figure 36:
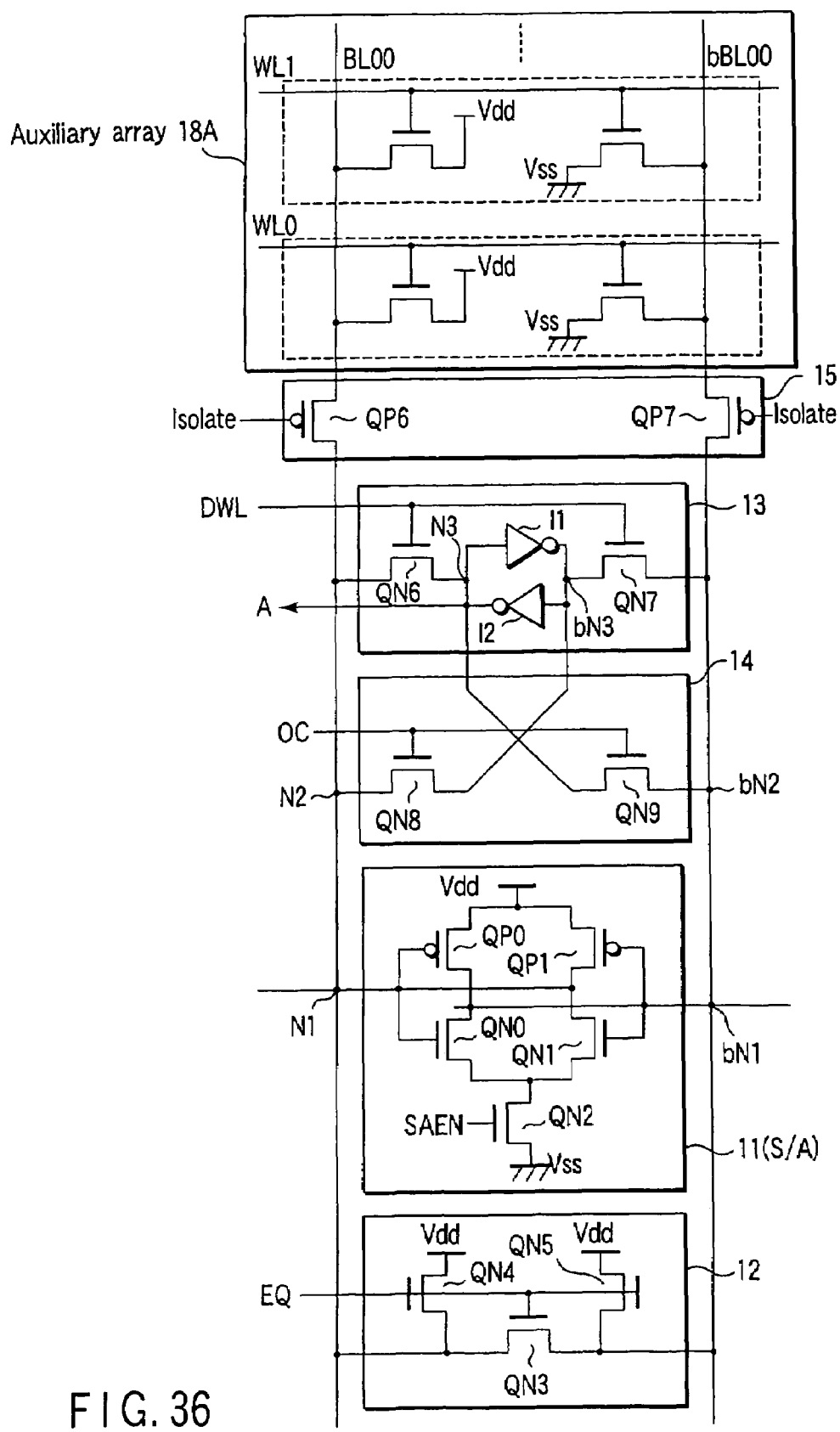
FIG. 36 is a diagram showing a concrete example of the semiconductor integrated circuit of FIG. 35.
Figure 37:
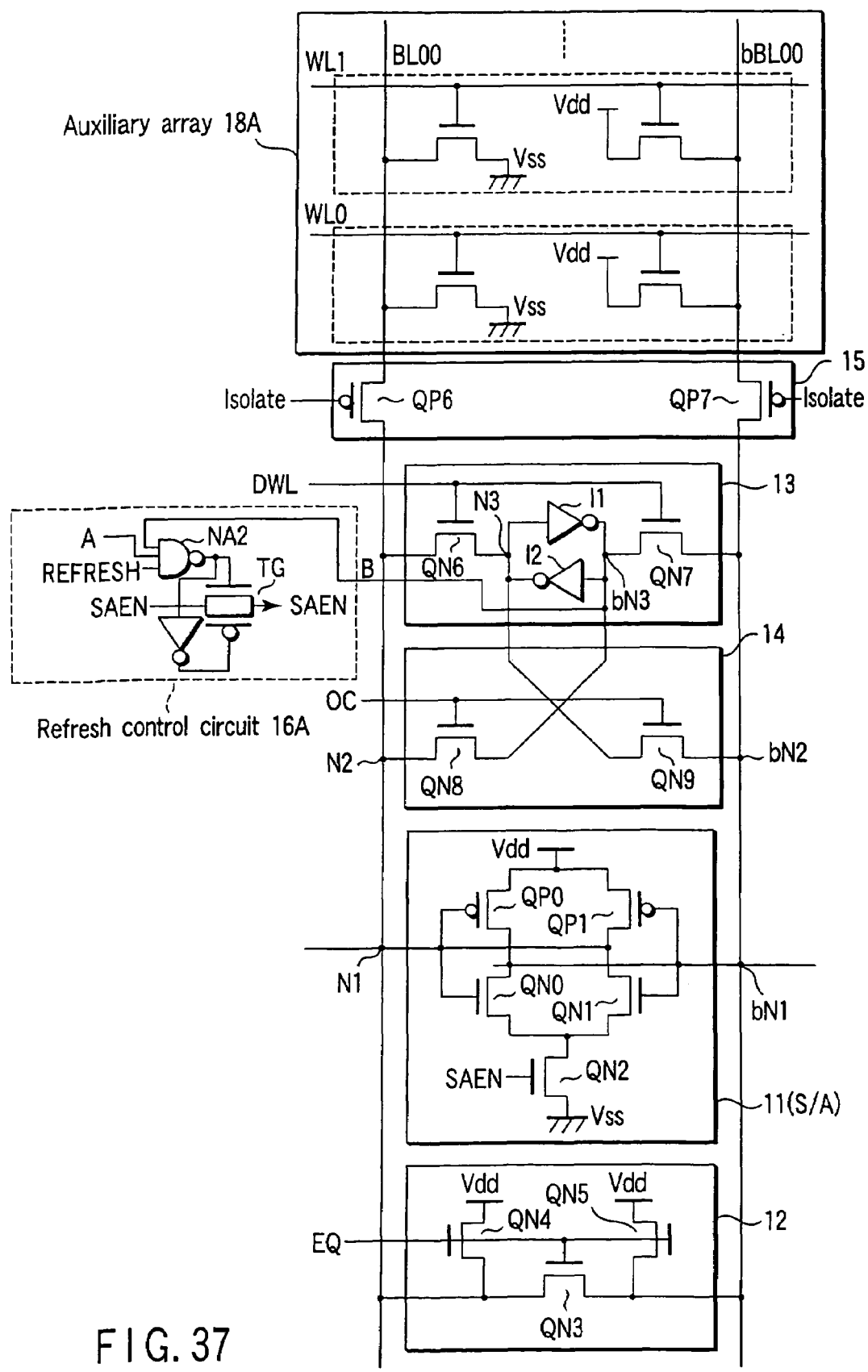
FIG. 37 is a diagram showing a concrete example of the semiconductor integrated circuit of FIG. 35.

FIG. 35 shows a second example of the semiconductor integrated circuit according to the eighth embodiment of the present invention. FIGS. 36 and 37 show the circuit constitution of auxiliary arrays 1, 2 and corresponding sense amplifiers of FIG. 35 in detail.

As compared with the first example, the second example is characterized in that one row of the auxiliary array is changed to two rows of auxiliary arrays. In the first example, since there is one row of auxiliary array, any one of "0" and "1" data (the same data) is only inputted into the sense amplifier in the worst condition.

For example, in the first example, "1" is always read out into the bit line BL00, and "0" is always read out into the bit line bBL00.

However, in this case, only one of the worst conditions in the case in which the "0" data is always read out and the case in which the "1" data is always read out can be produced, and the offset cannot completely minimized with respect to all the sense amplifiers.

To solve the problem, in the second example, two circuits which produce the worst conditions are disposed adjacent to the memory cell array 18. That is, in the second example, there are disposed: an auxiliary array 18A which is disposed adjacent to the memory cell array 18 and produces a worst condition "1" so as to always read out the "1" data; and an auxiliary array 18B which produces a worst condition "2" so as to always read out the "0" data.

The semiconductor integrated circuit of the second example will concretely be described hereinafter.

The auxiliary array 18A is disposed adjacent to the memory cell array 18. The auxiliary array 18A includes a constitution shown in FIG. 36, and produces the worst condition "1" that the "1" data is always read out, that is, the worst condition that "1" is always read out into the bit line BL00.

Concretely, the other end of the MOS transistor whose one end is connected to the bit line BL00 is connected to the power terminal Vdd. The other end of the MOS transistor whose one end is connected to the bit line bBL00 is connected to the ground point Vss. The gates of the respective MOS transistors are connected to the word lines WL0, WL1, . . . similarly as the memory cells in the memory cell array 18.

This realizes the circuit which maximizes the offset of the sense amplifier resulting from the history effect (circuit which produces the worst condition "1").

The auxiliary array 18B is disposed adjacent to the memory cell array 18. The auxiliary array 18B includes a constitution shown in FIG. 37, and produces the worst condition "0" that the "0" data is always read out, that is, the worst condition that "0" is always read out into the bit line BL00.

Concretely, the other end of the MOS transistor whose one end is connected to the bit line BL00 is connected to the ground point Vss. Moreover, the other end of the MOS transistor whose one end is connected to the bit line bBL00 is connected to the power terminal Vdd. The gates of the respective MOS transistors are connected to the word lines WL0, WL1, . . . similarly as the memory cells in the memory cell array 18.

This realizes the circuit which maximizes the offset of the sense amplifier resulting from the history effect (circuit which produces the worst condition "0").

Additionally, the auxiliary arrays 18A, 18B may be disposed in the memory cell array 18.

The differential sense amplifier 11 is constituted of the P channel MOS transistors QP0, QP1 and N channel MOS transistors QN0, QN1, QN2.

The gates of the MOS transistors QP0, QN0 are connected to the node N1 and drains of the MOS transistors QP1, QN1. The gates of the MOS transistors QP1, QN1 are connected to the node bN1 and drains of the MOS transistors QP0, QN0.

The sources of the MOS transistors QP0, QP1 are connected to the inner power node Vdd, and the MOS transistor QN2 is connected between the sources of the MOS transistors QN0, QN1 and the ground point. The sense amplifier enable signal SAEN is inputted into the gate of the MOS transistor QN2.

The equalize circuit 12 is constituted of the N channel MOS transistors QN3, QN4, QN5. The MOS transistor QN3 is connected between the nodes N1 and bN1, the MOS transistor QN4 is connected between the inner power node Vdd and node N1, and the MOS transistor QN5 is connected between the inner power node Vdd and node bN1.

The equalize signal EQ is inputted into the gates of the MOS transistors QN3, QN4, QN5. When the equalize signal EQ reaches "H", both the nodes N1 and bN1 are set to the inner power potential Vdd.

The latch circuit 13 is constituted of two flip-flop connected inverters I1, I2 connected between the nodes N3, bN3, the N channel MOS transistor (transfer gate) QN6 connected between the nodes N2 and N3, and the N channel MOS transistor (transfer gate) QN7 connected between the nodes bN2 and bN3.

When the control signal DWL indicates "H", the nodes N2 and N3 are short-circuited, and the nodes bN2 and bN3 are short-circuited.

The data change circuit 14 is constituted of the MOS transistor QN8 connected between the node N2 and the inner node bN3 of the latch circuit 13, and the MOS transistor QN9 connected between the node bN2 and the inner node N3 of the latch circuit 13.

When the offset check signal OC indicates "H", the MOS transistors QN8, QN9 are turned on, the node N2 and the inner node bN3 of the latch circuit 13 are electrically connected, and the nodes bN2 and the inner node N3 of the latch circuit 13 are electrically connected.

The disconnection circuit 15 is disposed between the latch circuit 13 and the auxiliary arrays 18A, 18B and is disposed to electrically disconnect the nodes N2, bN2 and bit line pair BL00, bBL00, and to reduce the parasitic capacity generated in the nodes N2, bN2.

In the differential sense amplifier 11 corresponding to the auxiliary array 18A, during the normal readout operation, the data "1" is always transferred to the node N1, and the data "0" is transferred to the node bN1.

Therefore, for example, the threshold voltage of the N channel MOS transistor QN0 in the differential sense amplifier 11 is considered to be lower than the threshold voltage of the N channel MOS transistor QN1 (have the offset).

That is, in the offset check, the "1" data is outputted to the node N1, and the "0" data is outputted to the node bN1. Moreover, the "0" data is latched in the inner node N3 of the latch circuit 13, and the "1" data is latched in the inner node bN3 of the latch circuit 13.

To detect whether or not the offset is minimized with respect to the sense amplifier whose offset is maximized, the state (level) of at least one of the inner nodes N3, bN3 of the latch circuit 13 may be monitored.

In the present embodiment, data A of the inner node N3 of the latch circuit 13 is monitored with respect to the auxiliary array 18A. When the offset is not minimized, the data A of the inner node N3 of the latch circuit 13 remains "0". On the other hand, when the offset is minimized, the data A of the inner node N3 of the latch circuit 13 changes to "1".

Similarly, in the differential sense amplifier 11 corresponding to the auxiliary array 18B, during the normal readout operation, the data "0" is always transferred to the node N1, and the data "1" is transferred to the node bN1.

Therefore, for example, the threshold voltage of the N channel MOS transistor QN1 in the differential sense amplifier 11 is considered to be lower than the threshold voltage of the N channel MOS transistor QN0 (have the offset).

That is, in the offset check, the "0" data is outputted to the node N1, and the "1" data is outputted to the node bN1. Moreover, the "1" data is latched in the inner-node N3 of the latch circuit 13, and the "0" data is latched in the inner node bN3 of the latch circuit 13.

To detect whether or not the offset is minimized with respect to the sense amplifier whose offset is maximized, the state (level) of at least one of the inner nodes N3, bN3 of the latch circuit 13 may be monitored.

In the present embodiment, data B of the inner node bN3 of the latch circuit 13 is monitored with respect to the auxiliary array 18B. When the offset is not minimized, the data B of the inner node bN3 of the latch circuit 13 remains "0". On the other hand, when the offset is minimized, the data B of the inner node bN3 of the latch circuit 13 changes to "1".

The potential changes of the inner nodes N3, bN3 of the latch circuit 13 are detected by the refresh control circuit 16A.

For example, the data A of the inner node N3 of the latch circuit 13 of the auxiliary array 18A, data B of the inner node bN3 of the latch circuit 13 of the auxiliary array 18B, and refresh signal REFRESH are inputted into the NAND circuit NA2. During the refresh operation, the data of the inner node N3 of the auxiliary array 18A is usually "0", the data of the inner node bN3 of the auxiliary array 18B is also usually "0", and the refresh signal REFRESH is "1". Therefore, the output signal of the NAND circuit NA2 is "1", and the sense amplifier enable signal SAEN is supplied to all the differential sense amplifiers 11.

When the offset is minimized, the data A of the inner node N3 of the latch circuit 13 of the auxiliary array 18A changes to "1", and the data B of the inner node bN3 of the latch circuit 13 of the auxiliary array 18B changes to "1", three input data of the NAND circuit NA2 are all "1", and therefore the output data of the NAND circuit NA2 is "0". Therefore, the transfer gate TG closes, and the sense amplifier enable signal SAEN is not supplied to all the differential sense amplifiers 11.

As a result, the offset check and refresh are forced to end with respect to all the sense amplifiers.

3. Conclusion

In the semiconductor integrated circuit according to the eighth embodiment, there is disposed the circuit in which the offset of the sense amplifier resulting from the history effect is maximized (circuit which produces the worst condition), concretely the auxiliary array. Additionally, the inner node of the latch circuit is monitored by the refresh control circuit. It is thereby detected whether or not the offset of the sense amplifier is minimized. Moreover, when the offset of the sense amplifier is minimized, the offset check and refresh are forced to end with respect to all the sense amplifiers.

Thereby, an end time of the refresh operation is defined, and the refresh operation is uniformly performed with respect to all the sense amplifiers.

Moreover, the end time of the refresh operation is a time in which the offset of the sense amplifier having the maximum offset is minimized. Therefore, when the refresh operation ends, the offset is naturally minimized with respect to all the sense amplifiers.

[Ninth Embodiment]

1. Outline

In a ninth embodiment of the present invention, a case in which the present invention is applied to a programmable logic array (PLA) circuit will be described.

In the first to eighth embodiments, the case in which the present invention is applied to the semiconductor memory has been described as the concrete example. Additionally, the idea of the present invention (offset control) can be applied not only to one MOS transistor but also to various semiconductor circuits.

Then, in the ninth embodiment, a case in which the present invention is applied to a PLA circuit will be described. As a concrete example of the case in which the present invention is applied to the PLA circuit, there is considered an example in which the principles of the first to eighth embodiments are applied as such to the PLA circuit. Moreover, for example, the PLA circuit shown in the following concrete example is also considered.

2. Concrete Example

Figure 39:
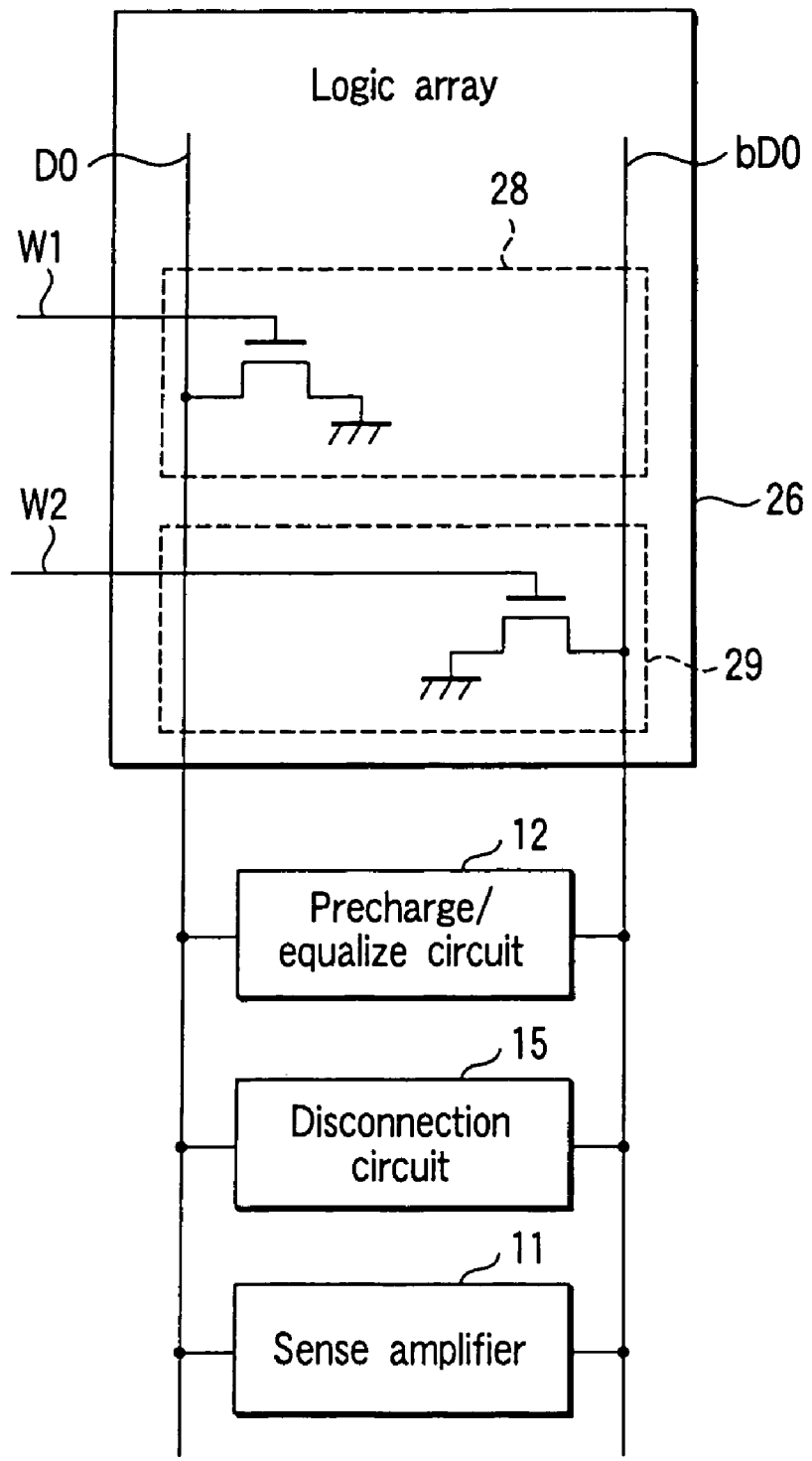
FIG. 39 is a diagram showing a part of a logic array of FIG. 38.

FIG. 38 shows the semiconductor integrated circuit according to a ninth embodiment of the present invention. FIG. 39 shows a part (one column) of a logic array of FIG. 38.

The logic array is constituted of an array of a plurality of MOS transistors. Data is programmed beforehand in each MOS transistor, and predetermined output data is outputted in response to the input data.

A decoder 27 decodes the input data, and selects one of a plurality of rows of a logic array 26. The MOS transistor which exists in the selected row is turned on, and the data programmed beforehand in the MOS transistor is read out into data lines D0, bD0.

For example, when W1 reaches an "H" level, a MOS transistor 28 is turned on. At this time, the "0" data is read out into the data line D0. Moreover, when W2 reaches the "H" level, a MOS transistor 29 is turned on. At this time, the "0" data is read out into the data line bD0.

The sense amplifier 11, precharge/equalize circuit 12, and disconnection circuit 15 are the same as those described in the above-described embodiments.

In the PLA circuit, the value of the output data is uniquely determined with respect to the value of the input data. That is, the data inputted into the sense amplifier 11 can be predicted. Therefore, a refresh control circuit 16B periodically controls the output signal of the decoder 27, so that the data for minimizing the offset is inputted into the sense amplifier 11.

Additionally, with respect to the refresh control circuit 16B, as shown by a broken-line arrow, the input data is monitored, and the output signal of the decoder 27 may be controlled in accordance with the monitor result, so that the data for minimizing the offset is inputted into the sense amplifier 11.

3. Conclusion

In the semiconductor integrated circuit according to the ninth embodiment of the present invention, the feature of the PLA circuit that the output data is uniquely determined with respect to the input data is used, and the refresh operation is periodically performed, so that the offset of the sense amplifier for use in the PLA circuit can be minimized.

[Tenth Embodiment]

1. Outline

In a tenth embodiment of the present invention, a case in which the present invention is applied to a general logic circuit will be described. In the ninth embodiment, the case in which the present invention is applied to the PLA circuit has been described. Additionally, the present invention can also be applied to the general logic circuit.

2. Concrete Example

FIG. 40 shows the semiconductor integrated circuit according to the tenth embodiment of the present invention.

Input data A, B, C are inputted into logic circuits 32, 33, 34 via multiplexers 30A, 30B, 30C and delay type flip-flop circuits (D-FF) 31A, 31B, 31C. The output data of the logic circuits 32, 33, 34 are inputted into delay type flip-flop circuits (D-FF) 31D, 31E.

For example, a path to the flip-flop circuit 31E from the logic circuit 34 is a critical path. Moreover, when the input data A, B, C indicate specific values, the logic circuit 34 outputs specific data. When the input data A, B, C indicate values other than the specific values, the circuit outputs the data other than the specific data.

A probability at which the input data A, B, C indicate the specific values is usually low, and the logic circuit 34 hardly outputs the specific data. In this case, the logic circuit 34 outputs the data other than the specific data with a high probability. At this time, for example, a charge accumulated in the substrate of the MOS transistor constituting the logic circuit 34 decreases.

In general, considering that the charge is accumulated in the substrate of the MOS transistor, the semiconductor integrated circuit using a SOI substrate is designed so that an operation speed is highest in the above-described case. Therefore, the logic circuit 34 outputs the data other than the specific data with the high frequency, and the charge accumulated in the substrate of the MOS transistor constituting the logic circuit 34 decreases. This means that the operation speed of the logic circuit 34 drops. Moreover, when the logic circuit 34 constitutes the critical path, the drop of the operation speed is a large problem.

To solve the problem, in the present invention, a refresh control circuit 16C is used to periodically replace the input data A, B, C with input data a, b, c having a low probability of input and indicating the specific values, and the data are inputted into the logic circuits 32, 33, 34.

That is, when the data a, b, c having the low probability of input and indicating the specific values are periodically inputted into the logic circuits 32, 33, 34, for example, the logic circuit 34 constituting the critical path outputs the specific data. Therefore, the charge accumulated in the substrate of the MOS transistor constituting the logic circuit 34 increases, and the logic circuit 34 can always be operated at an optimum operation speed.

Additionally, when the multiplexers 30A, 30B, 30C select the input data a, b, c outputted from the refresh control circuit 16C and indicating the specific values, the output signal is prevented from being outputted from the flip-flop circuits 31D, 31E by a control signal (invalid signal) in order to prevent the specific data based on the input data a, b, c having the specific values from being transferred to the subsequent circuit.

Moreover, in the present embodiment, as shown by a broken line, a detection circuit 35 is used to monitor the output data of the logic circuit 34, and a time to perform the refresh operation may also be determined based on the monitor result.

3. Conclusion

In the semiconductor integrated circuit according to the tenth embodiment of the present invention, there is disposed the logic circuit for outputting the specific data, when the input data having the low input probability and indicating the specific value is inputted. In this case, the input data having the low input probability and indicating the specific value is inputted into the logic circuit periodically or in accordance with the monitor result (the number of outputs of the specific data and the number of outputs of the data other than the specific data).

In this case, even when the logic circuit constitutes the critical path, the logic circuit does not output only the data other than the specific data, and the logic circuit can always be operated with an optimum condition (operation speed).

[Method of Minimizing Offset]

The embodiments of the semiconductor integrated circuit according to the present invention have been described above. A method of minimizing the offset will be described hereinafter.

1. Method 1 of Minimizing the Offset

Figure 41:
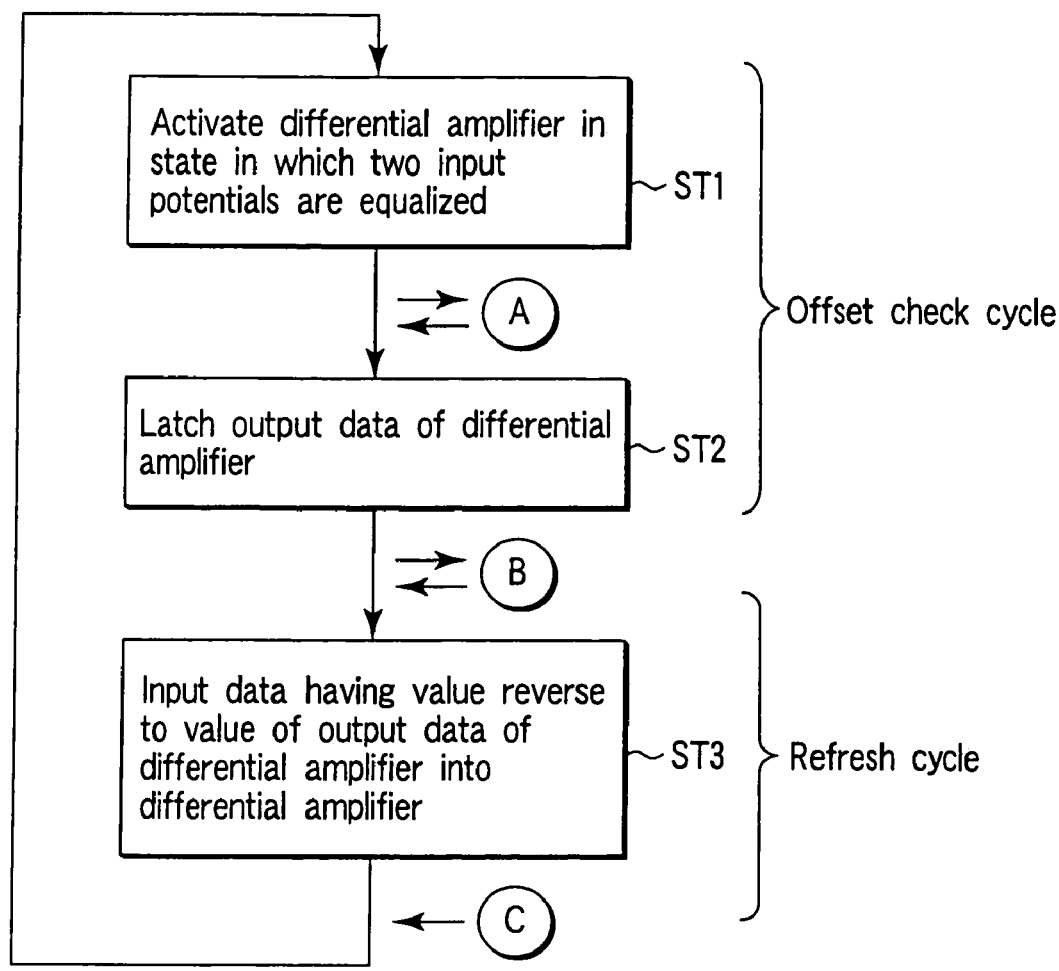
FIG. 41 is a diagram showing a method 1 of minimizing an offset according to the present invention.

FIG. 41 shows a method 1 of minimizing the offset.

This method is applied to the differential sense amplifier, and corresponds to the operation of the semiconductor integrated circuit according to the first to third embodiments.

First, the differential sense amplifier is activated in a state in which two input potentials are equalized (step ST1). At this time, the output data of the differential sense amplifier is determined depending only on the offset of the differential sense amplifier as described above.

For example, when the number of inputs of the "1" data is larger than the number of inputs of the "0" data, and the offset is generated, the "1" data is outputted. When the number of inputs of the "0" data is larger than the number of inputs of the "1" data, and the offset is generated, the "0" data is outputted.

Subsequently, the output data of the differential sense amplifier is latched by the latch circuit (step ST2).

Thereafter, the data having the value reverse to the value of the output data of the differential sense amplifier is inputted into the differential sense amplifier based on the data (latch data) latched by the latch circuit (step ST3). That is, the data reverse to the data having a high input frequency with respect to the differential sense amplifier is inputted into the differential sense amplifier. Therefore, when the steps ST1 to ST3 are repeatedly performed, a difference between the number of inputs of the "1" data and the number of inputs of the "0" data is gradually reduced, and the offset is minimized.

Additionally, a step of generating the data having the value reverse to the value of the output data of the differential sense amplifier may be performed between the steps ST1 and ST2 (A) or between the steps ST2 and ST3 (B).

When the step of generating the data having the value reverse to the value of the output data of the differential sense amplifier is added to a part A, a series of steps of FIG. 41 correspond to the operation of the semiconductor integrated circuit according to the first and second embodiments. Moreover, when the step of generating the data having the value reverse to the value of the output data of the differential sense amplifier is added to a part B, a series of steps of FIG. 41 correspond to the operation of the semiconductor integrated circuit according to the third embodiment.

2. Method 2 of Minimizing the Offset

Figure 42:
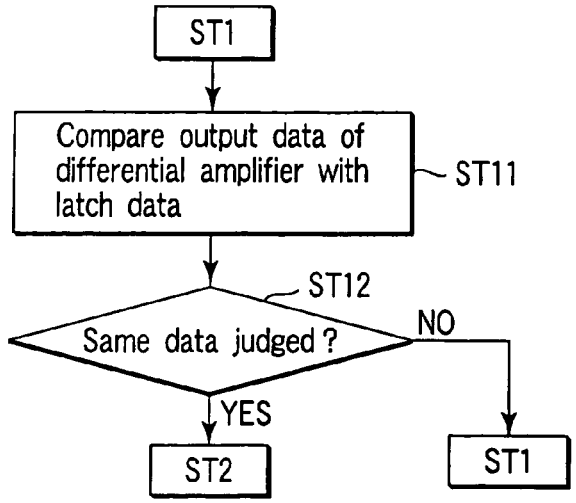
FIG. 42 is a diagram showing a method 2 of minimizing the offset according to the present invention.

FIG. 42 shows a method 2 of minimizing the offset.

This method corresponds to the operation of the semiconductor integrated circuit according to the fourth embodiment.

This method is developed under an assumption of the method shown in FIG. 41. That is, the method is characterized in that the steps of FIG. 42 are added to the part A of the flowchart of FIG. 41.

That is, the differential sense amplifier is activated in the state in which two input potentials are equalized (step ST1), and the output data is outputted from the differential sense amplifier. The value of the output data is compared with the value of the latch data (step ST11).

When the value of the output data of the differential sense amplifier is the same as the value of the latch data, the offset of the differential sense amplifier is judged not to be minimized, and the step ST2 of FIG. 41 is executed. On the other hand, when the value of the output data of the differential sense amplifier is different from the value of the latch data, the offset of the differential sense amplifier can be judged to be minimized. Therefore, the steps ST2 and ST3 of FIG. 41 are omitted (step ST12).

In the above-described method 1, since the "1" data or "0" data is surely outputted in the step ST1, the data reverse to the output data is inputted into the differential sense amplifier in the step ST3 even after minimizing the offset. In this case, even when the offset is minimized, the differential sense amplifier is brought into the operative state, and the power is wasted.

On the other hand, in the method 2, after the offset is minimized (after the data different from the latch data is outputted in the step ST1, the differential sense amplifier is in the inoperative state even during the refresh operation, and therefore the power is not wasted.

3. Method 3 of Minimizing the Offset

Figure 43:
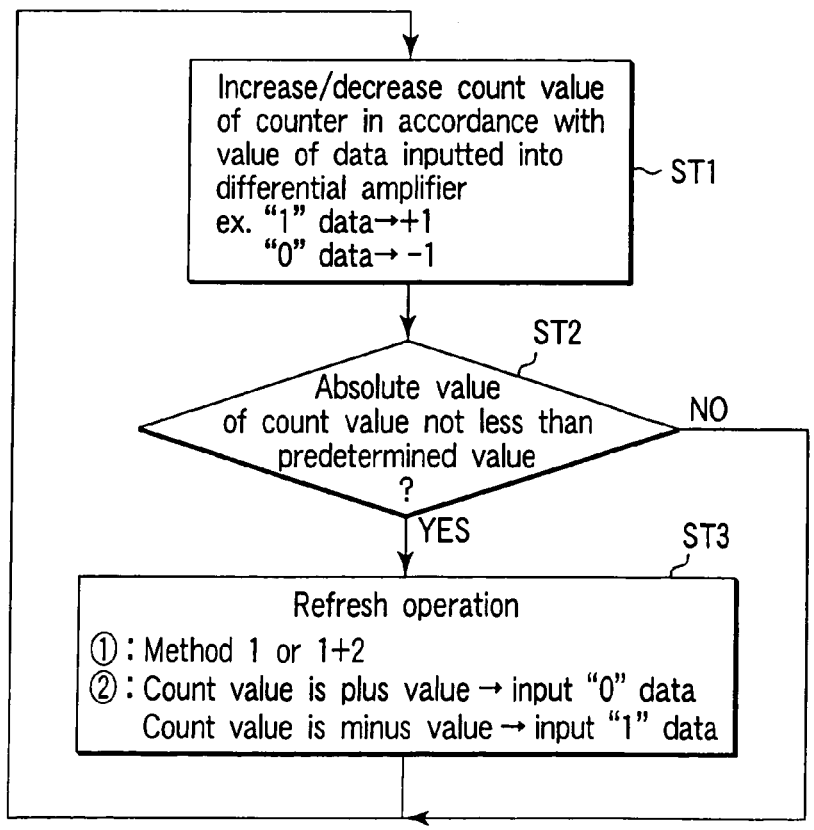
FIG. 43 is a diagram showing a method 3 of minimizing the offset according to the present invention.

FIG. 43 shows a method 3 of minimizing the offset.

This method corresponds to the operation of the semiconductor integrated circuit according to the fifth embodiment.

First, the count value of the counter is increased/decreased in accordance with the value of the data inputted into the differential sense amplifier (step ST1). For example, when the "1" data is inputted, the count value of the counter is increased by 1. When the "0" data is inputted, the count value of the counter is decreased by 1.

Additionally, it is assumed that the inputted data includes both the readout data read out of the memory cell during the normal readout operation and the data inputted into the differential sense amplifier by the refresh operation according to the present invention.

Subsequently, it is judged whether or not the absolute value of the count value of the counter is more than a predetermined value (natural number of 1 or more) (step ST2).

When the count value of the counter is not less than the predetermined value, a not negligible offset is estimated to be generated in the differential sense amplifier, and the refresh operation according to the present invention is performed (step ST3).

As the refresh operation, the above-described method 1 or methods 1, 2 may be used. Instead, the data to be inputted into the differential sense amplifier may be determined only based on the count value.

In the latter case, with the count value having a plus value, the offset is estimated to be generated such that the "1" data is easily outputted to the differential sense amplifier, and the "0" data is inputted into the differential sense amplifier. Moreover, with the count value having a minus value, the offset is estimated to be generated such that the "0" data is easily outputted to the differential sense amplifier, and the "1" data is inputted into the differential sense amplifier According to the method 3, since the offset of the differential sense amplifier can be estimated based on the count value of the counter, the time to perform the refresh operation can easily be determined. Moreover, when the offset check cycle is omitted, and the input data is determined only based on the count value, the time of the refresh operation can also be reduced.

[Others]

In the above-described embodiments, the differential sense amplifier (differential amplifier) has mainly be described. However, the principle of the present invention can also be applied to the control of the threshold voltage of the single MOS transistor or the preventing of the offset of a semiconductor circuit other than the differential sense amplifier.

Moreover, in the above-described embodiments, the application of the differential sense amplifier to the semiconductor memory has been described as the concrete example. Additionally, all semiconductor memories such as SRAM, DRAM, ROM, and flash memory can be objects.

Furthermore, the effect of the present invention supposedly appears most in the case in which the offset resulting from the fluctuation of the substrate potential in the SOI device is minimized. Naturally, the present invention is also supposedly effectively in the case in which the fluctuation of the threshold voltage by the process dispersion is minimized, or in which the potential fluctuation of a well of a device for use in a so-called well separation technique is minimized.

As described above, according to the semiconductor integrated circuit of the present invention, the offset resulting from the process dispersion or the operation frequency of the SOI device (dispersion of the threshold voltage of the MOS transistor) is minimized by a circuit operational technique, and the drop of the operation speed and the erroneous sense operation can be prevented from being caused by the offset.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor integrated circuit comprising: a sense amplifier connected between first and second nodes;
an equalize circuit which equalizes potentials of said first and second nodes;
a latch circuit connected between said first and second nodes;
a disconnection circuit which controls electric disconnection or connection of said first node and a third node and electric disconnection or connection of said second node and a fourth node; and
a data change circuit which controls electric connection or disconnection of said first and fourth nodes and electric connection or disconnection of said second and third nodes.

2. A semiconductor integrated circuit according to claim 1, further comprising:
a memory cell array including a plurality of memory cells, wherein said latch circuit latches readout data read out of said plurality of memory cells.

3. A semiconductor integrated circuit according to claim 1, wherein said data change circuit includes a MOS transistor connected between said first and fourth nodes, and a MOS transistor connected between said second and third nodes.

4. A semiconductor integrated circuit according to claim 1, wherein said disconnection circuit includes a MOS transistor connected between said first and third nodes, and a MOS transistor connected between said second and fourth nodes.

5. A semiconductor integrated circuit according to claim 1, wherein said disconnection circuit electrically disconnects said first and third nodes and said second and fourth nodes, when said sense amplifier is in an operative state, and electrically connects said first and third nodes and said second and fourth nodes, when said sense amplifier is in an inoperative state.

6. A semiconductor integrated circuit according to claim 1, wherein said latch circuit latches data having a value reverse to a value of output data of said sense amplifier obtained when the potentials of said first and second nodes are equalized.

7. A semiconductor integrated circuit according to claim 6, wherein the data having the value reverse to the value of the output data of said sense amplifier is generated by said data change circuit.

8. A semiconductor integrated circuit according to claim 7, wherein the data having the value reverse to the value of the output data of said sense amplifier is given to said sense amplifier from said latch circuit.

9. A semiconductor integrated circuit according to claim 1, wherein said latch circuit latches output data of said sense amplifier obtained when the potentials of said first and second nodes are equalized.

10. A semiconductor integrated circuit according to claim 9, wherein said data change circuit generates data having a value reverse to a value of the output data of said sense amplifier.

11. A semiconductor integrated circuit according to claim 10, wherein the data having the value reverse to the value of the output data of said sense amplifier is given to said sense amplifier from said data change circuit.

12. A semiconductor integrated circuit according to claim 1, further comprising:

means for bringing said sense amplifier into an operative state in a state in which the potentials of said first and second nodes are equalized and for outputting output data from said sense amplifier; means for allowing said latch circuit to latch said output data;

means for using said data change circuit to generate data having a value reverse to a value of said output data;

means for allowing said data change circuit to transfer the data having the value reverse to the value of said output data to said sense amplifier; and means for bringing said sense amplifier into the operative state.

13. A semiconductor integrated circuit according to claim 1, wherein said sense amplifier includes a MOS transistor formed on a SOI substrate.

* * * * *